US012660076B2

(12) United States Patent
Chen et al.

(10) Patent No.: US 12,660,076 B2
(45) Date of Patent: Jun. 16, 2026

(54) HEAT DISSIPATION APPARATUS, CIRCUIT MODULE, ELECTRONIC DEVICE, AND CIRCUIT MODULE ASSEMBLY METHOD

(71) Applicant: HUAWEI TECHNOLOGIES CO., LTD., Shenzhen (CN)

(72) Inventors: Wei Chen, Dongguan (CN); Weice Ma, Shanghai (CN); Benwei Lin, Shenzhen (CN); Xiaoyuan Ying, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 271 days.

(21) Appl. No.: 18/389,923

(22) Filed: Dec. 20, 2023

(65) Prior Publication Data

US 2024/0121881 A1 Apr. 11, 2024

Related U.S. Application Data

(63) Continuation of application No. PCT/CN2022/099597, filed on Jun. 17, 2022.

(30) Foreign Application Priority Data

Jun. 22, 2021 (CN) .......................... 202110693775.1

(51) Int. Cl.
| | |
|---|---|
| *H05K 1/02* | (2006.01) |
| *H05K 7/14* | (2006.01) |
| *H05K 7/20* | (2006.01) |

(52) U.S. Cl.
CPC ......... *H05K 1/0203* (2013.01); *H05K 7/1401* (2013.01); *H05K 7/2039* (2013.01); *H05K 2201/066* (2013.01)

(58) Field of Classification Search
CPC . H01L 23/3675; H01L 23/40; H01L 23/4006; H01L 23/4087; H01L 23/562;
(Continued)

(56) References Cited

U.S. PATENT DOCUMENTS

| | | | | |
|---|---|---|---|---|
| 5,933,325 A | * | 8/1999 | Hou .................... | H01L 23/4093 |
| | | | | 174/16.3 |
| 6,639,800 B1 | * | 10/2003 | Eyman ................ | H01L 23/4006 |
| | | | | 174/548 |

(Continued)

FOREIGN PATENT DOCUMENTS

| | | |
|---|---|---|
| CN | 1592967 A | 3/2005 |
| CN | 105684564 A | 6/2016 |

(Continued)

OTHER PUBLICATIONS

JPH0567838 English Translation (Year: 1993).*
(Continued)

*Primary Examiner* — Amir A Jalali

(57) ABSTRACT

In a dissipation apparatus, a support is mounted to a circuit board, and an assembly opening on a bearing portion in the support is configured to accommodate a heat source on the circuit board. A heat sink is disposed on the bearing portion of the support, and a heat conducting surface of the heat sink can penetrate the assembly opening, to be attached to the heat conducting surface of the heat source. A peak-valley structure in an elastic component is disposed on a mounting surface of the heat sink as a force-applying portion, and two ends of the elastic component exceed an edge of the heat sink and are mounted to the support as mounting portions. At least one elastic component can provide, to the heat sink by using the peak-valley structure, pressure to tightly attach the heat sink to the heat source.

20 Claims, 20 Drawing Sheets

(58) Field of Classification Search
CPC ......... H01L 21/4882; H01L 2023/4043; H01L
2023/405; H01L 2023/4062; H01L
2023/4081; H01L 2023/4087; H05K
1/0203–0212; H05K 1/181–182; H05K
7/20; H05K 7/20239; H05K 7/20418;
H05K 7/2049; H05K 7/20718; H05K
2201/066; H05K 2201/10409; H05K
2201/10424; H05K 2201/10598; G06F
1/183; G06F 1/20
See application file for complete search history.

(56) References Cited

U.S. PATENT DOCUMENTS

| | | | | | |
|---|---|---|---|---|---|
| RE38,677 E | * | 12/2004 | Blomquist | .......... | H01L 23/3677 |
| | | | | | 248/510 |
| 7,515,419 B2 | * | 4/2009 | Li | ...................... | H01L 23/4093 |
| | | | | | 361/709 |
| 7,567,435 B2 | * | 7/2009 | Azar | ................... | H01L 23/4093 |
| | | | | | 361/709 |
| 7,576,987 B2 | * | 8/2009 | Lai | ...................... | H01L 23/4093 |
| | | | | | 174/16.3 |
| 7,746,647 B2 | * | 6/2010 | Guo | ................... | H01L 23/4093 |
| | | | | | 165/185 |
| 2003/0014112 A1 | * | 1/2003 | Ralph | .................... | A61F 2/442 |
| | | | | | 623/17.13 |
| 2004/0105236 A1 | | 6/2004 | Lee et al. | | |
| 2005/0195565 A1 | * | 9/2005 | Bright | ............... | H05K 7/20418 |
| | | | | | 361/688 |
| 2006/0198107 A1 | * | 9/2006 | Azar | ................... | H01L 23/4093 |
| | | | | | 257/E23.105 |
| 2007/0139891 A1 | * | 6/2007 | Yu | ....................... | H01L 23/4093 |
| | | | | | 361/709 |
| 2008/0000618 A1 | | 1/2008 | Liang | | |
| 2009/0009972 A1 | * | 1/2009 | Ho | ..................... | H01L 23/4093 |
| | | | | | 361/710 |
| 2009/0034198 A1 | * | 2/2009 | Colbert | .............. | H01L 23/4006 |
| | | | | | 361/704 |
| 2009/0279263 A1 | * | 11/2009 | Kuo | ...................... | H01L 23/467 |
| | | | | | 361/709 |
| 2010/0157539 A1 | * | 6/2010 | Wang | ................. | H01L 23/4093 |
| | | | | | 361/709 |
| 2011/0061847 A1 | | 3/2011 | Hsieh | | |
| 2016/0211191 A1 | * | 7/2016 | Tan | ..................... | H01L 23/4093 |
| 2020/0111723 A1 | * | 4/2020 | Bleske | ................ | H05K 7/2049 |

FOREIGN PATENT DOCUMENTS

| | | | | |
|---|---|---|---|---|
| CN | 206100764 U | | 4/2017 | |
| JP | H0567838 | * | 9/1993 | ......... F16D 25/0638 |

OTHER PUBLICATIONS

Extended European Search Report dated Sep. 10, 2024, issued for
European Application No. 22827494.0 (12 pages).
International Search Report dated Jul. 27, 2022, issued for International Application No. PCT/CN2022/099597 (10 pages).

* cited by examiner

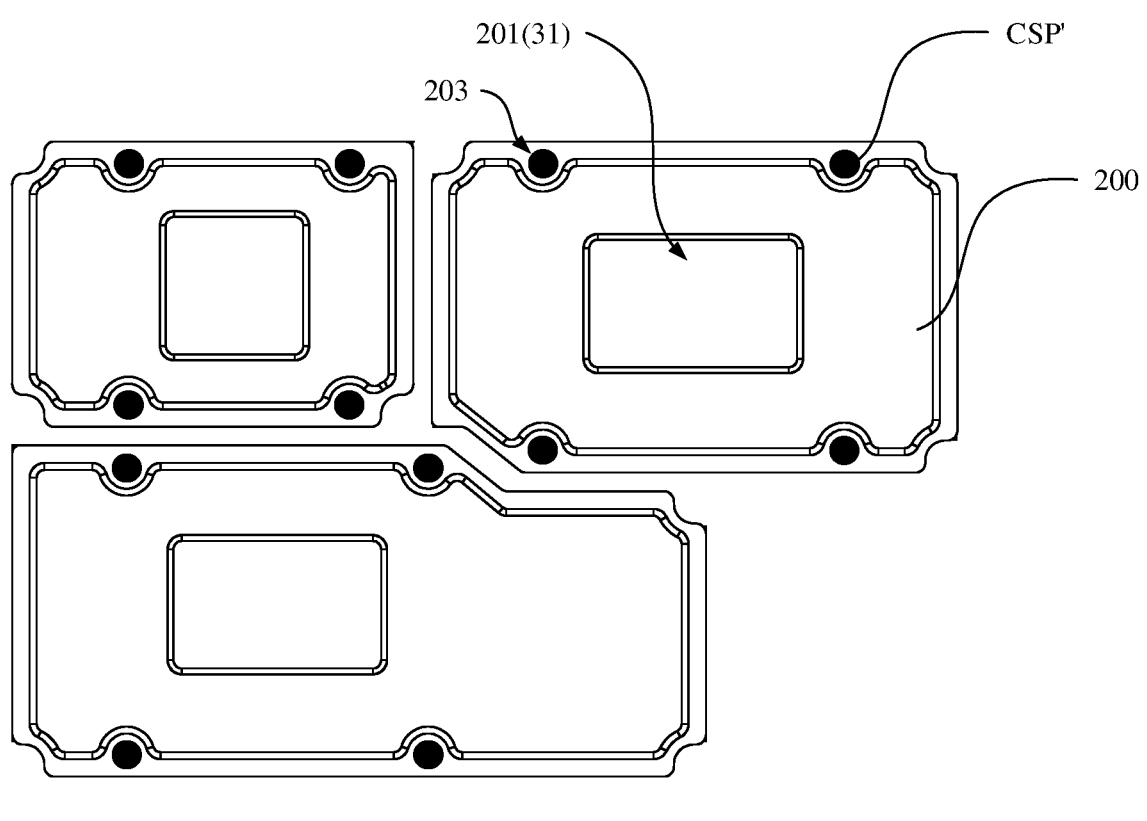
FIG. 7(b)
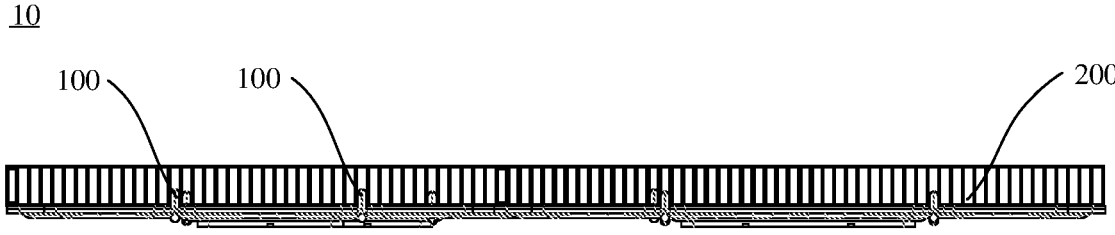
FIG. 7(c)
FIG. 7(d)

300

10

10

100

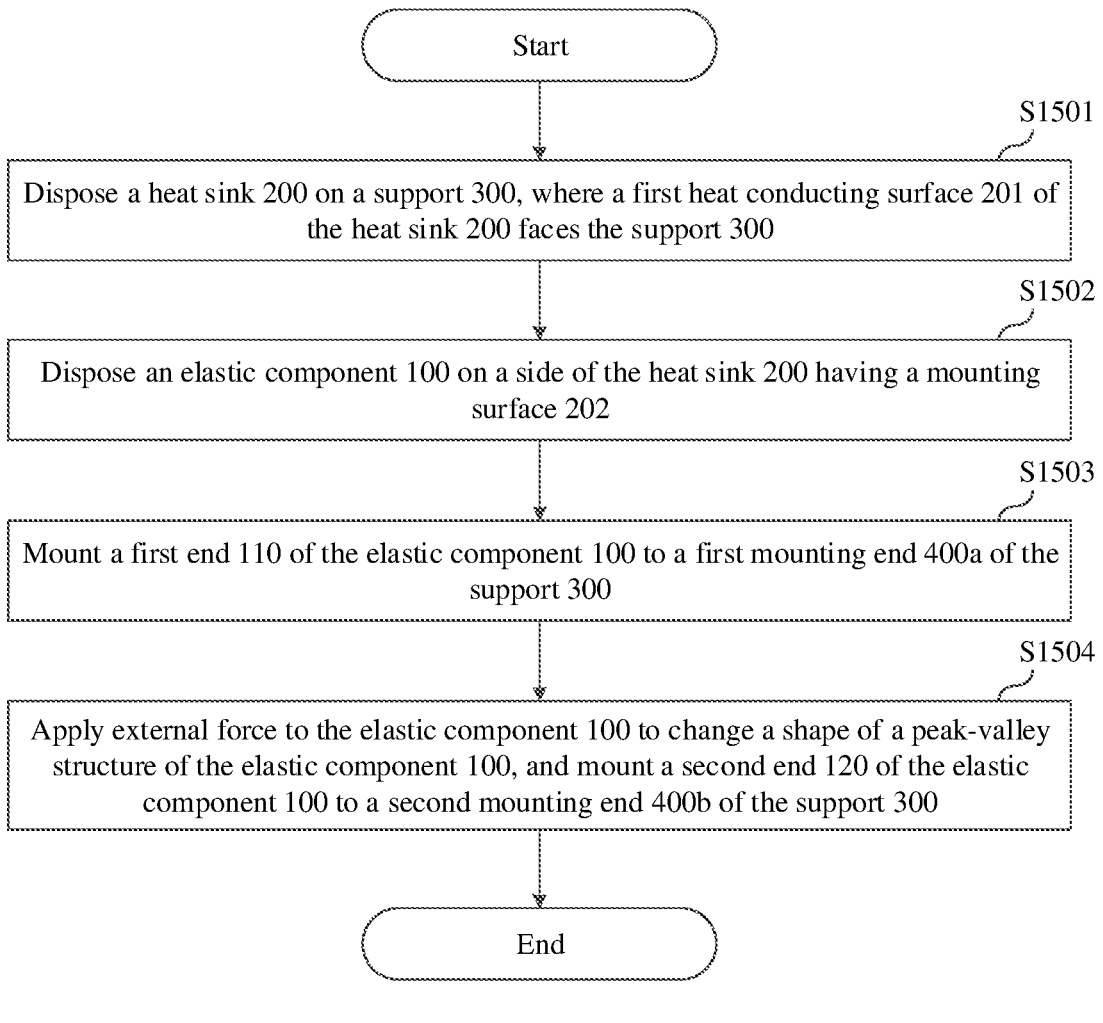

Start

S1501

Dispose a heat sink 200 on a support 300, where a first heat conducting surface 201 of the heat sink 200 faces the support 300

S1502

Dispose an elastic component 100 on a side of the heat sink 200 having a mounting surface 202

S1503

Mount a first end 110 of the elastic component 100 to a first mounting end 400a of the support 300

S1504

Apply external force to the elastic component 100 to change a shape of a peak-valley structure of the elastic component 100, and mount a second end 120 of the elastic component 100 to a second mounting end 400b of the support 300

End

FIG. 15

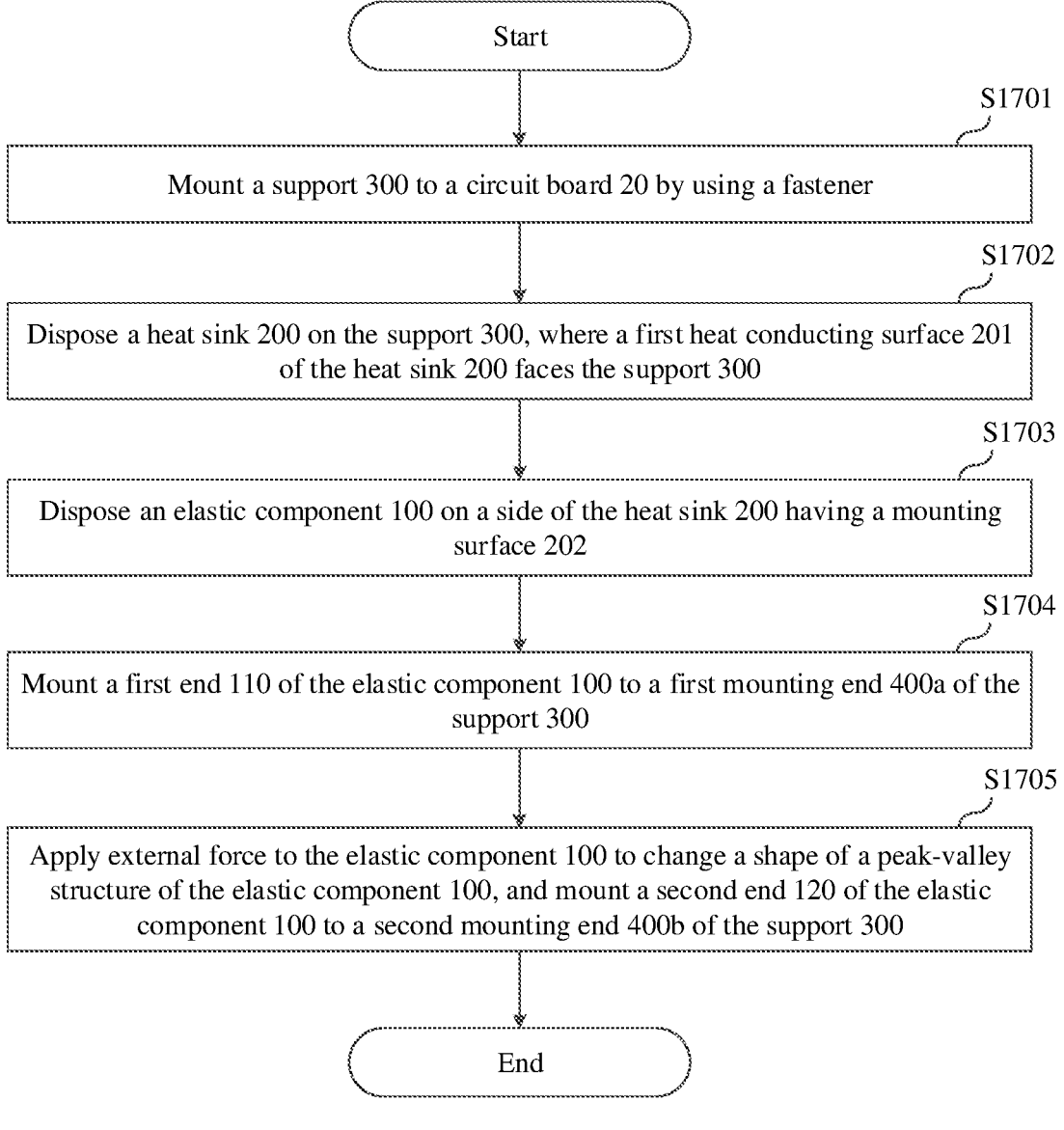

Start

S1701

Mount a support 300 to a circuit board 20 by using a fastener

S1702

Dispose a heat sink 200 on the support 300, where a first heat conducting surface 201 of the heat sink 200 faces the support 300

S1703

Dispose an elastic component 100 on a side of the heat sink 200 having a mounting surface 202

S1704

Mount a first end 110 of the elastic component 100 to a first mounting end 400a of the support 300

S1705

Apply external force to the elastic component 100 to change a shape of a peak-valley structure of the elastic component 100, and mount a second end 120 of the elastic component 100 to a second mounting end 400b of the support 300

End

FIG. 17

HEAT DISSIPATION APPARATUS, CIRCUIT MODULE, ELECTRONIC DEVICE, AND CIRCUIT MODULE ASSEMBLY METHOD

CROSS-REFERENCE TO RELATED APPLICATIONS

This application is a continuation of International Application No. PCT/CN2022/099597, filed on Jun. 17, 2022, which claims priority to Chinese Patent Application No. 202110693775.1, filed on Jun. 22, 2021. The disclosures of the aforementioned applications are hereby incorporated by reference in their entireties.

TECHNICAL FIELD

This disclosure relates to the field of communication technologies, and in particular, to a heat dissipation apparatus, a circuit module, an electronic device, and a circuit module assembly method.

BACKGROUND

With arrival of a big data era, a data transmission rate is continuously improved, a computing processing capability of an electronic device is continuously improved, and power consumption of a corresponding electronic component is rapidly increased, resulting in higher heat consumption of the electronic component. Currently, an air-cooled heat dissipation apparatus and a liquid-cooled heat dissipation apparatus are mainly used to dissipate heat for the electronic component in an electronic device.

The electronic component is mounted to a surface of a circuit board, and the air-cooled heat dissipation apparatus is disposed on the electronic component, and is mounted to the circuit board by using a connecting piece having an elastic structure, to attach a heat sink to the electronic component on the circuit board. Alternatively, the liquid-cooled heat dissipation apparatus is bonded to a surface of the electronic component (for example, a chip).

However, due to evenness tolerance, manufacturing roughness, and the like on outer surfaces of both the electronic component and the heat sink, neither the air-cooled heat dissipation apparatus nor the liquid-cooled heat dissipation apparatus is tightly fastened and attached, and there is a gap filled with a large amount of air between contact surfaces, resulting in large thermal resistance and poor heat conduction, and severely affecting heat dissipation performance. Therefore, how to improve attachment tightness of contact surfaces between the heat sink and the electronic component becomes an urgent problem to be resolved currently.

SUMMARY

This disclosure resolves a technical problem that due to evenness tolerance, manufacturing roughness, and the like on outer surfaces of both an electronic component and a heat sink, neither an air-cooled heat dissipation apparatus nor a liquid-cooled heat dissipation apparatus is tightly fastened and attached, and there is a gap filled with a large amount of air between contact surfaces, resulting in large thermal resistance and poor heat conduction, and severely affecting heat dissipation performance. This disclosure provides a heat dissipation apparatus, a circuit module, an electronic device, and a circuit module assembly method. The heat dissipation apparatus in this disclosure includes at least one elastic component, a heat sink, and a support. Each elastic component is a new snake spring, that is, each elastic component is a strip-shaped component having a peak-valley structure. In the heat dissipation apparatus, a support is configured to be mounted to a circuit board, and an assembly opening on a bearing portion in the support is configured to accommodate a heat source on the circuit board, so that a heat conducting surface of the heat source can penetrate the assembly opening on a bearing board. The heat sink is disposed on the bearing portion of the support, and a heat conducting surface of the heat sink can penetrate the assembly opening, to be attached to the heat conducting surface of the heat source. The peak-valley structure in the elastic component is disposed on a mounting surface of the heat sink as a force-applying portion, and two ends of the elastic component exceed an edge of the heat sink and are mounted to the support as mounting portions. The at least one elastic component can provide, to the heat sink by using the peak-valley structure, pressure to tightly attach the heat sink to the heat source. In this disclosure, the heat dissipation apparatus can implement a floating connection between the heat sink and the support by using the elastic component. The elastic component has large design tolerance, is easy to mount, and has stable mechanical properties. The mounting portions of the elastic component that are configured to be mounted to the support and the force-applying portion of the elastic component that is configured to apply elastic force to the heat sink are different portions in the elastic component. Therefore, the heat dissipation apparatus in this disclosure can appropriately adjust the force-applying portion while the mounting portions keeps unchanged, to improve attachment tightness between the heat sink and the heat source, thereby improving heat dissipation effect of the heat sink on the heat source.

According to a first aspect, this disclosure provides a heat dissipation apparatus. The heat dissipation apparatus is used for a circuit board having a heat source, to dissipate heat for the heat source. Specifically, the heat dissipation apparatus includes: a support, where the support includes a bearing portion provided with an assembly opening, and the bearing portion is configured to be fastened to the circuit board; a heat sink, where the heat sink includes a first heat conducting surface and a mounting surface that are opposite to each other, the heat sink is disposed on the bearing portion, and the first heat conducting surface faces the bearing portion and is configured to penetrate the assembly opening to be attached to a second heat conducting surface of the heat source; and at least one elastic component, where each elastic component is a strip-shaped elastic component having a peak-valley structure, the peak-valley structure of each elastic component is disposed on the mounting surface of the heat sink, and two ends of each elastic component are separately fastened to the support. The at least one elastic component is configured to provide, to the heat sink, pressure to tightly attach the heat sink to the heat source.

In other words, in this embodiment of this disclosure, the heat dissipation apparatus includes the at least one elastic component, the heat sink, and the support. Each elastic component is a new snake spring, that is, each elastic component is the strip-shaped component having the peak-valley structure. The bearing portion in the support is provided with the assembly opening. The heat sink includes the heat conducting surface and the mounting surface that are opposite to each other. The heat conducting surface is configured to be attached to the heat conducting surface of the heat source, so that the heat sink dissipates heat for the heat source. In the heat dissipation apparatus, the support is configured to be mounted to the circuit board, and the assembly opening on the bearing portion in the support is configured to accommodate the heat source on the circuit board, so that the heat conducting surface of the heat source can penetrate the assembly opening on the bearing board. The heat sink is disposed on the bearing portion of the support, and the heat conducting surface of the heat sink can penetrate the assembly opening, to be attached to the heat conducting surface of the heat source. The peak-valley structure in the elastic component is disposed on the mounting surface of the heat sink as a force-applying portion, and the two ends of the elastic component exceed an edge of the heat sink and are mounted to the support as mounting portions. The at least one elastic component can provide, to the heat sink by using the peak-valley structure, pressure to tightly attach the heat sink to the heat source.

In a possible implementation of the first aspect, the bearing portion includes a frame structure, and a hollowing portion on the frame structure is the assembly opening.

In another possible implementation of the first aspect, the bearing portion includes two or more bearing blocks, and a spacing between the bearing blocks is the assembly opening on the bearing portion.

The heat dissipation apparatus can implement a floating connection between the heat sink and the support by using the elastic component. The elastic component has large design tolerance, is easy to mount, and has stable mechanical properties. In addition, the mounting portions of the elastic component that are configured to be mounted to the support and the force-applying portion of the elastic component that is configured to apply elastic force to the heat sink are different portions in the elastic component. Therefore, the heat dissipation apparatus in this disclosure can appropriately adjust the force-applying portion while the mounting portions keeps unchanged, to improve attachment tightness between the heat sink and the heat source, thereby improving heat dissipation effect of the heat sink on the heat source.

When the heat dissipation apparatus is mounted to the circuit board having the heat source, the support is fastened to the circuit board, and the bearing portion in the support is disposed around the heat source. The support has the following functions: First, the bearing portion in the support is disposed around the heat source, to enhance mechanical strength of the circuit board near the heat source, avoid high heat consumption of the heat source and warping and deformation of the circuit board caused thereby, increase stress at a connection position between the circuit board and the heat source, and reduce connection stability between the circuit board and the heat source. Second, the support on both sides of the heat sink can be used to fasten the two ends of the elastic component, so that elastic recovery force of the elastic component directly acts on the support instead of directly acting on the circuit board, thereby reducing a load borne on the circuit board and improving stability of a structure of the circuit board. Finally, when a plurality of heat sources for which heat needs to be dissipated are disposed on the circuit board, a plurality of heat sinks adapted to the plurality of heat sources may be mounted to one support, to reduce a mounting area for mounting the heat dissipation apparatus on the circuit board, and optimize a layout of functional elements on the circuit board.

In a possible implementation of the first aspect, the heat sink includes a body and a heat conducting protrusion. The heat conducting protrusion protrudes from the body in a direction away from the body, and a surface of the heat conducting protrusion away from the body is the first heat conducting surface.

In a possible implementation of the first aspect, the peak-valley structure of the elastic component elastically abuts against the mounting surface of the heat sink, and the heat sink is elastically bound to the support.

Elastic abutting indicates that the peak-valley structure in the elastic component can abut against the mounting surface of the heat sink, and acting force exerted by the elastic component on the heat sink is elastic force. Elastic binding indicates that the heat sink and the support can be relatively fastened, but fastening between the heat sink and the support is not simply rigid fastening. When the heat dissipation apparatus is mounted to the circuit board, the first heat conducting surface of the heat sink is raised by the second heat conducting surface of the heat source. In this case, the heat sink can adjust a relative position of the support, and the support is fastened to the circuit board, the peak-valley structure of the elastic component provides the heat sink with the elastic force to attach the heat sink to the heat source. Under effect of the elastic force on the heat sink, the first heat conducting surface of the heat sink is tightly attached to the second heat conducting surface of the heat source.

In other words, in this embodiment of this disclosure, before the heat dissipation apparatus is mounted to the circuit board, the elastic component is in a pre-wrapped state, and the elastic component applies pretightening force to the heat sink, to elastically bound the heat sink to the support, so as to avoid a collision between the heat sink and the support during transportation of the heat dissipation apparatus, thereby reducing a probability that the heat dissipation apparatus is abnormal due to transportation, and improving a yield rate of the heat dissipation apparatus.

In a possible implementation of the first aspect, the two ends of each elastic component are detachably connected to the support. The elastic component and the heat sink in the heat dissipation apparatus are partially replaced. Specifically, each elastic component adjusts an external size of the elastic component by using a form change of a peak-valley structure. For example, a length, a width, and a height of the elastic component are changed by using the form change of the peak-valley structure, to adjust an assembly status of the two ends of the elastic component and the support.

In the heat dissipation apparatus, the two ends of each elastic component are detachably connected to the support, to implement disassembling and assembling of the heat dissipation apparatus, so that when some components in the heat dissipation apparatus fail, a normal function of the heat dissipation apparatus can be restored by replacing only the some components. Therefore, the heat dissipation apparatus can reduce use costs of the heat dissipation apparatus, and improve economic benefits.

In another alternative implementation, the two ends of each elastic component are not detachably connected to the support. For example, the two ends of each elastic component are bonded or welded to the support.

In a possible implementation of the first aspect, the two ends of each elastic component separately include a hooking portion extending to the support; two mounting ends located on two sides of the heat sink are disposed on the support, and mounting holes adapted to the hooking portions are respectively disposed at the two mounting ends; and the hooking portions at the two ends of each elastic component are respectively clamped into the mounting holes at the two mounting ends.

In other words, in this embodiment of this disclosure, the mounting ends configured to mount the elastic component are disposed on the support. When the heat sink is disposed on the support, the mounting ends on the support are distributed on the two sides of the heat sink in pairs. Specifically, the mounting holes are disposed on the mounting ends, and an end portion of the elastic component is the hooking portion adapted to the mounting hole. When the elastic component is mounted to the support on which the heat sink is mounted, the hooking portions at the two ends of the elastic component are clamped into the mounting holes. When the heat dissipation apparatus is mounted to the circuit board, the hooking portion of the elastic component abuts against the mounting end, so that the heat sink is tightly and elastically attached to the heat source on the circuit board by using the elastic component and the support. It may be understood that the mounting hole is a through hole or a blind hole.

In a possible implementation of the first aspect, when the elastic component is mounted to the support, the hooking portion extends from the heat sink to the support.

In a possible implementation of the first aspect, when the elastic component is mounted to the support, the hooking portion extends from a side of the support away from the heat sink to a side of the support close to the heat sink.

In the heat dissipation apparatus, the two ends of each elastic component are configured to be the hooking portions extending to the support, so that the two ends of the elastic component can be clamped into the mounting holes at the mounting ends on the two sides of the heat sink on the support. After the elastic component is mounted to the support, the hooking portions at the two ends of each elastic component are hooked onto the two mounting ends. This can effectively prevent the two ends of the elastic component from detaching from the mounting holes. In this way, an integrated incoming material of the elastic component, the heat sink, and the support in the heat dissipation apparatus can be implemented, and a step of mounting the heat dissipation apparatus on the circuit board is simplified.

In a possible implementation of the first aspect, the mounting hole on the support is a through hole. The mounting hole in the heat dissipation apparatus is configured as the through hole. On one hand, mounting is easy, it is convenient to operate, and a structure of the heat dissipation apparatus is highly stable. On the other hand, an end of the elastic component can be pushed to retract by using an opening facing outward from the mounting hole, and the elastic component detaches from the mounting hole, to facilitate maintenance and replacement of components such as the elastic component and the heat sink.

In a possible implementation of the first aspect, the heat sink further includes a heat dissipation structure. The heat dissipation structure is disposed on a side away from the first heat conducting surface. The heat dissipation structure includes a plurality of fins arranged in parallel. A plurality of air ducts are formed between the plurality of fins. Each elastic component correspondingly penetrates an air duct in the plurality of air ducts.

In other words, in this embodiment of this disclosure, the heat sink is an air-cooled heat sink. Air in the air duct flows in an extension direction of the air duct, and the flowing air can take away heat from the heat dissipation structure, for example, reduce a temperature of the fins and the temperature of the heat dissipation structure attached to a heat dissipation surface of a substrate. A cross section of the air duct of the air-cooled heat sink may be a square cross section or a U-shaped cross section. The air duct cross section is a cross section obtained by the air duct after the heat dissipation structure is cut in a vertical direction of the air duct. The heat dissipation structure is disposed on the side away from the first heat conducting surface. For example, the heat dissipation structure is disposed on a heat dissipation surface of the heat sink. For another example, if the heat dissipation structure is disposed on a plane of the heat sink (for example, disposed on a surface parallel to the first heat conducting surface or mounting surface), one surface of the air duct in the heat dissipation structure is the mounting surface of the heat sink. For example, a bottom surface of the air duct is opposite to the first heat conducting surface. Therefore, the bottom surface of the air duct in the heat sink may be considered as the mounting surface of the heat sink.

When the heat sink is an air-cooled heat sink, the elastic component in the heat dissipation apparatus is disposed at a disposing position in the heat sink. First, no additional mounting surface needs to be disposed in the heat sink, and the elastic component does not need to occupy space other than that of the heat sink and the support. Second, because the size of the elastic component is small, the elastic component occupies a smaller air duct, thereby improving air flow effect in the air duct. In addition, based on a special mounting mode of the elastic component and the support, the mounting holes does not need to be disposed on the heat sink, to increase the heat dissipation area of the heat sink. In conclusion, in this disclosure, the elastic component improves heat dissipation effect of the heat dissipation apparatus by reducing an occupied air duct and increasing a heat dissipation area.

In a possible implementation of the first aspect, a length direction of each elastic component is parallel to an extension direction of the air duct that the elastic component penetrates.

The two ends of the elastic component are a first end and a second end of the elastic component. The length direction of the elastic component indicates a direction from the first end of the elastic component to the second end of the elastic component. The extension direction of the air duct can be an extension direction of a fin. In other words, in this embodiment of this disclosure, a fluctuation direction of each elastic component in a thickness direction is parallel to an extension direction of the air duct that the elastic component penetrates. For example, if the elastic component is of a straight-line structure in the thickness direction, the extension direction of the air duct is also a straight line. For another example, if the elastic component is of a wave structure in the thickness direction, the extension direction of the air duct is also a wave line.

It may be understood that, in this disclosure, only a length direction of a single elastic component and an extension direction of an air duct through which the elastic component passes are limited, and extension directions of each elastic component and other air ducts are not limited.

In the heat dissipation apparatus, the length direction of the elastic component is disposed to be parallel to the extension direction of the air duct that the elastic component penetrates, so that an air duct occupied by the elastic component is minimized, an air flow in the air duct of the heat sink in a unit time period is increased, heat dissipation efficiency of the heat sink is improved, and heat dissipation effect of the heat dissipation apparatus is improved.

In a possible implementation of the first aspect, a fluctuation shape of the peak-valley structure of each elastic component is on a same plane.

The peak-valley structure is a part that is in the elastic component and that abuts against the mounting surface of the heat sink, and the peak-valley structure corresponds to a wave having several wave units that are connected to each other in a head-to-tail manner. The fluctuation shape of the peak-valley structure indicates a track that a wave corresponding to the peak-valley structure fluctuating and extending from one end to the other end. In other words, in this embodiment of this disclosure, when a thickness of the elastic component is ignored, the peak-valley structure of the elastic component is located on a same thickness plane. Further, when the fluctuation shape of the peak-valley structure of the elastic component is on a same plane, the air duct in the heat dissipation structure of the heat sink extends along a straight line, that is, the length direction of the elastic component can be parallel to the extension direction of the air duct.

In the heat dissipation apparatus, the elastic component is an elastic component whose fluctuation shape of a peak-valley structure is on a same plane. Mounting precision of the elastic component is better than that of the column spring of a spiral structure, and mounting difficulty is reduced. In addition, an extension direction of this type of elastic component in an air duct is appropriately arranged, so that an occupied air duct can be further reduced, an air flow in the air duct can be further improved, and heat dissipation efficiency of the heat sink can be further improved.

In a possible implementation of the first aspect, a thickness range of each elastic component ranges from 1.5 mm to 10 mm, and a thickness direction is a direction perpendicular to the fluctuation shape of the peak-valley structure. For example, the thickness of the elastic component is 2 mm.

In other words, in this embodiment of this disclosure, a size of the elastic component in the thickness direction is approximate to a diameter of a strip elastic material, so that the size of the thickness direction of the elastic component is small, thereby ensuring that the elastic component occupies a smaller air duct. In addition, the heat dissipation apparatus in this disclosure is particularly applicable to a heat dissipation system in which a plurality of independent floating heat sinks coexist, and has more obvious effect of reducing wind resistance. With a same volume, the heat dissipation apparatus in this disclosure can increase a ventilation volume by more than 14%.

In a possible implementation of the first aspect, the support further includes: a position-limiting portion. The position-limiting portion is disposed on the bearing portion, and forms, together with the bearing portion, accommodating space for accommodating the heat sink. The position-limiting portion is disposed around an outer edge of the heat sink, and a position-avoiding notch is disposed on the outer edge of the heat sink. The mounting end is formed at a joint between the bearing portion and the position-limiting portion. The two ends of each elastic component penetrate the position-avoiding notch, and are clamped into the mounting holes.

The support includes the bearing portion and the position-limiting portion. The bearing portion and the position-limiting portion jointly form the accommodating space for disposing the heat sink. It may be understood that the accommodating space is space of the support for accommodating the heat sink when the heat sink is mounted to the support. Specifically, the position-limiting portion is disposed around the outer edge of the body, to align the first heat conducting surface of the heat sink with the second heat conducting surface of the heat source. The mounting end is disposed at a joint of the position-limiting portion and bearing portion. In other words, the two ends of the elastic component are respectively mounted at joints of the position-limiting portion and the bearing portion in the support.

In a possible implementation of the first aspect, a height of the position-limiting portion should ensure that the heat sink does not detach from the support when it floats upward to a highest position in a normal working state, and that impact of a ventilation volume of the heat sink is minimized.

In a possible implementation of the first aspect, an avoidance notch is disposed on a fin located at the position-avoiding notch, and the avoidance notch and the position-avoiding notch together form mounting space for mounting the two ends of each elastic component to the mounting holes.

In other words, in this embodiment of this disclosure, to reduce mounting difficulty of the elastic component on the support, a size of the position-avoiding notch is greater than the diameter of the elastic material in the elastic component. In some cases, a fin is carried at a position at which the position-avoiding notch is disposed, and the fin divides the position-avoiding notch into two parts, so that the position-avoiding notch cannot be normally used in a region on a side of the fin far away from the elastic component. In other words, the fin herein causes the position-avoiding notch to fail to effectively reduce mounting difficulty of the elastic component. To avoid affecting normal use of the position-avoiding notch and effectively reduce the mounting difficulty of the elastic component, an avoidance notch is disposed on the fin near the position-avoiding notch, to connect the position-avoiding notch on two sides of the fin by using the avoidance notch, to form the mounting space for mounting the two ends of the elastic component to the mounting holes.

In the heat dissipation apparatus, the avoidance notch is disposed on the fin located at the position-avoiding notch, so that the mounting space for mounting the elastic component at the two ends is increased while stability of connection between the elastic component and the support is ensured, thereby reducing assembly difficulty of the elastic component and also reducing molding difficulty of the elastic component.

In a possible implementation of the first aspect, the support further includes an elevating portion. The elevating portion protrudes from the position-limiting portion in a direction away from the bearing portion, and the elevating portion is configured to limit the heat sink from being detached from the support.

In the heat dissipation apparatus, the elevating portion is added to the position-limiting portion of the support, so that it can be ensured that the heat sink is not detached from the support in an abnormal case, stability of the structure of the heat dissipation apparatus can be improved, and security of the heat dissipation apparatus can be improved during use.

In a possible implementation of the first aspect, the elevating portion is formed in a local region of the position-limiting portion, to reduce weight of the support, implement a lightweight design of the heat dissipation apparatus, reduce raw material costs, and improve economic benefits when security performance is improved by using the elevating portion.

In a possible implementation of the first aspect, the elevating portion protrudes from the position-limiting portion forming the mounting end in a direction away from the mounting end.

In other words, in this embodiment of this disclosure, the mounting end is formed between the elevating portion and the position-limiting portion and the bearing portion that are adjacent to the elevating portion. The mounting end increases a physical size around the mounting hole, improves mechanical strength of the mounting end, and optimizes an overall structure of the support.

In a possible implementation of the first aspect, a surface facing the accommodating space on the position-limiting portion is a first guiding surface. A second guiding surface adapted to the first guiding surface is disposed at the two ends of the elastic component. The first guiding surface cooperates with the second guiding surface, to guide the two ends of the elastic component into directions of the mounting holes.

In other words, in this embodiment of this disclosure, completing the mounting of the elastic component by using the first guiding surface and the second guiding surface specifically includes: When one end of the elastic component is mounted at the mounting end of the support, the second guiding surface at one end of the elastic component abuts against the first guiding surface of the support, to drive the end of the elastic component, so that the second guiding surface slides along the first guiding surface, until the end of the elastic component slides into the mounting hole and abuts against the mounting end, to complete mounting of the end of the elastic component and the mounting end. Alternatively, after the end of the elastic component slides into the mounting hole, the end of the elastic component is accommodated in the mounting hole, but does not abut against the mounting end. When the support is mounted to the circuit board, the end of the elastic component abuts against the mounting end.

In the heat dissipation apparatus, the first heat conducting surface of the position-limiting portion and the second guiding surface at the two ends of the elastic component can reduce mounting difficulty of the heat dissipation apparatus, and implement precise and quick mounting of the elastic component in the heat dissipation apparatus.

In a possible implementation of the first aspect, a press-fitting portion that is of each elastic component and that is configured to press against the heat sink is in a dot shape or a linear shape. The elastic component in the heat dissipation apparatus is configured to press against the heat sink in various forms, so as to implement tight and elastic attachment between the heat sink and a hot surface.

In a possible implementation of the first aspect, the at least one elastic component specifically includes two elastic components. When a press-fitting portion that is of each elastic component and that is configured to press against the heat sink is in a dot shape, press-fitting portions between the two elastic components are not on a straight line.

In the heat dissipation apparatus, the elastic component is appropriately arranged, so that the press-fitting portions of the elastic component are not on the same straight line, and the first heat conducting surface of the heat sink is stably attached to the second heat conducting surface of the heat source by using points that are not on the same straight line.

In a possible implementation of the first aspect, each elastic component is symmetrically distributed relative to a center line of the elastic component, and the center line is a straight line that passes through a midpoint of the elastic component and that is perpendicular to a length direction of the elastic component.

In other words, in this embodiment of this disclosure, a difference value between the length of the elastic component and a two-fold distance between one end of the elastic component and the midpoint in the length direction of the elastic component is less than a preset value.

In the heat dissipation apparatus, the elastic component is configured as a structure symmetrically distributed relative to the center line, to balance a working status of the entire peak-valley structure in the elastic component, and improve attachment effect between the heat sink and the heat source. In this way, in the heat dissipation apparatus, the heat sink evenly and stably presses against the heat source, thereby improving attachment effect between the first heat conducting surface of the heat sink and the second heat conducting surface of the heat source, increasing an effective contact surface between the first heat conducting surface and the second heat conducting surface, to improve heat dissipation effect of the heat dissipation apparatus on the heat source.

In a possible implementation of the first aspect, when each elastic component is in a natural state, a deflection of the peak-valley structure close to the midpoint is greater than a deflection of the peak-valley structure close to two ends. The peak-valley structure close to the midpoint is a wave unit close to the midpoint, and the peak-valley structure close to the two ends is wave units close to the two ends.

In other words, in this embodiment of this disclosure, because the peak-valley structure close to the two ends is close to the mounting ends, stable pressing against the heat sink can be implemented when the peak-valley structure is slightly deformed. For the peak-valley structure close to the midpoint, because the peak-valley structure close to the midpoint is far away from the mounting end, stable pressing against the heat sink can be implemented only when the peak-valley structure herein is greatly deformed. Based on this, to implement stable pressing against the heat sink of each peak and valley of the elastic component, it further needs to be ensured that when the elastic component is in a natural state, the deflection of the peak-valley structure close to the midpoint is greater than the deflection of the peak-valley structure close to the two ends.

For the heat dissipation apparatus, deflections of peak-valley structures at different positions in the elastic component are appropriately disposed, so that when the heat dissipation apparatus is mounted to the circuit board, the elastic component stably and evenly presses against the mounting surface of the heat sink, that is, the heat sink stably and evenly presses against the heat source on the circuit board. Even pressing indicates that contact regions between the elastic components and the heat sink are evenly distributed, and the contact regions between the heat sink and the elastic components in contact basically have same force.

In a possible implementation of the first aspect, the heat source is an electronic component mounted to the circuit board. For example, the heat source is a chip that is mounted to the circuit board and has high heat consumption.

According to a second aspect, this disclosure provides a heat dissipation apparatus, used for a circuit board having a heat source, to dissipate heat for the heat source, including: a heat sink, where the heat sink includes a first heat conducting surface and a mounting surface that are opposite to each other; and at least one elastic component, where each elastic component is a strip-shaped elastic component having a peak-valley structure, the peak-valley structure of each elastic component is disposed on the mounting surface of the heat sink, and two ends of each elastic component are configured to be separately fastened to the circuit board, so that the first heat conducting surface of the heat sink is attached to a second heat conducting surface of the heat source. The at least one elastic component is configured to provide, to the heat sink, pressure to tightly attach the heat sink to the heat source.

In a possible implementation of the second aspect, the heat source is an electronic component mounted to the circuit board. For example, the heat source is a chip that is mounted to the circuit board and has high heat consumption.

The heat dissipation apparatus improves attachment stability between the first heat conducting surface of the heat sink and the second heat conducting surface of the heat source, improves uniformity of stress distribution at an attachment position, improves a force-bearing status of the heat sink, and extends service life of the heat sink. In addition, there is no need to dispose a mounting hole on the heat dissipation apparatus, thereby increasing an effective heat dissipation area of the heat sink and improving heat dissipation effect of the heat sink on the heat source.

According to a third aspect, this disclosure provides a circuit module, including the heat dissipation apparatus according to any one of the possible implementations of the first aspect, a circuit board, and an electronic component mounted to the circuit board. The electronic component is a heat source. The circuit board is located on a side of a support away from a heat sink and is fastened to the support. A second heat conducting surface of the heat source faces an assembly opening. In a possible implementation of the third aspect, the electronic component is a chip mounted to the circuit board.

First, in the circuit module, the first heat conducting surface of the heat sink is tightly and elastically bound to and abuts against the second heat conducting surface of the heat source by using an elastic component and the support. Specifically, because the elastic component is configured to be mounted to a mounting portion of the support, and is different from a force-applying portion configured to apply elastic force to the heat sink, the elastic component can adjust a position of the force-applying portion by adjusting a peak-valley structure, to adjust a force-applying point of the elastic component on the heat sink, thereby improving a force-bearing status of the heat sink and the heat source, attachment stability between the heat sink and the heat source, evenness of stress distribution at an attachment point, and the force-bearing status of the heat source and heat sink.

Second, the elastic component replaces a position-limiting pin and a column spring in the conventional technology to mount the heat sink on the electronic component, thereby simplifying a mounting method, increasing an effective heat dissipation area of the heat sink, and improving heat dissipation effect of the circuit module.

In addition, two ends of the elastic component in the heat dissipation apparatus are mounted to the support, so that mounting stress of the elastic component is applied to the support instead of directly applied to the circuit board. Therefore, the circuit board is prevented from deforming and the first heat conducting surface of the heat sink is prevented from being poorly attached to the second heat conducting surface of the heat source caused by deformation of the circuit board.

Finally, when a plurality of heat sources are disposed on the circuit board, a plurality of heat sinks adapted to the plurality of heat sources may be mounted to one support, to reduce an area of a mounting region for mounting the heat dissipation apparatus on the circuit board, and optimize a layout of functional elements on the circuit board.

In a possible implementation of the third aspect, a contact region between the peak-valley structure of the elastic component and a mounting surface of the heat sink is located in an orthographic projection region of the second heat conducting surface of the electronic component on a mounting surface.

In other words, in this embodiment of this disclosure, the orthographic projection of the core stress point of the heat sink on the plane on which the second heat conducting surface is located is located on the second heat conducting surface of the heat source. The core stress point indicates a force-bearing region that is on the heat sink and that is used to receive elastic force of the elastic component when the heat dissipation apparatus is mounted to the circuit board. The second heat conducting surface includes the second heat conducting surface and an edge position of the second heat conducting surface. In other words, the orthographic projection of the core stress point of the heat sink on the plane on which the second heat conducting surface is located is located on the second heat conducting surface of the heat source or located at the edge position of the second heat conducting surface of the heat source.

In the foregoing circuit module, a position of the contact region between the peak-valley structure of the elastic component and the mounting surface of the heat sink is appropriately arranged, that is, a core stress point of the heat sink is appropriately arranged, so that an elastic force exerted by the elastic component on the heat sink can be stably transferred to the heat source by using a heat conducting protrusion in the heat sink, in this way, the first heat conducting surface of the heat sink is closely attached to the second heat conducting surface of the heat source.

On the one hand, a force-bearing condition of the heat sink is optimized, and the orthographic projection of the core stress point is prevented from being distributed at a position far away from the second heat conducting surface of the heat source, thereby avoiding a stilt-type force-bearing mode in which the heat sink uses an edge of a heat conducting protrusion as a supporting point and uses core force-bearing as a force-bearing end. The stilt-type force-bearing mode affects stability of a structure of a substrate, and even causes delamination of a heat conducting layer when the heat conducting layer of the first heat conducting surface is thin, thereby affecting heat dissipation effect and service life of the heat sink. On the other hand, the orthographic projection of the core stress point is disposed on the second heat conducting surface of the heat source, so that the heat sink directly applies force on the second heat conducting surface of the heat source, thereby improving attachment tightness between the heat sink and the heat source, and improving heat dissipation effect of the heat sink on the heat source.

In a possible implementation of the third aspect, when the substrate of the heat sink is a vacuum cavity vapor chamber structure, a core stress point distribution mode in this implementation can effectively reduce a rigidity requirement of a conventional floating connection on the vacuum cavity vapor chamber structure, and reduce a thickness of the vacuum cavity vapor chamber structure, thereby reducing an overall thickness of the heat sink.

In a possible implementation of the third aspect, to further optimize the force-bearing condition of the heat sink and reduce the rigidity requirement for the vacuum cavity vapor chamber structure, the orthographic projection of the core stress point of the heat sink falls on a projection of a support column of the heat sink. In other words, the core stress point of the heat sink is located right above the support column of the heat sink, that is, a press-fitting portion of the elastic component is located right above the support column.

In a possible implementation of the third aspect, the contact region between the peak-valley structure of the elastic component and the mounting surface of the heat sink is located at an edge position of the orthographic projection region of the second heat conducting surface of the electronic component on the mounting surface.

In other words, in this embodiment of this disclosure, the orthographic projection of the core stress point of the heat sink on the plane on which the second heat conducting surface is located is located on an edge of the second heat conducting surface of the heat source.

In the foregoing circuit module, the contact region between the peak-valley structure of the elastic component and the mounting surface of the heat sink is located at the edge position of the orthographic projection region of the second heat conducting surface of the electronic component on the mounting surface, so that an effect range of the elastic component can be maximized, thereby implementing stable attachment between the heat sink and the heat source, and further optimizing heat dissipation effect of the heat sink on the heat source.

In a possible implementation of the third aspect, the at least one elastic component specifically includes two elastic components, and contact regions between peak-valley structures of the two elastic components and the mounting surface of the heat sink are respectively located at edge positions of the orthographic projection region of the second heat conducting surface of the electronic component on the mounting surface.

In the foregoing circuit module, the two elastic components are separately press-fitted on the heat sink that is right above an edge of the heat source. The elastic components have simple structure shapes, are easy to mold, and are easy to mount. The two elastic components are sufficient to stably press the heat sink against the surface of the heat source, thereby improving the heat dissipation effect of the heat sink on the heat source.

According to a fourth aspect, this disclosure provides a circuit module, including the heat dissipation apparatus in the second aspect, a circuit board, and an electronic component mounted to the circuit board. The electronic component is considered as a heat source, and two ends of an elastic component are separately fastened to the circuit board.

In the circuit module, a structure of the entire circuit module is stable, and there are a small quantity of components, which facilitates assembly. In addition, the circuit module can effectively improve heat dissipation of the electronic component in the circuit module, and optimize use performance of the electronic component.

In a possible implementation of the fourth aspect, mounting holes are disposed on the circuit board, and the two ends of the elastic component are respectively clamped into the mounting holes.

In a possible implementation of the fourth aspect, the electronic component is a chip mounted to the circuit board.

According to a fifth aspect, this disclosure provides an electronic device. According to a fifth aspect, this disclosure provides an electronic device, including the circuit module according to any one of the third aspect and the fourth aspect. Beneficial effect of the electronic device is brought by the foregoing circuit module, and details are not described herein.

According to a sixth aspect, this disclosure provides a circuit module assembly method. According to a sixth aspect, this disclosure provides a circuit module assembly method, to assemble the circuit module according to any one of possible implementations of the third aspect. The assembly method includes: disposing a heat dissipation apparatus on a circuit board, where a first heat conducting surface of a heat sink in the heat dissipation apparatus faces a second heat conducting surface of a heat source on the circuit board; and fastening and mounting a support in the heat dissipation apparatus on the circuit board by using a fastener.

In the circuit module assembly method, an elastic component and the heat sink are first mounted to the support, that is, after the heat dissipation apparatus is assembled first, the support is mounted to the circuit board. This can effectively avoid scratching an electronic component on the circuit board during mounting of the elastic component and the heat sink, thereby improving a yield rate of the circuit module and improving economic benefits.

In a possible implementation of the sixth aspect, a heat dissipation apparatus assembly method in the assembly method includes: disposing the heat sink on the support, where the first heat conducting surface of the heat sink faces the support; disposing an elastic component on a side of the heat sink having a mounting surface; mounting one end of the elastic component to a first mounting end of the support; and applying external force to the elastic component to change a shape of a peak-valley structure of the elastic component, and mounting the other end of the elastic component to a second mounting end of the support.

In the heat dissipation apparatus mounting method in the circuit module assembly method, one end of the elastic component is first mounted at a first mounting end in the support, and a wave is deformed by applying the external force, to adjust a distance between the two ends of the elastic component, so that the other end of the elastic component is mounted at a second mounting end in the support. Mounting steps are simple and the operation method is simple.

In a possible implementation of the sixth aspect, when the circuit module is incoming, the heat dissipation apparatus is not assembled, and the circuit module assembly method includes: disposing the heat sink on the support, where the first heat conducting surface of the heat sink faces the support; disposing the elastic component on the side of the heat sink having the mounting surface; mounting one end of the elastic component to the first mounting end of the support; applying the external force to the elastic component to change the shape of the peak-valley structure of the elastic component, and mounting the other end of the elastic component to the second mounting end of the support to form the heat dissipation apparatus; disposing the heat dissipation apparatus on the circuit board, where the first heat conducting surface of the heat sink in the heat dissipation apparatus faces the second heat conducting surface of the heat source on the circuit board; and fastening and mounting the support in the heat dissipation apparatus on the circuit board by using the fastener.

In a possible implementation of the sixth aspect, when the circuit module is incoming, the heat dissipation apparatus is not assembled, and the circuit module assembly method includes: mounting the support on the circuit board by using the fastener, where the fastener may be a fastening screw; disposing the heat sink on the support, where the first heat conducting surface of the heat sink faces the support; disposing the elastic component on the side of the heat sink having the mounting surface; mounting one end of the elastic component to the first mounting end of the support; and applying the external force to the elastic component to change the shape of a wave of the elastic component, and mounting a second end of the elastic component to the second mounting end of the support.

According to a seventh aspect, this disclosure provides a circuit module assembly method, to assemble the circuit module according to any one of possible implementations of the fourth aspect. The assembly method includes: disposing a heat sink on a circuit board, where a first heat conducting surface of the heat sink faces a second heat conducting surface of a heat source on the circuit board; disposing an elastic component on a side of the heat sink having a mounting surface; mounting one end of the elastic component to a first mounting end of the circuit board; and applying external force to the elastic component to change a shape of the elastic component, and mounting the other end of the elastic component to a second mounting end of the circuit board.

In the circuit module assembly method, only the heat sink needs to be disposed on a surface of the circuit board, and the elastic component needs to be mounted to the mounting ends on the circuit board. The entire assembly method is simple and easy to operate.

BRIEF DESCRIPTION OF DRAWINGS

FIG. 7(b) is a schematic diagram of distribution of core stress points CSPs' of a heat dissipation apparatus according to another technical solution;

FIG. 7(c) is a side view of a heat dissipation apparatus 10 according to this disclosure, where a support 300 is not shown;

FIG. 7(d) is a side view of a heat dissipation apparatus according to another technical solution, where a support 300 is not shown;

FIG. 15 is an assembly flowchart of a heat dissipation apparatus 10 according to this disclosure;

FIG. 17 is an assembly flowchart of another circuit module 1 according to this disclosure;

REFERENCE NUMERALS

10—heat dissipation apparatus; 100'—connecting piece; 110'—position-limiting pin; 111'—position-limiting slot; 110a'—position-limiting screw; 120'—column spring; 130'—position-limiting piece; 200—heat sink; 201—first heat conducting surface; 203—heat sink through hole; 210—substrate; 211—body; 212—heat conducting protrusion; 220—heat dissipation structure; 221—fin; 222—air duct; 300—support; 301—support hole; 302—support through hole; 20—circuit board; 21—circuit board hole; 30—heat source; 31—second heat conducting surface; 40—reinforced plate; 41—fastening component; 50—fastening screw; CSP'—core stress point;

1—circuit module; 1'''—circuit module; 10—heat dissipation apparatus; 100—elastic component; 101—second guiding surface; 110—first end; 110a—clamping hook; 111a—connection portion; 112a—hooking portion; 120—second end; 130—wave; 131—side wave; 132—middle wave; 133—pressing portion; $l_m$—length direction of a strip elastic material; $l_e$—extension direction of an elastic component; $l_f$—length direction of an elastic component; $P_C$—midpoint; $l_c$—center line of an elastic component; $S_1$—length of an elastic component; $S_2$—distance between one end of an elastic component and a midpoint $P_C$ in a length direction of the elastic component; h—height of an elastic component; $\Delta h$—height difference between one end of an elastic component and a midpoint $P_C$; 200—heat sink; 200a—heat sink; 200b—heat sink; 200c—heat sink; 210—substrate; 201—first heat conducting surface; 202—mounting surface; 211—body; 2111—support column; 2112—vacuum evaporation cavity; 2112a—evaporation surface; 2112b—condensation surface; 212—heat conducting protrusion; 220—heat dissipation structure; 221—fin; 222—air duct; 230—position-avoiding notch; 240—avoidance notch; $d_w$—air direction; $d_c$—extension direction of an air duct; CSP—core stress point; $D_g$—notch region; 300—support; 310—bearing portion; 311—hollowing portion; 320—position-limiting portion; 330—elevating portion; 340—first guiding surface; 350—fastening hole; 400—mounting end; 400a—first mounting end; 400b—second mounting end; 400c—third mounting end; 400d—fourth mounting end; 400"—mounting end; 400'''—mounting end;

400a'''—first mounting end; 400b'''—second mounting end; 410—mounting hole; 411—arc-shaped slot; 412—U-shaped notch; 410''—mounting hole; 20—circuit board; 30—heat source; 31—second heat conducting surface; 40—reinforced plate; and 50—fastening screw.

DESCRIPTION OF EMBODIMENTS

To make the objectives, technical solutions, and advantages of this disclosure clearer, the following further describes the implementations of this disclosure in detail with reference to the accompanying drawings.

Figure 1A:
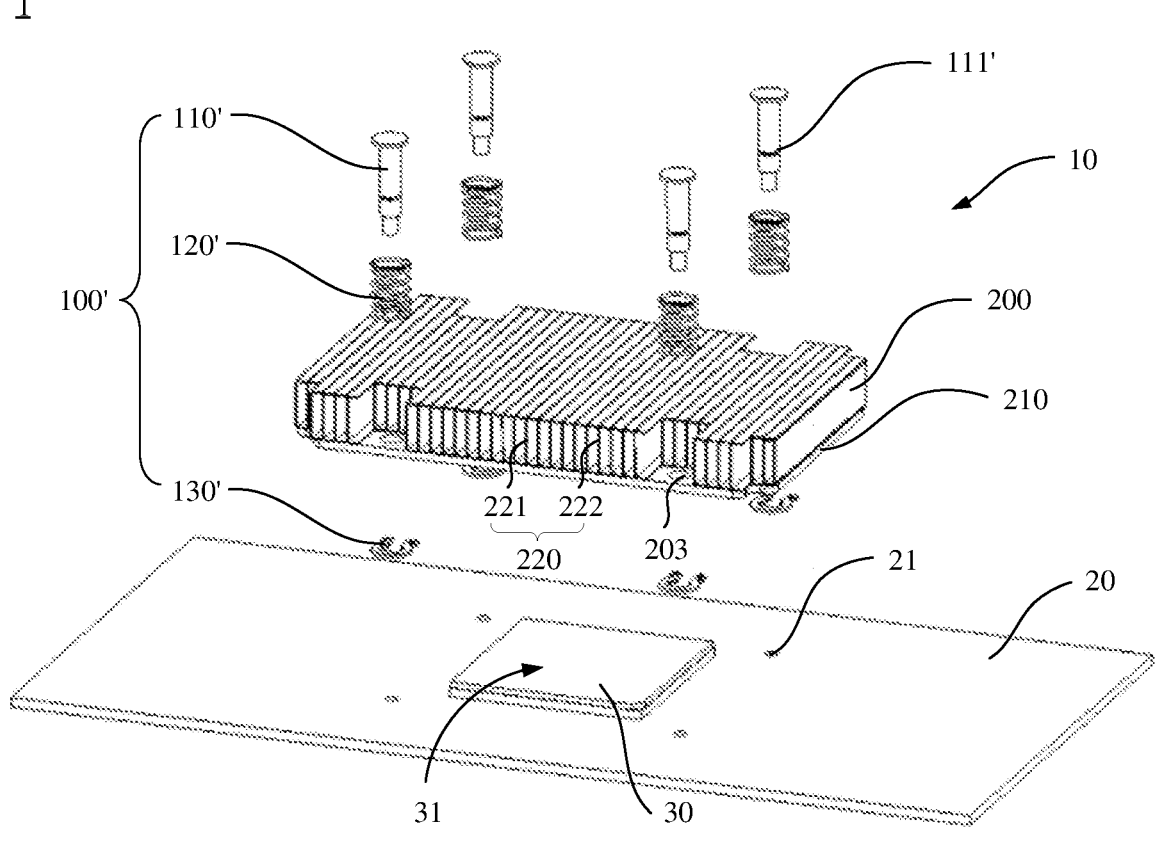
FIG. 1(a) is an exploded view of a circuit module according to another technical solution.
Figure 1B:
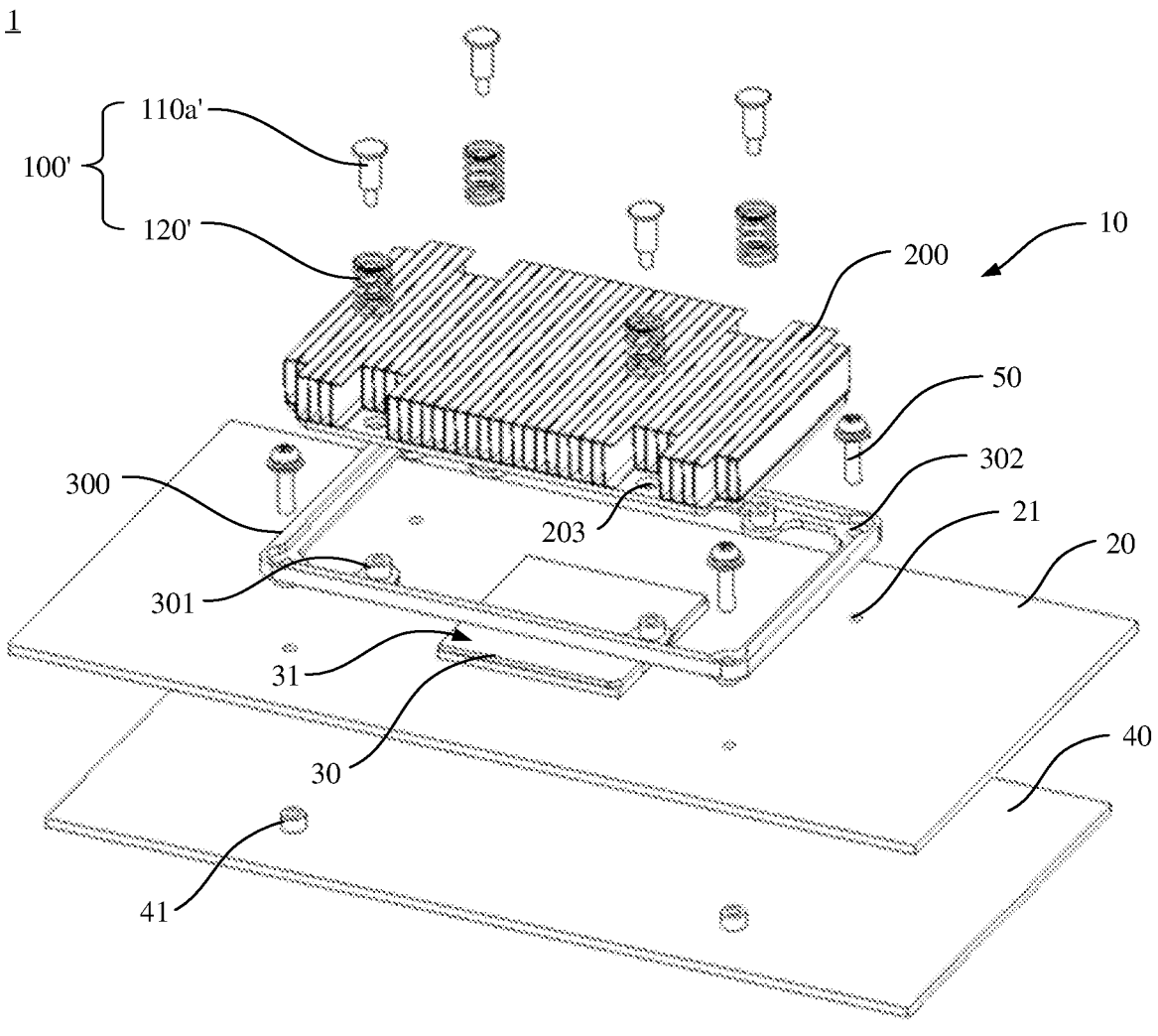
FIG. 1(b) is an exploded view of another circuit module according to another technical solution.

This disclosure provides an electronic device. The electronic device includes at least one group of circuit modules. As shown in FIG. 1(a) and FIG. 1(b), a circuit module 1 includes a heat dissipation apparatus 10, a circuit board 20, and a heat source 30. The heat source 30 is mounted to the circuit board 20, and a heat conducting surface 31 is formed on a surface of the heat source 30. The heat source 30 may be an electronic component mounted to the circuit board 20. For example, the heat source 30 is a chip with high heat consumption mounted to the circuit board 20. The heat conducting surface 31 is a side surface of the heat source 30 away from the circuit board 20, for example, an upper surface of the heat source 30 in FIG. 1(a) and FIG. 1(b).

Specifically, the heat dissipation apparatus 10 includes a connecting piece 100' and a heat sink 200. A heat conducting surface (also referred to as a heat absorption surface of the heat sink 200) of the heat sink 200 that is adapted to the heat conducting surface 31 of the heat source 30 is formed on the heat sink 200, for example, a lower surface of the heat sink 200 in FIG. 1(a) and FIG. 1(b). In the circuit module 1, the connecting piece 100' in the heat dissipation apparatus 10 directly or indirectly connects the heat sink 200 to the circuit board 20, and is adapted to a distance change between the heat sink 200 and the circuit board 20 by using an elastic structure, so that the heat sink 200 is elastically bound to the heat source 30. In other words, the connecting piece 100' in the floating heat dissipation apparatus 10 enables the heat conducting surface of the heat sink 200 to elastically abut against the heat conducting surface 31 of the heat source 30, to adjust a degree of attachment between the heat sink 200 and the heat source 30.

To implement heat dissipation of the heat dissipation apparatus 10 for the heat source 30, the following heat dissipation apparatuses 10 are mainly included currently.

In some scenarios, the heat source 30 uses an air-cooled heat dissipation manner, and the heat sink 200 may be an air-cooled heat sink. As shown in FIG. 1(a) and FIG. 1(b), the heat sink 200 includes a substrate 210 and a heat dissipation structure 220. The substrate 210 has a heat conducting surface (not marked) and a heat dissipation surface (not marked). The heat conducting surface of the heat sink 200 is configured to absorb heat from the heat conducting surface 31 of the heat source 30. The heat dissipation surface is configured to dissipate (conduct) the heat absorbed by the heat sink 200 by using the heat conducting surface to the heat dissipation structure 220. The heat dissipation structure 220 is disposed on the heat dissipation surface of the substrate 210, and the heat dissipation structure 220 includes fins 221 arranged in parallel. An air duct 222 is formed between adjacent fins 221. Air in the air duct 222 flows in an extension direction of the air duct 222, and the flowing air can take away heat from the heat dissipation structure 220, for example, reduce a temperature of the fins 221 and the temperature of the heat dissipation structure 220 attached to the heat dissipation surface of a substrate 210.

In some technical solutions, the heat sink 200 is directly connected to the circuit board 20 by using the connecting piece 100', as shown in FIG. 1(a), the connecting piece 100' includes a position-limiting pin 110', a column spring 120', and a position-limiting piece 130'. A position-limiting slot 111' for clamping the position-limiting piece 130' is further disposed on the position-limiting pin 110'.

Specifically, in the assembled heat dissipation apparatus 10, the position-limiting pin 110' sequentially penetrates the column spring 120' and a heat sink through hole 203 on the heat sink 200 from top to bottom, and the position-limiting slot 111' on the position-limiting pin 110' passes through the heat sink through hole 203 and is located below the heat sink 200. The position-limiting piece 130' is clamped into the position-limiting slot 111', so that the position-limiting pin 110', the column spring 120', the heat sink 200, and the position-limiting piece 130' are connected together. A floating connection of the heat sink 200 relative to the position-limiting pin 110' is implemented by using deformability of the column spring 120'. A lower end of the position-limiting pin 110' is assembled to a circuit board hole 21 on the circuit board 20, and the column spring 120' is elastically deformed, to implement elastic attachment between the heat sink 200 and the heat source 30 on the circuit board 20.

In some other technical solutions, the heat sink 200 is indirectly connected to the circuit board 20 by using the connecting piece 100'. As shown in FIG. 1(b), the circuit module further includes a fastening screw 50 and a reinforced plate 40, and the heat dissipation apparatus 10 further includes a support 300. In the circuit module 1, the support 300 is fastened and connected to the circuit board 20, and the heat sink 200 is elastically connected to the circuit board 20 by using the connecting piece 100' and the support 300. The connecting piece 100' includes a position-limiting screw 110a' and a column spring 120'.

Specifically, after the position-limiting screw 110a' sequentially penetrates the column spring 120' and the heat sink through hole 203 on the heat sink 200 from top to bottom, the position-limiting screw 110a' is fastened to the support hole 301 corresponding to the support 300, so that the position-limiting screw 110a', the column spring 120', the heat sink 200, and the support 300 are connected together, and the floating connection between the heat sink 200 and the support 300 is implemented. The fastening screw 50 sequentially passes through the support through hole 302 of the support 300 and the corresponding hole 21 of the circuit board 20, and is then fastened to the reinforced plate 40. The column spring 120' is elastically deformed, to implement elastic attachment between the heat sink 200 and the heat source 30 on the circuit board 20.

It can be easily found, based on a connection manner of the air-cooled heat sink on the circuit board, that the connecting piece needs to pass through the heat sink 200 and the circuit board 20, to apply force to the heat sink 200 for press-fitting on the heat source 30, so that an action point of the connecting piece 100' on the heat sink 200 cannot be located right above the heat source 30, which may cause a small concave on the heat conducting surface of the heat sink 200, finally causing poor attachment effect between the heat conducting surface of the heat sink 200 and the heat conducting surface 31 of the heat source 30.

In some other scenarios, the heat source 30 uses a liquid-cooled heat dissipation manner, and the heat sink 200 may be a liquid-cooled heat sink. In this scenario, a connection manner between the heat sink 200 and the heat source 30 may be that the heat conducting surface of the heat sink 200 is attached to the heat conducting surface 31 of the heat source 30, which may also cause poor attachment effect between the heat conducting surface of the heat sink 200 and the heat conducting surface 31 of the heat source 30.

In conclusion, in a circuit module of a current electronic device, attachment stability between a heat conducting surface of a heat sink and a heat conducting surface of a heat source is poor. To improve heat dissipation effect of the heat sink on the heat source, attachment effect between the heat conducting surface of the heat sink and the heat conducting surface of the heat source needs to be optimized.

To resolve the foregoing problem, this disclosure provides a heat dissipation apparatus. The heat dissipation apparatus in this disclosure includes at least one elastic component, a heat sink, and a support. Specifically, each elastic component is a new snake spring (NSS), and a form is similar to a form presented by a snake in a movement process. Specifically, the elastic component is a strip elastic component made of an elastic material and having a peak-valley structure. The peak-valley structure corresponds to a wave. Two ends of the elastic component are respectively mounted to two corresponding mounting ends on the support. The heat sink is mounted to the support by using the elastic component in a floating manner. The heat sink is configured to dissipate heat for a heat source on the circuit board. The support is connected to the circuit board to limit a position of the heat sink above the heat source, and cooperate with the heat sink to deform a wave of the elastic component. The elastic component uses elastic force generated through wave deformation to elastically bind and mount the heat sink to the circuit board, so that a heat conducting surface of the heat sink tightly and elastically abuts against a heat conducting surface of the heat source.

The heat dissipation apparatus can implement a floating connection between the heat sink and the support by using the elastic component. The elastic component has large design tolerance, is easy to mount, and has stable mechanical properties. In addition, a mounting portion of the elastic component that is configured to be mounted to the support and a force-applying portion of the elastic component that is configured to apply elastic force to the heat sink are different portions of the elastic component. Therefore, the heat dissipation apparatus in this disclosure can appropriately adjust the force-applying portion with the mounting portion unchanged, to improve attachment tightness between the heat sink and the heat source, thereby improving heat dissipation effect of the heat sink on the heat source.

It may be understood that the heat sink in the heat dissipation apparatus in this disclosure may be an air-cooled heat sink, and the elastic component penetrates an air duct of the heat dissipation structure. A cross section of the air duct of the air-cooled heat sink may be a square cross section or a U-shaped cross section. The air duct cross section is a cross section obtained by the air duct after the heat dissipation structure is cut in a vertical direction of the air duct.

In another alternative implementation, the heat sink in the heat dissipation apparatus in this disclosure may alternatively be a liquid-cooled plate heat sink, and the elastic component is disposed on a side of the heat sink away from the heat conducting surface of the heat sink.

In addition, for an disclosure scenario of a single heat source, the heat dissipation apparatus includes a single heat sink. For an disclosure scenario of a plurality of heat sources, the heat dissipation apparatus may be flexibly combined with a plurality of heat sinks, to meet requirements of the disclosure scenario of the plurality of heat sources.

In addition, for an disclosure scenario in which the circuit board is prone to warping and deformation due to high power consumption of the heat source, the heat dissipation apparatus includes a support, and the support is configured to be disposed around the heat source, to prevent the circuit board around the heat source from being deformed, and ensure binding strength of the circuit board and the chip.

Further, for an disclosure scenario in which there are a plurality of heat sources and the plurality of heat sources are adjacent and close to each other, one support in the heat dissipation apparatus may correspond to a plurality of heat sinks (for example, a quantity of heat sinks is the same as a quantity of heat sources), to connect to the circuit board by using the support, prevent each heat sink from being separately connected to the circuit board, minimize a surface of the circuit board occupied during mounting of the heat dissipation apparatus, and improve flexibility of a layout of a high-density board.

For ease of description, the following describes a structure of the heat dissipation apparatus in this disclosure in detail by using an example in which the heat dissipation apparatus includes one support and three heat sinks, and the heat sink is an air-cooled heat sink with a square air duct cross section. For brevity of description, the following uses one heat sink and an elastic component, a support, a circuit board, a heat source, and the like that correspond to the heat sink as an example for description in this disclosure.

The following describes in detail a heat dissipation apparatus disclosed in this disclosure.

In a possible embodiment of this disclosure, when the circuit board has a plurality of heat sources that are close to each other, and all the plurality of heat sources need to dissipate heat by using the heat sink, or when the circuit board is warped and deformed due to high power consumption of the heat source, the circuit board in this embodiment of this disclosure is applicable to the heat dissipation apparatus having the support. The heat dissipation apparatus uses the support to elastically attach the heat sink to the heat source on the circuit board, which is described in detail below.

Figure 2:
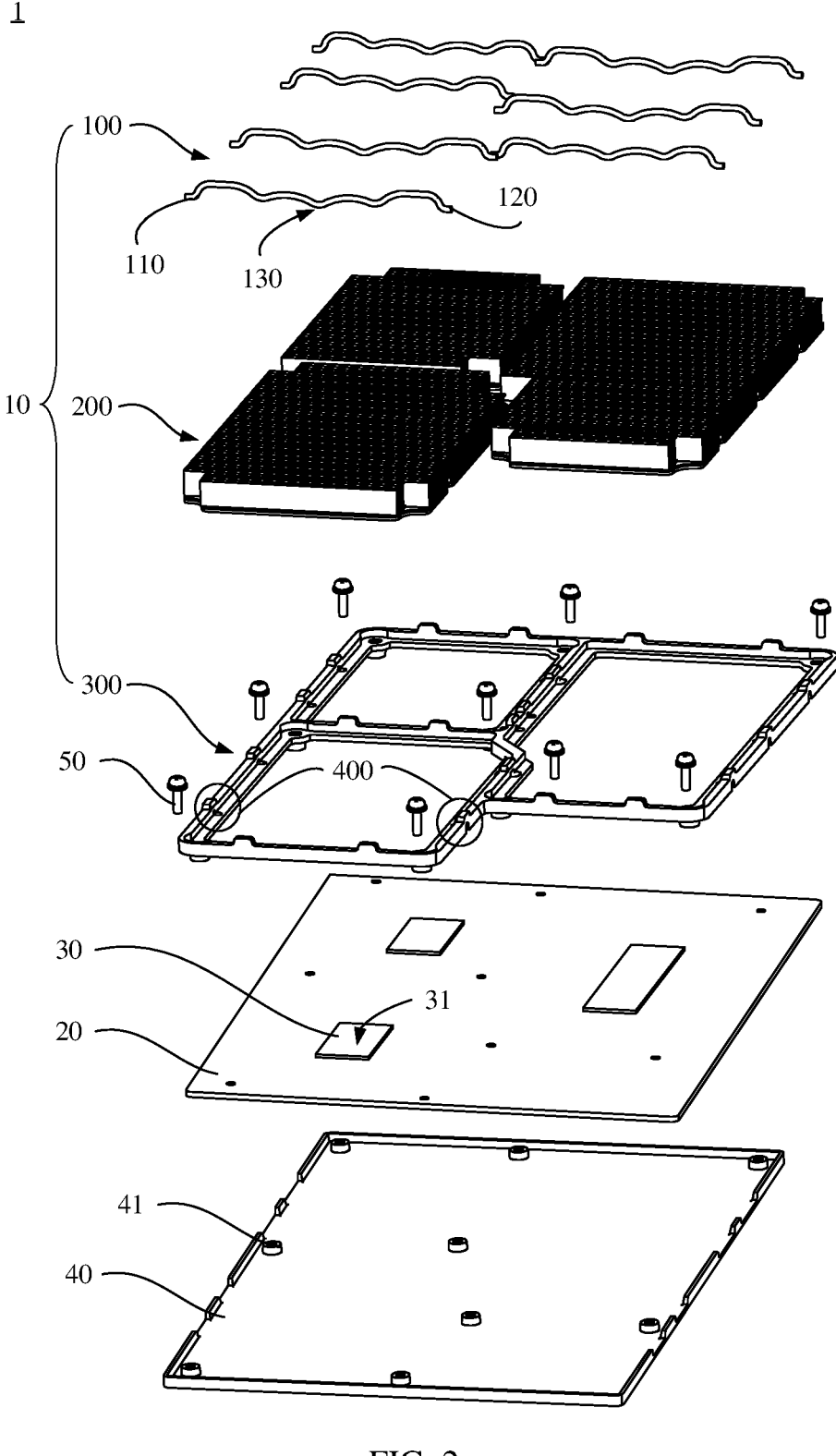
FIG. 2 is an exploded view of a circuit module according to this disclosure.
Figure 3:
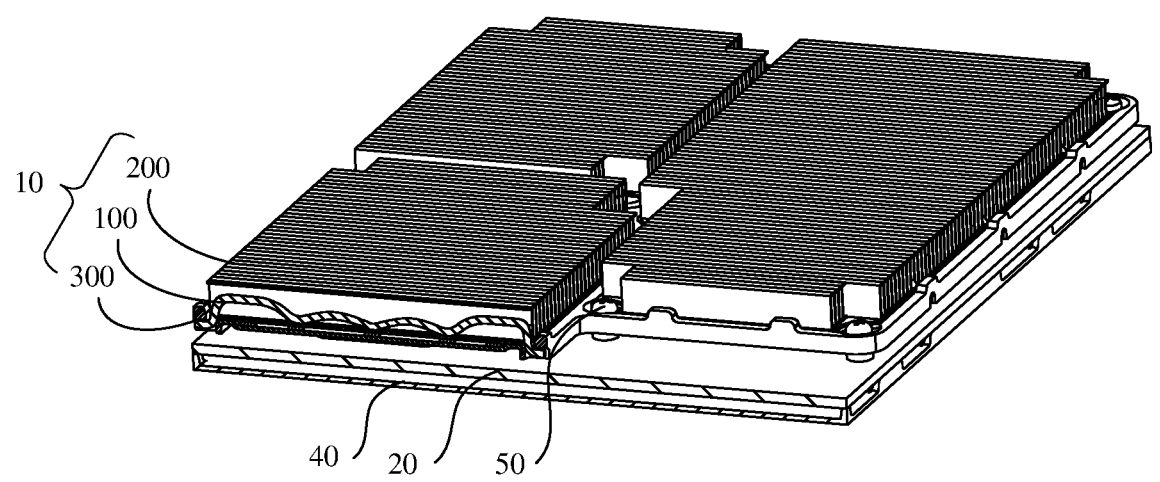
FIG. 3 is a three-dimensional sectional view of a circuit module from a location of an elastic component 100 according to this disclosure.
Figure 4:
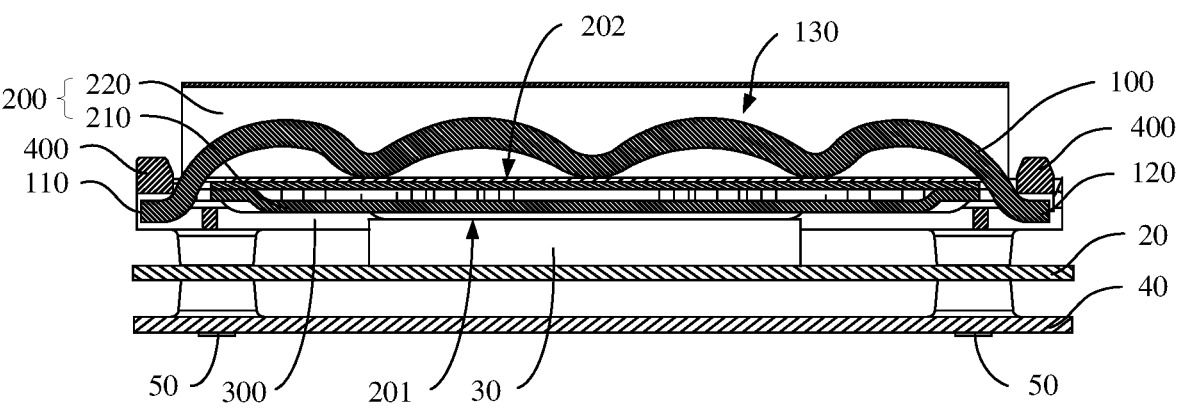
FIG. 4 is a working principle diagram of a heat dissipation apparatus 10 according to this disclosure.

FIG. 2 is an exploded view of a circuit module 1 according to this disclosure. As shown in FIG. 2, a circuit board 20 has three heat sources 30 that are close to each other, and all the three heat sources 30 need to dissipate heat by using a heat sink 200. A heat dissipation apparatus 10 is configured to dissipate heat for the three heat sources 30 on the circuit board 20. FIG. 3 is a three-dimensional sectional view of a circuit module 1 from a location of an elastic component 100 according to this disclosure. FIG. 4 is a working principle diagram of a circuit module 1 according to this disclosure. A force-applying portion of an elastic component 100 is a wave trough in a wave 130. The following describes a structure and a working principle of the heat dissipation apparatus 10 in this disclosure with reference to FIG. 2 to FIG. 4.

Specifically, with reference to FIG. 2 to FIG. 4, it can be seen that the heat dissipation apparatus 10 includes at least one elastic component 100, a heat sink 200, and a support 300. A quantity of elastic components 100 in a heat dissipation apparatus 10 may be one, two, three, or the like. The following uses an elastic component 100 as an example to describe in detail a structural feature of the elastic component 100, and a disposing position and a connection manner of the elastic component 100 relative to the heat sink 200 and the support 300.

The elastic component 100 is a strip (strip-shaped) elastic structure having several peak-valley structures. The elastic component 100 includes a first end 110 and a second end 120 that are configured to implement a mounting function, and a peak-valley structure that is between the first end 110 and the second end 120 and that is configured to implement a press-fitting function. The peak-valley structure corresponds to a wave 130 having several wave units. It may be understood that a raw material used for forming the elastic component 100 is a strip elastic material. The strip elastic material is made of an elastic material, and the strip elastic material indicates a raw material whose size in one direction (for example, an axial direction of the strip material) is far greater than a size in another direction (for example, a radial direction of the strip material). For example, the strip elastic material is an elastic wire or an elastic strip.

The heat sink 200 includes a mounting surface (not marked) and a first heat conducting surface (not marked), and the mounting surface is opposite to the first heat conducting surface. Each elastic component 100 is disposed on the mounting surface of the heat sink 200. The mounting surface is a surface that is on the heat sink 200 and that is configured to dispose the elastic component 100, and the mounting surface may be one of existing surfaces on the heat sink 200. For example, when the heat sink 200 is an air-cooled heat sink, the first heat conducting surface is a bottom surface of the heat sink 200, and the mounting surface is a lower surface of the air duct 222 in the heat sink 200. The lower surface of the air duct 222 may be a heat dissipation surface of a substrate 210, and the lower surface of the air duct 222 may also be a surface parallel to a heat dissipation surface of a heat dissipation structure 220.

That the mounting surface is opposite to the first heat conducting surface indicates that when an external load is applied to the mounting surface of the heat sink 200, the heat sink 200 enables the first heat conducting surface of the heat sink 200 to abut against another structural surface under an action of the external load. The elastic component 100 is disposed on a side of the heat sink 200 on which the mounting surface is formed. The heat source 30 is mounted to the circuit board 20, the heat source 30 is provided with a second heat conducting surface 31, and the second heat conducting surface 31 is adapted to the first heat conducting surface. In this implementation, the second heat conducting surface 31 and the first heat conducting surface are planes.

In another alternative implementation, when the heat sink 200 is a liquid-cooled plate heat sink, the mounting surface of the heat sink 200 is a side surface that is opposite to the first heat conducting surface. For example, in the liquid-cooled plate heat sink, if the first heat conducting surface is a lower surface of the liquid-cooled plate heat sink, the mounting surface is an upper surface of the liquid-cooled plate heat sink.

The support 300 is configured to connect the elastic component 100 to the borne heat sink 200, and is also configured to connect to the circuit board 20. Mounting ends 400 are disposed on the support 300, and the mounting ends 400 are distributed on both sides of the heat sink 200 in pairs. The first end 110 and the second end 120 of the elastic component 100 are respectively connected to a pair of mounting ends 400 on the support 300.

When the support 300 is mounted to the circuit board 20 by using a fastening screw 50, the support 300 is disposed around the heat source 30 and the heat sink 200, to align the first heat conducting surface of the heat sink 200 with the second heat conducting surface 31 of the heat source 30. The elastic component 100 uses elastic force generated by deformation of the wave 130, so that the wave trough of the elastic component 100 abuts against the mounting surface of the heat sink 200, and the heat sink 200 is elastically bound and mounted to the circuit board 20, so that the first heat conducting surface of the heat sink 200 tightly and elastically abuts against the second heat conducting surface 31 of the heat source 30. In other words, on the one hand, the support 300 can limit opposite positions of the heat sink 200 and the heat source 30 by bearing the heat sink 200. On the other hand, when the support 300 in the heat dissipation apparatus 10 is mounted to the circuit board 20, the mounting ends 400 on the support 300 cooperates with the elastic component 100 to drive wave deformation of the elastic component 100, and the elastic component 100 applies pressure to the heat sink 200 to attach the heat sink 200 to the heat source 30 on the circuit board 20.

In this implementation, before the heat dissipation apparatus 10 is mounted to the circuit board 20, the elastic component 100 is in a pre-wrapped state, and the elastic component 100 applies pretightening force to the heat sink 200, to elastically bound the heat sink 200 to the support 300, so as to avoid a collision between the heat sink 200 and the support 300 during transportation of the heat dissipation apparatus 10, thereby reducing a probability that the heat dissipation apparatus 10 is abnormal due to transportation, and improving a yield rate of the heat dissipation apparatus 10.

Specifically, before the heat dissipation apparatus 10 is mounted to the circuit board 20, the first end 110 and the second end 120 of the elastic component 100 are relatively fastened to the mounting ends 400 on the support 300. For example, the first end 110 and the second end 120 are fastened to the mounting ends 400, and for another example, the first end 110 and the second end 120 are clamped to the mounting ends 400. The wave 130 of the elastic component 100 15 elastically abuts against the mounting surface of the heat sink 200, and the heat sink 200 is elastically bound to the support 300.

In another alternative implementation, before the heat dissipation apparatus is mounted to the circuit board, the elastic component 100 may not apply the pretightening force to the heat sink 200, and a connection manner between the elastic component 100 and the support 300 is not specifically limited. In a natural disposing state, the heat sink 200 is disposed on a bearing surface of the support 300, the elastic component 100 is disposed on a mounting surface of the heat sink 200, and the elastic component 100 is connected to the support 300 by bypassing a boundary of the heat sink 200.

In this implementation, the support 300 can be detachably connected to the circuit board 20, for example, the support 300 is connected to the circuit board 20 by using a thread. In another alternative implementation, the support 300 can be undetachably connected to the circuit board 20, for example, the support 300 is attached or welded to the circuit board 20.

In this implementation, two ends of the elastic component 100 are detachably mounted to the two mounting ends 400 on the support 300 through deformation of the wave 130. The elastic component 100 compresses the wave 130 in a length direction of the elastic component 100 by using an external payload, that is, a distance between the first end 110 and the second end 120 is shortened, so that the elastic component 100 is mounted in two mounting ends 400. The external load may be applied to the first end 110 and/or the second end 120 of the elastic component 100 by using a tooling jig.

In this implementation, as shown in FIG. 4, the wave 130 in the elastic component 100 includes several wave units. A shape of the wave unit is a sine wave or a quasi-sine wave. The elastic component 100 elastically binds the heat sink 200 to the circuit board 20 by using a wave trough or a wave peak of the wave 130. The wave trough is a lowest point in the wave unit, and the wave peak is a highest point in the wave unit. In this implementation, the elastic component 100 uses the wave trough or the wave peak in the wave 130 as a force-applying portion, so that the heat sink 200 is elastically bound to the circuit board 20 by using elastic force at the wave trough or the wave peak when the wave is deformed.

In this implementation, the heat source 30 on the circuit board 20 is an electronic component mounted to the circuit board 20. For example, the electronic component is a chip with high heat consumption on the circuit board.

Figure 5:
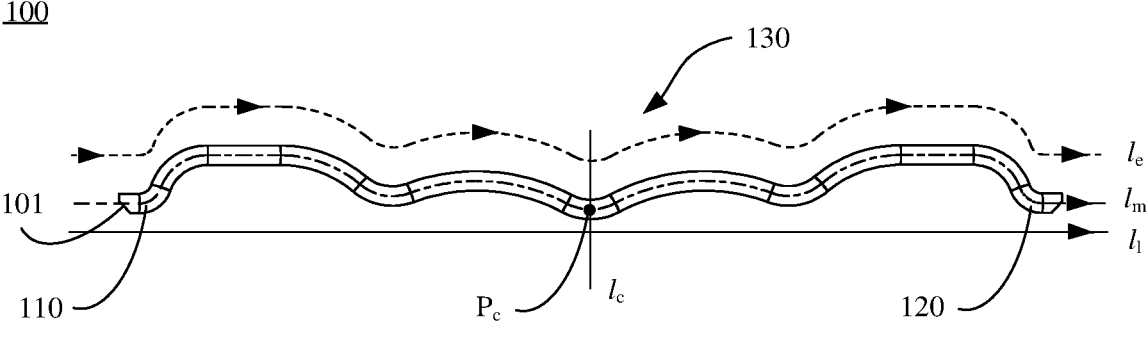
FIG. 5 is a main view of an elastic component 100 according to this disclosure.

FIG. 5 is a main view of an elastic component 100 according to Embodiment 1 of this disclosure. For ease of subsequent description, each size and direction of the elastic component 100 are defined as follows with reference to FIG. 5.

A length direction of a strip elastic material is a direction in which one end of the strip elastic material extends to the other end of the strip elastic material, for example, $l_m$ in FIG. 5. A length of the strip elastic material is a length of an extended track from one end of the strip elastic material to the other end of the strip elastic material.

A cross section of a strip elastic material is a cross section of the strip elastic material that is perpendicular to a length direction of the strip elastic material before the strip elastic material is bent into the wave 130. In this implementation, the cross section of the strip elastic material may be any one of a circle, an ellipse, or a rectangle. In addition, the cross section of the strip elastic material may also be of another shape customized according to a requirement.

An extension direction of an elastic component 100 is a length direction of a strip elastic material after the strip elastic material is bent into a wave 130, for example, $l_e$ in FIG. 5.

The length direction of the elastic component 100 is a direction from a first end 110 of the elastic component 100 to a second end 120 of the elastic component 100, for example, $l_l$ in FIG. 5. A length of the elastic component 100 is a size of the elastic component 100 in the length direction of the elastic component 100, for example, a size of the elastic component 100 in a left-right direction in FIG. 5.

In addition, a height of the elastic component 100 is a size of the elastic component 100 in a wave bending direction, for example, a size of the elastic component 100 in an up-down direction in FIG. 5. A thickness of the elastic component 100 is a size of the elastic component 100 perpendicular to an extension plane of the elastic component 100, for example, a size of the elastic component 100 in a direction perpendicular to paper in FIG. 5.

A midpoint of an elastic component 100 is a center of the strip elastic material in size and in a length direction, for example, $P_C$ in FIG. 5.

A center line of an elastic component 100 is a straight line that passes through a midpoint $P_C$ of the elastic component 100 and is perpendicular to a length direction $l_l$ of the elastic component 100, for example, $l_c$ in FIG. 5.

For the heat dissipation apparatus 10, first, a mounting portion of the elastic component 100 is two ends of the elastic component 100, and a force-applying portion of the elastic component 100 on the heat sink 200 and the heat source 30 is a wave 130 between the two ends of the elastic component 100. Therefore, press-fitting positions of the elastic component 100 on the heat sink 200 and the heat source 30 can be adjusted only by adjusting the wave 130 of the elastic component 100. Because a position of the mounting portion does not need to be adjusted in a commissioning process, difficulty in a process of developing an assembly solution of the heat sink 200 and the heat source 30 is reduced, and attachment effect between attached surfaces of the heat sink 200 and the heat source 30 is optimized, to improve heat dissipation effect of the heat sink 200 on the heat source 30.

Second, one elastic component 100 may include a plurality of wave units. Because each wave unit can implement press-fitting of the heat sink 200 and the heat source 30 at at least one position, one elastic component 100 can implement press-fitting of the heat sink 200 and the heat source 30 at a plurality of positions, thereby reducing a quantity of connecting components in the heat dissipation apparatus 10. For example, as shown in FIG. 1(a), a total of 12 connecting components including four position-limiting pins 110', four column spring 120', and four position-limiting pieces 130' are required for mounting one heat sink 200. As shown in FIG. 1(b), a total of 12 connecting components including four position-limiting screws 110a', four column spring 120', and four fastening screws 50 are required for mounting one heat sink 200. However, in this disclosure, as shown in FIG. 2, only a total of five or six connecting pieces including two elastic components 100 and three or four fastening screws 50 are required for mounting one heat sink 200. Therefore, this disclosure can further improve assembly efficiency of the heat dissipation apparatus, and reduce production costs. In addition, press-fitting force provided by deformation of a wave 130 of the elastic component 100 meets a requirement for direct and effective attachment between the heat sink 200 and the heat source 30 of different thicknesses, and expands an disclosure scope of the heat dissipation apparatus 10. In conclusion, compared with the column spring 120' in the conventional technology, the elastic component 100 has a more compact structure, occupies less space, expands an disclosure scope, and improves a heat dissipation capability of the heat dissipation apparatus 10.

In addition, in this disclosure, because a size of the elastic component 100 is small, occupation of the air duct 222 by the elastic component 100 is reduced. Because the elastic component 100 may be mounted by using the mounting end 400 on the support 300, there is no need to dispose a mounting hole on the substrate 210 and the heat dissipation structure 220 of the heat sink 200, so that a heat dissipation area of the heat sink 200 can be increased. In conclusion, in this disclosure, the elastic component 100 improves heat dissipation effect of the heat dissipation apparatus 10 by reducing an occupied air duct 222 and increasing a heat dissipation area.

In addition, mounting stress at the two ends of the elastic component 100 in the heat dissipation apparatus 10 are applied to the support 300 instead of directly applied to the circuit board 20. Therefore, the circuit board 20 is effectively prevented from deforming and the first heat conducting surface of the heat sink 200 is prevented from being poorly attached to the second heat conducting surface 31 of the heat source 30 caused by deformation of the circuit board 20.

Finally, when a plurality of heat sources 30 are disposed on the circuit board 20, a plurality of heat sinks 200 adapted to the plurality of heat sources 30 may be mounted to one support 300, to reduce a mounting area for mounting the heat dissipation apparatus 10 on the circuit board 20, and optimize a layout of functional elements on the circuit board 20.

In a liquid-cooled heat dissipation scenario, the heat sink 200 is a liquid-cooled plate heat sink. The liquid-cooled plate heat sink includes a mounting surface and a first heat conducting surface. The elastic component 100 is disposed on one side of the mounting surface of the liquid-cooled plate heat sink. The first heat conducting surface is a surface that is of the liquid-cooled plate heat sink and that is configured to be attached to the heat source, and the mounting surface is a surface of the heat sink 200 away from the first heat conducting surface. For example, the mounting surface is an upper surface of the liquid-cooled plate heat sink, and the first heat conducting surface is a lower surface of the liquid-cooled plate heat sink.

In an air-cooled heat dissipation scenario, the heat sink 200 is an air-cooled heat sink. To clearly describe how the elastic component 100 in the heat dissipation apparatus 10 cooperates with the support 300 to elastically attach the heat sink 200 to the circuit board 20, a specific structure of the heat sink 200 needs to be described in detail first. FIG. 6(*a*) is a three-dimensional diagram of a heat sink 200 from an angle of view according to this disclosure. FIG. 6(*b*) is a three-dimensional sectional view of a heat sink 200 from another angle of view according to this disclosure. The following describes a specific structure of the heat sink 200 in a heat dissipation apparatus 10 in detail with reference to FIG. 6(*a*) and FIG. 6(*b*).

As shown in FIG. 6(*a*), the heat sink 200 includes a substrate 210 and a heat dissipation structure 220. The substrate 210 and the heat dissipation structure 220 may be integrated by using a welding, mechanical processing, cutting, stamping, or forging process. The substrate 210 has a first heat conducting surface 201 and a heat dissipation surface (not shown in the figure). The first heat conducting surface 201 is configured to absorb heat from a heat conducting surface 31 of a heat source 30. The heat dissipation surface is configured to dissipate the heat absorbed by the heat sink 200 by using the first heat conducting surface 201 to the heat dissipation structure 220. The heat dissipation structure 220 is disposed on the heat dissipation surface of the substrate 210, and the heat dissipation structure 220 includes fins 221 arranged in parallel. A form of the fin 221 is related to a type of the heat source 30. An air duct 222 is formed between adjacent fins 221. A mounting surface of the heat sink 200 is a lower surface (for example, 202 in FIG. 6(*b*)) of the air duct 222.

Specifically, a height of an elastic component 100 is less than a height of the air duct 222, a thickness of the elastic component 100 is less than a width of the air duct 222, and a length of the elastic component 100 is greater than a length of the air duct 222. An elastic component 100 penetrates one of air ducts 222 based on a length direction $l_l$ of the elastic component 100. In other words, the length direction $l_l$ of the elastic component 100 is approximately the same as an extension direction of the air duct 222, a first end 110 and a second end 120 of the elastic component 100 respectively protrude from an air exhaust vent and an air intake vent of the air duct 222, and a wave 130 of the elastic component 100 can abut against a lower surface of the air duct 222. An extension direction of the air duct 222 is an extension direction of the fin 221. The elastic component 100 abuts against the lower surface of the air duct 222, and elastically presses the heat sink 200 onto the heat source 30 by using elastic force generated by deformation of a wave 130, so that the first heat conducting surface 201 of the substrate 210 elastically abuts against a second heat conducting surface 31 of the heat source 30.

To improve heat dissipation efficiency of the heat sink 200, in this implementation, positions of the first heat conducting surface 201 and the heat dissipation surface are opposite and normal directions are opposite (the opposite normal directions indicate that a positive normal direction of the first heat conducting surface 201 is opposite to a positive normal direction of the heat dissipation surface, that is, the first heat conducting surface 201 and the heat dissipation surface face opposite directions), and distances from any point on the first heat conducting surface 201 to the heat dissipation surface are kept basically equal as far as possible, so as to implement consistency of heat conduction of the heat sink 200, thereby implementing even heat dissipation of all points on the second heat conducting surface 31 of the heat source 30. That distances from any point on the first heat conducting surface 201 to the heat dissipation surface are kept basically equal indicates that a shortest distance from any point on the first heat conducting surface 201 to the heat dissipation surface fluctuates within a predetermined range.

To optimize a flow status of air in the air duct 222, so as to improve heat dissipation effect of the heat sink 200, in this implementation, as shown in FIG. 6(*b*), an air direction $d_w$ in the air duct 222 is parallel to an extension direction $d_c$ of the air duct 222. The air direction $d_w$ in the air duct 222 indicates a flow direction of the air in the air duct 222. For example, the air direction $d_w$ in FIG. 6(*b*) may be from a lower left end of an air duct 222 to an upper right end of the air duct 222. In another alternative implementation, when an air duct cross section of the air-cooled heat sink is a U-shaped interface, the air direction $d_w$ in the air duct 222 is also parallel to the extension direction $d_c$ of the air duct 222, and the extension direction $d_c$ of the air duct 222 is parallel to the extension direction of the fin 221.

Because the elastic component 100 penetrates the air duct 222 of the heat sink 200, to reduce the air duct 222 occupied by the elastic component 100 and improve the heat dissipation effect of the heat sink 200, in this implementation, the length direction of the elastic component 100, the air direction $d_w$ in the air duct 222, and the extension direction $d_c$ of the air duct 222 are parallel. The air duct 222 occupied by the elastic component 100 indicates a projection of a part of the elastic component 100 that penetrates the air duct 222 on a plane perpendicular to the direction of the air duct. When the elastic component 100 is high and thick, the air duct occupied by the elastic component 100 is large. Otherwise, the air duct 222 occupied by the elastic component 100 is small.

To further reduce the air duct 222 occupied by the elastic component 100, when the extension direction $d_c$ of the air duct 222 in the heat sink 200 is a straight line direction, that is, when the fin 221 and the air duct 222 extend along a straight line, a fluctuation shape of the peak-valley structure of the elastic component 100 is on a same plane, that is, a bending track of the elastic component 100 is on the same plane. The fluctuation shape indicates a track that a wave corresponding to the peak-valley structure fluctuating and extending from one end to the other end.

It may be understood that, for the heat sink 200 in which the fin 221 and the air duct 222 extend along the straight line, a cross section of the heat dissipation structure 220 of the heat sink 200 may be a square cross section or a U-shaped cross section. Specifically, when the cross section of the heat dissipation structure 220 is of a square shape, the first end 110 of the elastic component 100 penetrates into one end (an air intake vent or an air exhaust vent) of the air duct 222, and penetrates out of the other end (an air exhaust vent or an air intake vent) of the air duct 222. When the cross section of the heat dissipation structure 220 is a U-shaped cross section, the first end 110 of the elastic component 100 penetrates into one end (an air intake vent or an air exhaust vent) of the air duct 222, and penetrates out of the other end (an air exhaust vent or an air intake vent) of the air duct 222; or the wave 130 of the elastic component 100 is clamped into the air duct 222 through an upper opening of the air duct 222.

For the elastic component 100 in the heat dissipation apparatus 10, because a fluctuation shape of the peak-valley structure of the elastic component 100 is on a same plane, a thickness size of the elastic component 100 is minimized, so that precision of a structure of the elastic component 100 whose fluctuation shape of the peak-valley structure is on the same plane is higher than that of a column spring 120' of a spiral structure, thereby reducing forming difficulty. In addition, mounting precision of the elastic component 100 whose fluctuation shape of the peak-valley structure is on the same plane is higher than that of the column spring 120' of the spiral structure, thereby reducing mounting difficulty. In addition, the fluctuation shape of the peak-valley structure is appropriately arranged, and the elastic component 100 on the same plane is distributed in the extension direction $d_c$ of the air duct 222, so that the occupied air duct 222 can be reduced, an air flow in the air duct 222 can be improved, and heat dissipation efficiency of the heat sink 200 can be improved.

To improve stability of press-fitting of the elastic component 100 on the heat sink 200, and further improve the heat dissipation effect of the heat sink 200 on the heat source 30, in this implementation, the length direction of the elastic component 100 is parallel to the extension direction $d_c$ of the air duct 222, and a thickness direction of the elastic component 100 is parallel to a width direction of the air duct 222, so that a structure of the elastic component 100 is symmetrically distributed in the thickness direction.

In another alternative implementation, when the fluctuation shape of the peak-valley structure of the elastic component 100 is not on a same plane, for example, in some disclosure scenarios, the extension direction $d_c$ of the air duct 222 in the heat sink 200 is in a wave form, that is, the fin 221 and the air duct 222 extend along a wave line, a surface on which the fluctuation shape of the peak-valley structure of the elastic component 100 are located is a curved surface of the wave form, and the length direction of the elastic component 100, the extension direction $d_c$ of the air duct 222, and the air direction $d_w$ of the air duct 222 are in a same direction, to minimize the air duct 222 occupied by the elastic component 100.

It may be understood that, for the heat sink 200 in which the fin 221 and the air duct 222 extend along the wave line, a cross section of the heat dissipation structure 220 of the heat sink 200 is of a U shape. The wave 130 of the elastic component 100 is clamped into the air duct 222 through the upper opening of the air duct 222. The wave 130 of the elastic component 100 can abut against the lower surface of the air duct 222. The first end 110 of the elastic component 100 penetrates out of one end (an air intake vent or an air exhaust vent) of the air duct 222, and the second end 120 of the elastic component 100 penetrates out of the other end (an air exhaust vent or an air intake vent) of the air duct 222.

Figure 6A:
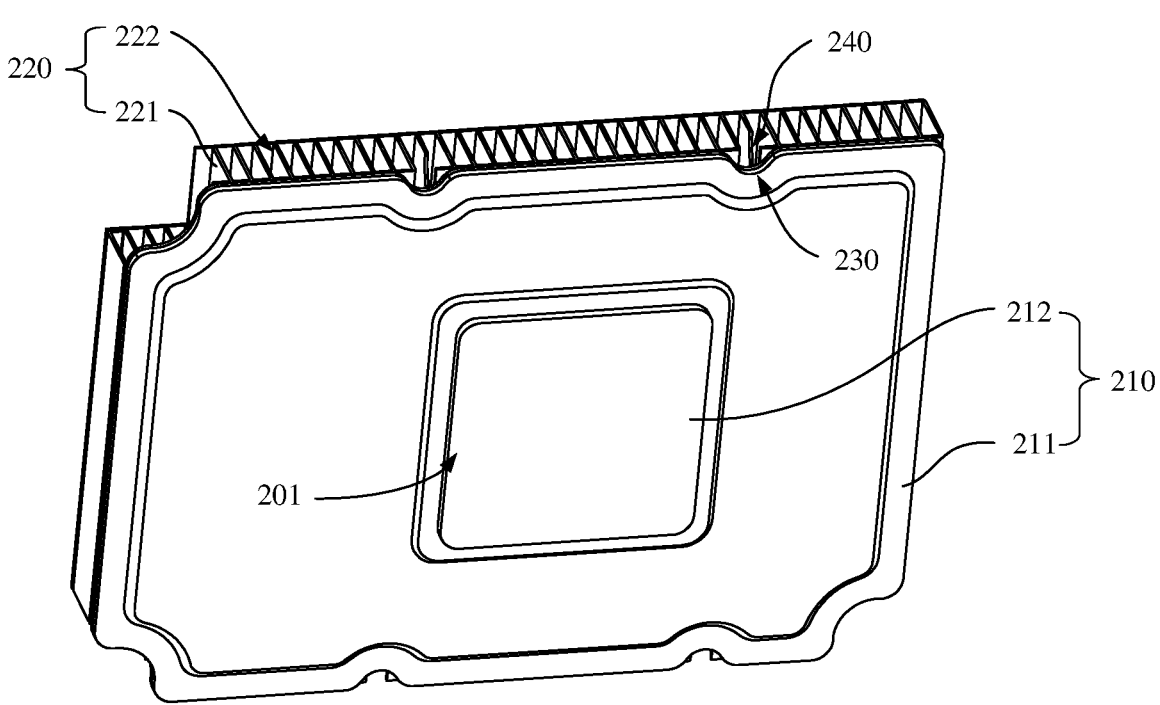
FIG. 6(a) is a three-dimensional diagram of a heat sink 200 from an angle of view according to this disclosure.

As shown in FIG. 6(a), in this implementation, the substrate 210 includes a body 211 and a heat conducting protrusion 212. A heat dissipation surface is formed on the body 211, and the heat conducting protrusion 212 protrudes from a side surface of the body 211 opposite to the heat dissipation surface in a direction away from the body 211. A side surface of the heat conducting protrusion 212 away from the body 211 is the first heat conducting surface 201. In other words, the heat dissipation surface forms a side of the body 211 away from the heat conducting protrusion 212, and the first heat conducting surface 201 is formed on a side of the heat conducting protrusion 212 away from the body 211. Further, the first heat conducting surface 201 is coated with a heat conducting layer, to improve heat conducting efficiency of the first heat conducting surface 201.

To reduce costs, the first heat conducting surface 201 of the substrate 210 has a same size as the second heat conducting surface 31 of the heat source 30, and when the support 300 is mounted to the circuit board 20, the first heat conducting surface 201 coincide with the second heat conducting surface 31.

Figure 6B:
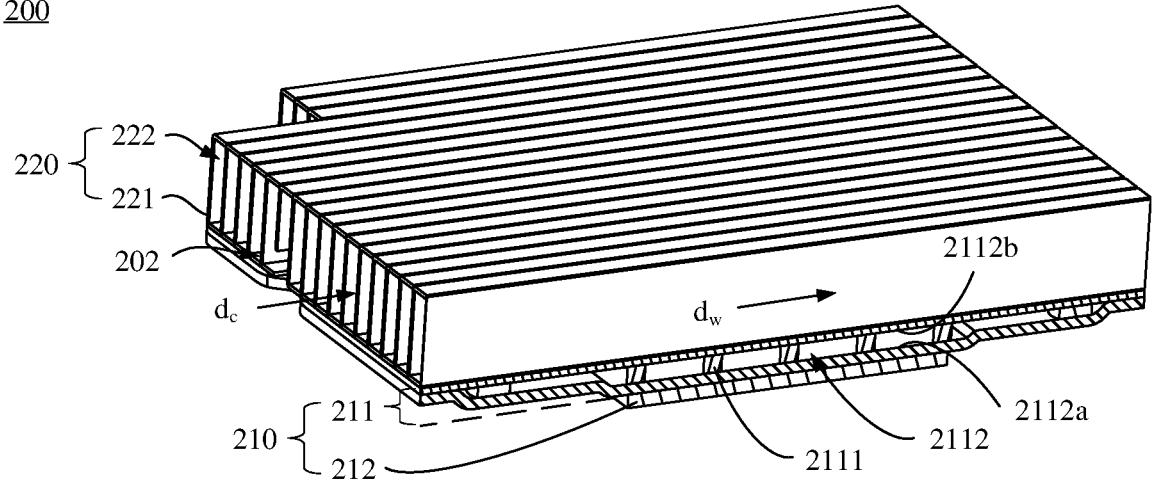
FIG. 6(b) is a three-dimensional sectional view of a heat sink 200 from another angle of view according to this disclosure.

To improve heat conduction effect of the substrate 210, in this implementation, as shown in FIG. 6(b), the body 211 is a vacuum cavity vapor chamber structure. Specifically, a vacuum evaporation cavity 2112 is formed in the body 211. The vacuum evaporation cavity 2112 includes an evaporation surface 2112a close to a side of the heat conducting protrusion 212 and a condensation surface 2112b close to the heat dissipation structure 220. A support column 2111 and a capillary structure (not shown in the figure) attached around the support column 2111 are disposed between the evaporation surface 2112a and the condensation surface 2112b. A heat conducting solution is further accommodated in the vacuum evaporation cavity 2112. For example, the heat conducting solution is a heat conducting working medium or water. After the first heat conducting surface 201 of the heat conducting protrusion 212 absorbs heat from the second heat conducting surface 31 of the heat source 30, the heat conducting solution around the evaporation surface 2112a absorbs heat, evaporates into a gas state, and spreads in the entire vacuum evaporation cavity 2112. When the gaseous material moves to a place near the condensation surface 2112b, the condensation surface 2112b absorbs heat of the gaseous material, and conducts the heat to the heat dissipation structure 220 by using the heat dissipation surface. At the same time, the temperature of the gaseous substance decreases, and the gaseous substance condenses into a liquid state at the condensation surface 2112b, and then returns to a place near the evaporation surface 2112a through the capillary structure. In this way, the heat is rapidly diffused from the small-area first heat conducting surface 201 to the large-area heat dissipation surface. In another alternative implementation, the body 211 may alternatively be a physical structure.

Figure 7A:
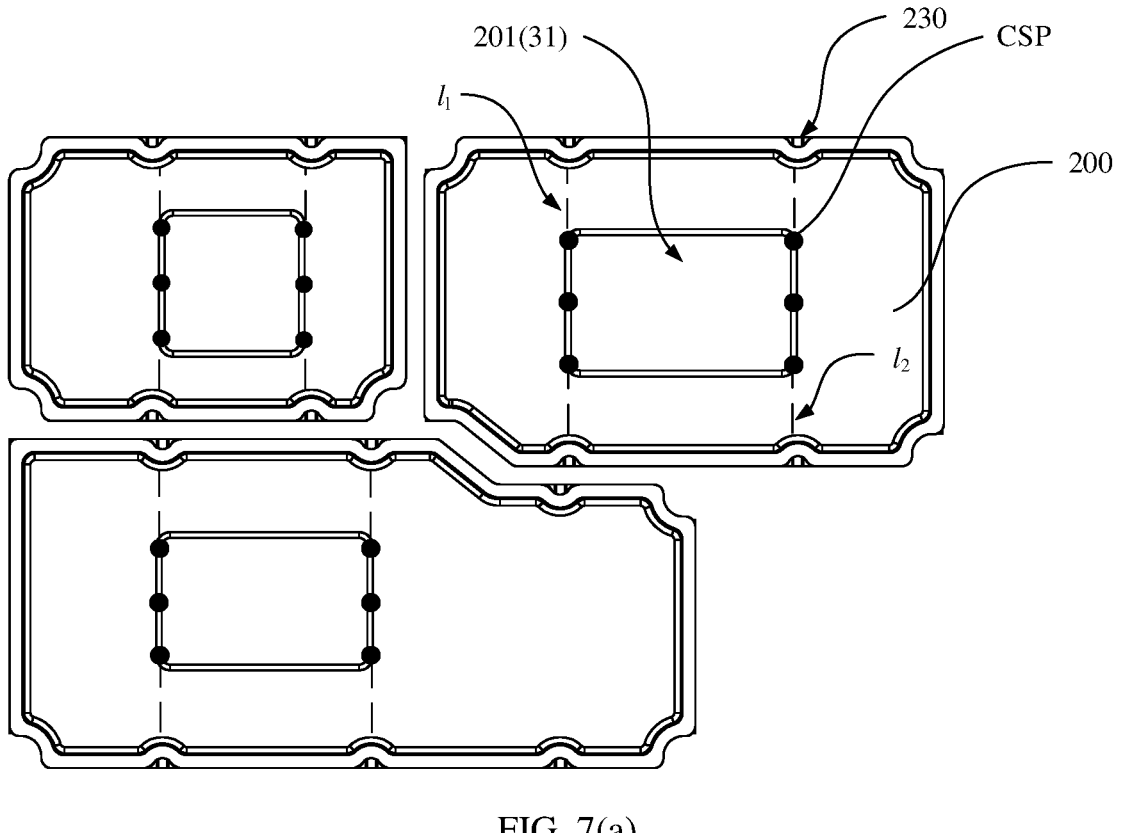
FIG. 7(a) is a schematic diagram of distribution of core stress points (CSPs) of a heat dissipation apparatus 10 according to this disclosure.

After the specific structure of the heat sink 200 is described, the following further defines a location of a core stress point (CSP) of the heat sink 200, to improve attachment effect between the first heat conducting surface 201 of the heat sink 200 and the second heat conducting surface 31 of the heat source 30. In FIG. 7(a), a CSP indicates a location of a core stress point in this disclosure. In FIG. 7(b), a CSP indicates a location of a core stress point in another technical solution. The core stress point CSP indicates a force-bearing area that is on a heat sink 200 and that is configured to receive elastic force of an elastic component 100 when a heat dissipation apparatus 10 is mounted to a circuit board 20, that is, a portion to which the elastic component 100 applies the elastic force on the heat sink 200, and also a portion at which the heat sink 200 is in contact with a peak and a valley of the elastic component 100. For the core stress point CSP of the heat sink 200, the following uses an example in which each heat sink 200 in the heat dissipation apparatus 10 corresponds to two elastic components 100. FIG. 7(*a*) is a schematic diagram of the heat sink 200 according to this disclosure. The figure shows orthographic projections of the elastic component 100, the heat sink 200, and the core stress point CSP on a plane on which a second heat conducting surface 31 is located (an orthographic projection of a component on the plane on which the second heat conducting surface 31 is located is hereinafter referred to as an orthographic projection of the component for short). It can be seen from the above that, when the heat dissipation apparatus 10 is mounted to the circuit board 20, the second heat conducting surface 31 of a heat source 30 coincides with a first heat conducting surface 201 of a heat conducting protrusion 212 of the heat sink 200. Therefore, an orthographic projection of the first heat conducting surface 201 of the heat sink 200 coincides with the second heat conducting surface 31 of the heat source 30.

As shown in FIG. 7(*a*), in this implementation, a heat sink 200 in an upper right corner of the figure is used as an example. An orthographic projection of one elastic component 100 is distributed along $l_1$ in the figure, and an orthographic projection of the other elastic component 100 is distributed along $l_2$ in the figure. Orthographic projections of the two elastic components 100 are distributed on the second heat conducting surface 31 of the heat source 30. The second heat conducting surface 31 includes an interior of the second heat conducting surface 31 and an edge of the second heat conducting surface 31. That is, the two elastic components 100 are distributed right above the heat conducting surface 31 of the heat source 30. For example, orthographic projections of contact regions between peak-valley structures of the two elastic components 100 and the mounting surface of the heat sink 200 are distributed on the second heat conducting surface 31 of the heat source 30. In other words, the contact regions between the peak-valley structures of the two elastic components 100 and the mounting surface of the heat sink 200 are located in an orthographic projection region of the second heat conducting surface 31 of the heat source 30.

Further, orthographic projections of the two elastic components 100 are distributed at the edge of the heat conducting surface 31 of the heat source 30. That is, the elastic components 100 are distributed right above the edge of the heat conducting surface 31 of the heat source 30. For example, orthographic projections of the contact regions between the peak-valley structures of the two elastic components 100 and the mounting surface of the heat sink 200 are distributed at edge positions of the second heat conducting surface 31 of the heat source 30. In other words, the contact regions between the two elastic components 100 and the mounting surface of the heat sink 200 are located at edge positions in an orthographic projection region of the second heat conducting surface 31 of the heat source 30 on the mounting surface of the heat sink 200.

In this implementation, an orthographic projection of a core stress point CSP of the heat sink 200 is located on the second heat conducting surface 31 of the heat source 30. The second heat conducting surface 31 includes an interior of the second heat conducting surface 31 and an edge of the second heat conducting surface 31. In other words, the contact regions between the two elastic components 100 and the mounting surface of the heat sink 200 are located at edge positions in an orthographic projection region of the second heat conducting surface 31 of the heat source 30 on the mounting surface of the heat sink 200.

In another alternative implementation, each heat sink 200 in the heat dissipation apparatus 10 corresponds to three or more elastic components 100. Distribution locations of the two elastic components 100 relative to the heat sink 200 and the heat source 30 are the same as those in the foregoing embodiment. Other elastic components 100 are distributed between the two elastic components 100, and orthographic projections of contact regions between the other elastic components 100 and the mounting surface of the heat sink 200 are distributed in the second heat conducting surface 31 of the heat source 30. That is, the other elastic components 100 are distributed in an intermediate position right above the heat source 30.

In another alternative implementation, each heat sink 200 in the heat dissipation apparatus 10 corresponds to three or more elastic components 100. Distribution locations of the two elastic components 100 relative to the heat sink 200 and the heat source 30 are the same as those in the foregoing embodiment. Other elastic components 100 are distributed in a region other than those of the two elastic components 100, and orthographic projections of contact regions between the other elastic components 100 and the mounting surface of the heat sink 200 are distributed outside the second heat conducting surface 31 of the heat source 30. That is, the other elastic components 100 are distributed in a surrounding area right above the heat source 30.

Further, an orthographic projection of the core stress point CSP of the heat sink 200 is located at an edge position of the second heat conducting surface 31 of the heat source 30. The edge position of the second heat conducting surface 31 indicates an area within a range of ±2 mm at an edge of the second heat conducting surface 31.

The following limits, based on a position relationship between the orthographic projection of the core stress point CSP of the heat sink 200 and the second heat conducting surface 31 of the heat source 30, a press-fitting portion for press-fitting the heat sink 200 on the elastic component 100. The press-fitting portion is a portion of the elastic component 100 configured to press against the heat sink 200. When the heat dissipation apparatus 10 is mounted to the circuit board 20, the core stress point CSP of the heat sink 200 is attached to the press-fitting portion of the elastic component 100. The press-fitting portion is a portion that is on the elastic component 100 and that is configured to be elastically attached to the heat sink 200. For example, when the first heat conducting surface 201 of the heat sink 200 elastically abuts against the second heat conducting surface 31 of the heat source 30, if the orthographic projection of the core stress point CSP is located at an edge of the orthographic projection of the first heat conducting surface 201, the orthographic projection of the press-fitting portion of the elastic component 100 is located at an edge of the second heat conducting surface 31 of the heat source 30. For another example, when the first heat conducting surface 201 of the heat sink 200 elastically abuts against the second heat conducting surface 31 of the heat source 30, if the orthographic projection of the core stress point CSP is located in the orthographic projection of the first heat conducting surface 201, the orthographic projection of the press-fitting portion of the elastic component 100 is located in the second heat conducting surface 31 of the heat source 30.

In the foregoing implementation, the core stress point CSP of the heat sink 200 is appropriately arranged. For example, an orthographic projection of the core stress point CSP is disposed on the second heat conducting surface 31 of the heat source 30, so that elastic force applied by the elastic component 100 on the heat sink 200 can be stably transferred to the heat source 30 by using the body 211 and the heat conducting protrusion 212 in the substrate 210. In this way, the first heat conducting surface 201 of the heat sink 200 is closely attached to the second heat conducting surface 31 of the heat source 30. In another technical solution shown in FIG. 7(b), orthographic projections of core stress points CSPs' of the heat sink 200 are distributed around the second heat conducting surface 31 (the first heat conducting surface 201 of the heat sink 200) of the heat source 30. Therefore, elastic structures (for example, column springs 120') in the connecting component elastically press the heat sink 200 around the heat source 30. This easily causes a large elastic force difference between column springs 120', and consequently causes a problem that contact surfaces of the heat sink 200 and the heat source 30 cannot effectively conduct heat.

Compared with other technical solutions, in this implementation, on the one hand, a force-bearing condition of the substrate 210 in the heat sink 200 is optimized, and the orthographic projection of the core stress point CSP is prevented from being distributed at a position far away from the second heat conducting surface 31 (the heat conducting protrusion 212) of the heat source 30, thereby avoiding a stilt-type force-bearing mode in which the body 211 uses an edge of the heat conducting protrusion 212 as a supporting point and uses the core stress point CSP as a force-bearing end. It may be understood that the stilt-type force-bearing mode affects stability of a structure of the substrate 210, and even causes delamination of a heat conducting layer when the heat conducting layer of the first heat conducting surface 201 is thin, thereby affecting heat dissipation effect and service life of the heat sink 200. When the substrate 210 is a vacuum cavity vapor chamber structure, a core stress point CSP distribution mode in this implementation can effectively reduce a rigidity requirement of a conventional floating connection on the vacuum cavity vapor chamber structure, and reduce a thickness of the vacuum cavity vapor chamber structure, thereby reducing an overall thickness of the heat sink 200. On the other hand, the orthographic projection of the core stress point CSP is disposed on the second heat conducting surface 31 of the heat source 30, so that the heat sink 200 directly applies force on the second heat conducting surface 31 of the heat source 30, thereby improving attachment tightness between the heat sink 200 and the heat source 30, and improving heat dissipation effect of the heat sink 200 on the heat source 30.

To further optimize a force condition of the heat sink 200, so as to reduce a rigidity requirement for a vacuum cavity vapor chamber structure, in this implementation, the orthographic projection of the core stress point CSP of the heat sink 200 falls on a projection of a support column 2111 of the heat sink 200. In other words, the core stress point CSP of the heat sink 200 is located right above the support column 2111 of the heat sink 200, that is, the press-fitting portion of the elastic component 100 is located right above the support column 2111.

To ensure stability of the structure of the heat dissipation apparatus 10, in this implementation, the heat dissipation apparatus 10 uses at least two elastic components 100 to elastically bind and mount the heat sink 200 to the circuit board 20, so that when the first heat conducting surface 201 of the heat sink 200 elastically abuts against the second heat conducting surface 31 of the heat source 30, press-fitting portions (core stress points CSPs of the heat sink 200) of two elastic components 100 in the at least two elastic components 100 are located right above a pair of edges of the second heat conducting surface 31 of the heat source 30. In other words, a floating connection between one heat sink 200 and one heat source 30 in the heat dissipation apparatus 10 requires at least two elastic components 100, and regions in which the two elastic components 100 respectively contact the mounting surface of the heat sink 200 are located right above a pair of opposite edges of the second heat conducting surface 31 of the heat source 30. In addition, because a plane can be determined by three points, the core stress points CSPs of the heat sink 200 for the two elastic components 100 includes at least three points that are not on a same straight line, that is, the press-fitting portions of the two elastic components 100 covers three points that are not on a same straight line. For example, one elastic component 100 includes two press-fitting portions that are sequentially distributed in a length direction of the elastic component 100, the other elastic component 100 includes one press-fitting portion, and the three press-fitting portions are not on a same straight line.

FIG. 7(c) is a side view of a heat dissipation apparatus 10 according to this disclosure, where a support 300 is not shown. FIG. 7(d) is a side view of a heat dissipation apparatus 10 according to another technical solution, where a support 300 is not shown. It can be seen by comparing FIG. 7(c) and FIG. 7(d) that compared with another technical solution, in this implementation, a size of an elastic component 100 in a thickness direction is approximate to a diameter of a strip elastic material, so that the size of the elastic component 100 in the thickness direction is small, a thickness range of the elastic component 100 ranges from 1.5 mm to 10 mm. For example, a minimum size of the elastic component 100 in the thickness direction may be 2 mm. In the another technical solution, to meet a position-limiting function of a position-limiting pin 110' and a requirement for elastic force of a column spring 120', outer diameters of the position-limiting pin 110' and the column spring 120' are large. The outer diameter of the position-limiting pin 110' may range from 8 mm to 12 mm, and the outer spiral diameter of the column spring 120' needs to be greater than 8 mm to 12 mm. Therefore, in this implementation, the elastic component 100 is used to implement floating connection between the heat sink 200 and the heat source 30, thereby reducing occupation of the air duct 222, improving an air flow in the air duct 222, reducing overall wind resistance, improving a ventilation volume in the air duct 222, and improving heat dissipation effect of the heat dissipation apparatus 10. This implementation is particularly applicable to a heat dissipation system in which a plurality of independent floating heat sinks 200 coexist, and has more obvious effect of reducing wind resistance. With a same volume, the heat dissipation apparatus 10 in this disclosure can increase a ventilation volume by more than 14%.

Figure 8A:
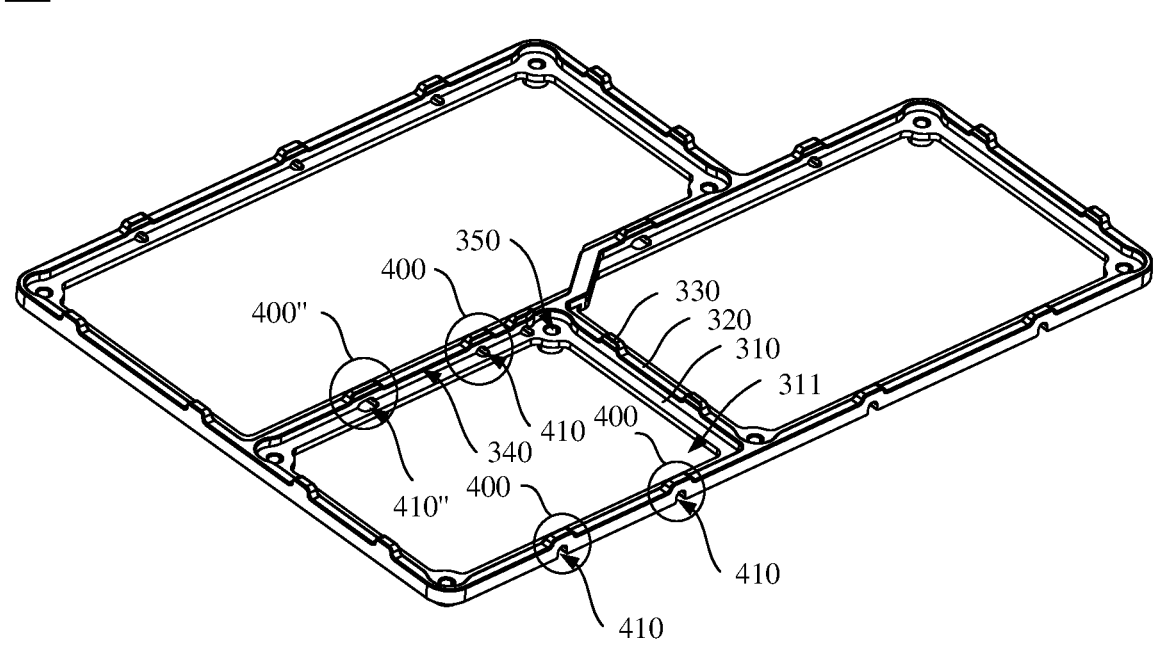
FIG. 8(a) is a three-dimensional diagram of a support 300 according to this disclosure.
Figures 8B, 8C:
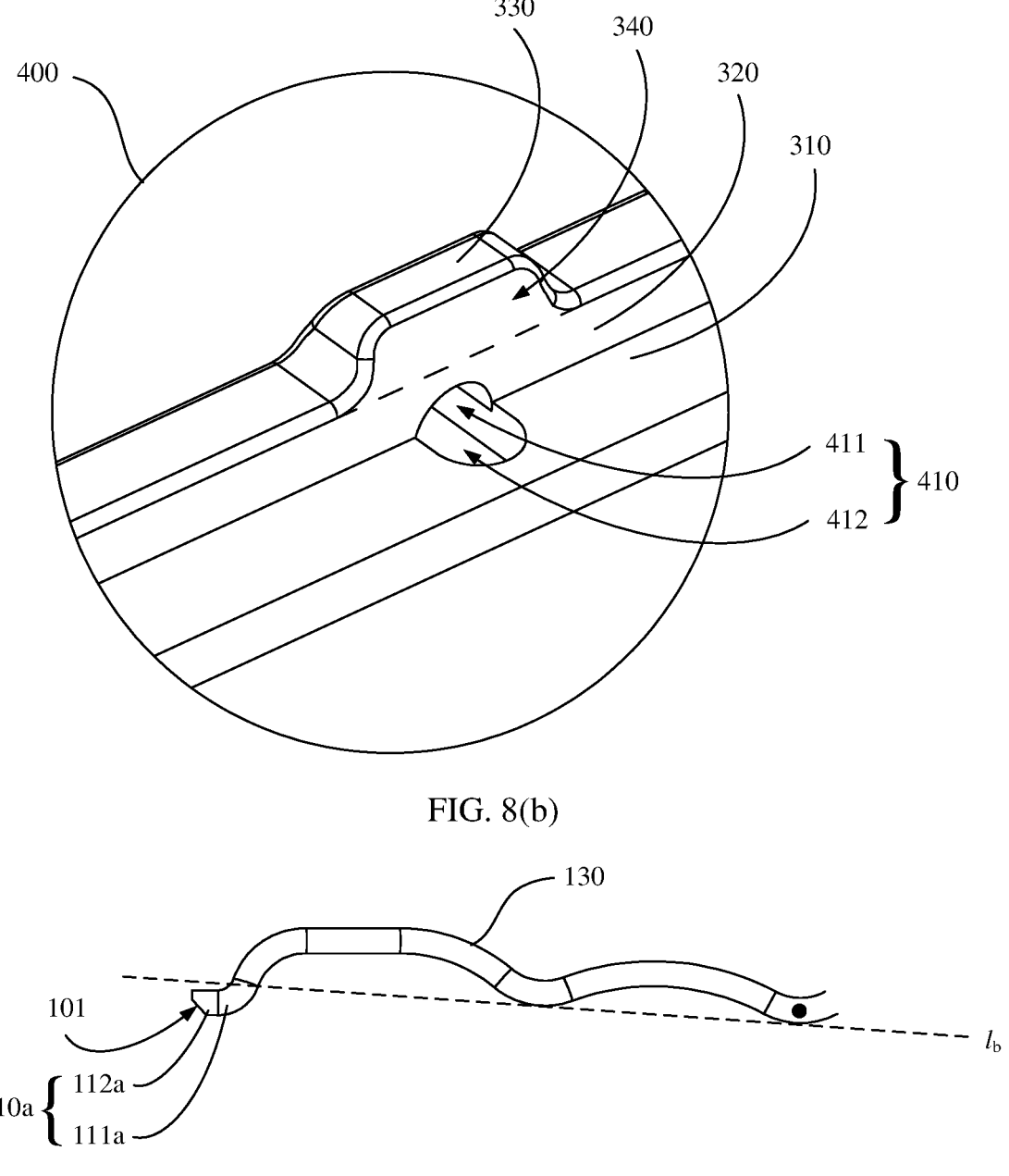
FIG. 8(b) is an enlarged view of a mounting end 400 in FIG. 8(a)
FIG. 8(c) is a partial enlarged diagram of an elastic component 100 according to this disclosure.

After a specific structure of the heat sink 200 is described, because the support 300 is configured to support the heat sink 200 and fasten the elastic component 100, a specific structure of the support 300 needs to be further described. FIG. 8(a) is a three-dimensional diagram of a support 300 according to this disclosure. FIG. 8(b) is an enlarged view of a mounting end 400 in FIG. 8(a). FIG. 10(a) is a schematic diagram of a connection manner between a support 300 and a circuit board 20 according to this disclosure. FIG. 10(b) is a sectional view of a connection manner between a support 300 and a circuit board 20 according to this disclosure. The following describes a specific structure of the support 300 in the heat dissipation apparatus 10 in detail with reference to FIG. 8(a) to FIG. 10(b).

As shown in FIG. 8(*a*), in this implementation, the support 300 includes a bearing portion 310 and a position-limiting portion 320. The bearing portion 310 is a frame structure, and a hollowing portion 311 on the frame structure is passed through by a heat conducting protrusion 212 in a heat sink 200. The position-limiting portion 320 is disposed on a surface of the bearing portion 310, and forms, together with the bearing portion 310, accommodating space for accommodating the heat sink 200. After the heat sink 200 is mounted to the support 300, the position-limiting portion 320 is disposed around an outer edge of a body 211, to align a first heat conducting surface 201 of the heat sink 200 with a second heat conducting surface 31 of the heat source 30. A thickness direction of the heat sink 200 indicates a direction from a substrate 210 to a heat dissipation structure 220. A height of the position-limiting portion 320 should ensure that the heat sink 200 does not detach from the support 300 when it floats upward to a highest position in a normal working state, and that impact of a ventilation volume of the heat sink 200 is minimized.

A mounting end 400 for connecting to an elastic component 100 is configured on the support 300. Specifically, the mounting end 400 is formed on a joint between the bearing portion 310 and the position-limiting portion 320, and mounting ends 400 are separately disposed on two sides of the accommodating space in pairs. A mounting hole 410 configured to clamp an end of the elastic component 100 is disposed at the mounting end 400. Further, to enable one elastic component 100 to be symmetrically distributed relative to a center line of the heat source 30, so as to improve attachment effect between the heat sink 200 and the heat source 30, the mounting ends 400 are symmetrically distributed relative to the center line of the heat source 30.

In this implementation, the mounting hole 410 is a through hole. As shown in FIG. 8(*b*), the mounting hole 410 includes an arc-shaped slot 411 disposed at a bottom of the position-limiting portion 320 and a U-shaped notch 412 disposed on an outer side of the bearing portion 310. An opening of the arc-shaped slot 411 covers an opening of the U-shaped notch 412 downward and communicates with the U-shaped notch 412. A first opening of the mounting hole 410 is located on a side of the joint between the bearing portion 310 and the position-limiting portion 320 facing the accommodating space. The U-shaped notch 412 of the mounting hole 410 is located on a side of the joint between the bearing portion 310 and the position-limiting portion 320 away from the accommodating space.

With reference to FIG. 8(*b*) and FIG. 8(*c*), it can be seen that a first end 110 of the elastic component 100 is a clamping hook 110a adapted to the mounting hole 410. A dashed line/is a boundary between the clamping hook 110a and a wave 130. A part below the boundary/b is referred to as the clamping hook 110a, and a part above the boundary/b is referred to as the wave 130. The clamping hook 110a includes a connection portion 111a and a hooking portion 112a. One end of the connection portion 111a is connected to an end of the wave 130, and the other end of the connection portion 111a extends toward the mounting hole 410 and is connected to the hooking portion 112a. The hooking portion 112a is located in the mounting hole 410 and extends in a length direction of the arc-shaped slot 411. With reference to FIG. 4, it can be seen that the hooking portion 112a can abut against a groove surface of the arc-shaped slot 411, to fasten the elastic component 100 to the mounting end 400.

The mounting hole 410 is configured as the through hole. On one hand, mounting is easy, it is convenient to operate, and a structure of the heat dissipation apparatus 10 is highly stable. On the other hand, an end of the elastic component 100 can be pushed to retract by using an opening facing outward from the mounting hole, and the elastic component 100 detaches from the mounting hole 410, to facilitate maintenance and replacement of components such as the elastic component 100 and the heat sink 200.

The position-limiting portion 320 is disposed around the outer edge of the body 211, and the position-limiting portion 320 cooperates with the bearing portion 310 to limit relative motion of the heat sink 200 and the bearing portion 310 on a plane perpendicular to the thickness direction of the heat sink 200. In other words, when the heat sink 200 is disposed on the support 300, the body 211 of the heat sink 200 is tightly attached to the bearing portion 310 and the position-limiting portion 320, to ensure that two ends of the elastic component 100 can smoothly pass through the body 211, the position-limiting portion 320, and the mounting hole 410 and abut against the mounting end 400, to complete mounting of the heat dissipation apparatus 10. With reference to FIG. 6(*a*), it can be seen that a position-avoiding notch 230 is disposed at an edge of the substrate 210. The two ends of the elastic component 100 first pass through the position-avoiding notch 230, and then pass through the mounting hole 410. When the support 300 is mounted to the circuit board 20, the support 300 abuts against the mounting end 400, to limit relative movement between the two ends of the elastic component 100 and the support 300.

To reduce mounting difficulty of the elastic component 100, in this implementation, a size of the position-avoiding notch 230 is greater than a diameter of an elastic material in the elastic component 100. In some cases, a fin 221 is carried on the body 211 on which the position-avoiding notch 230 is disposed, and the fin 221 divides the position-avoiding notch 230 into two parts, so that the position-avoiding notch 230 cannot be normally used in a region on a side of the fin 221 far away from the elastic component 100. In other words, the fin 221 herein causes the position-avoiding notch 230 to fail to effectively reduce mounting difficulty of the elastic component 100. To avoid affecting normal use of the position-avoiding notch 230 and effectively reduce mounting difficulty of the elastic component 100, with reference to FIG. 6(*a*), it can be learned that in this implementation, an avoidance notch 240 is disposed on the fin 221 located at the position-avoiding notch 230, and the avoidance notch 240 and the position-avoiding notch 230 jointly form mounting space (not shown in the figure) for mounting the two ends of the elastic component 100.

In another implementation, the two ends of the elastic component 100 are directly fastened to the mounting ends 400. For example, the two ends of the elastic component 100 are attached or welded to the mounting ends 400. By fastening the two ends of the elastic component 100 to the support 300, the elastic component 100 mounted to the support 300 can be prevented from moving or rotating, so that stability of the elastic component 100 in a press-fitting state on the heat sink 200 can be maintained, and stability of the heat dissipation apparatus 10 can be improved.

Figure 9A:
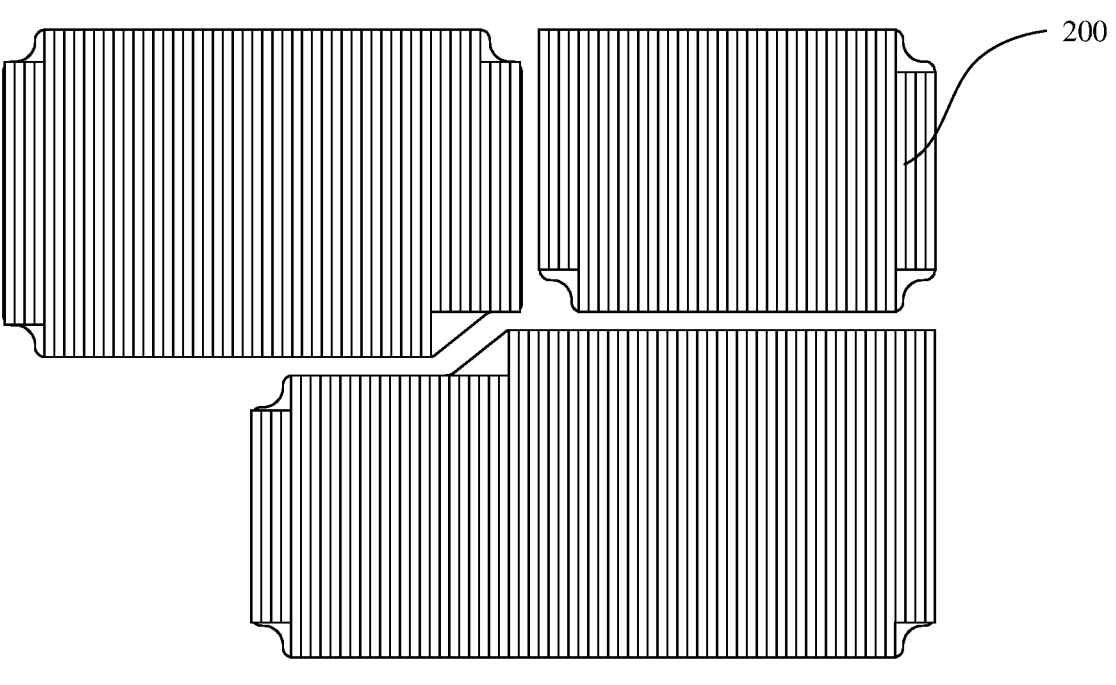
FIG. 9(a) is a top view of a heat sink 200 according to this disclosure.
Figure 9B:
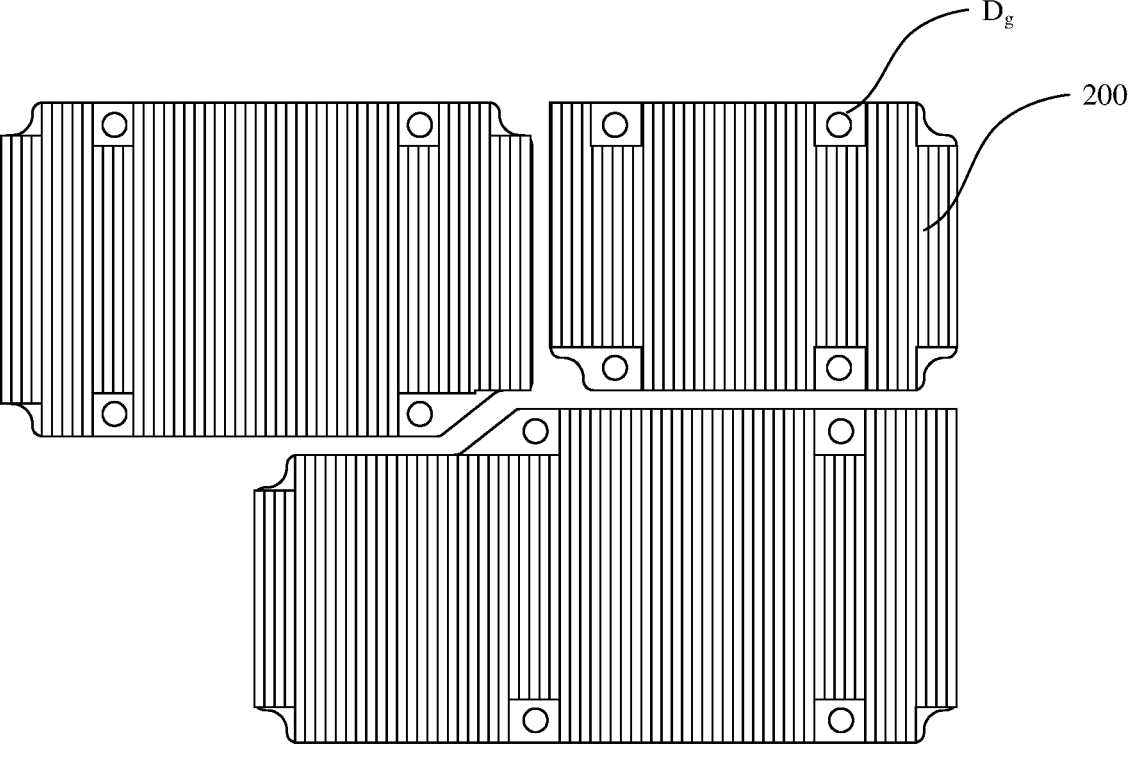
FIG. 9(b) is a top view of a heat sink 200 in the conventional technology.
Figures 10A, 10B:
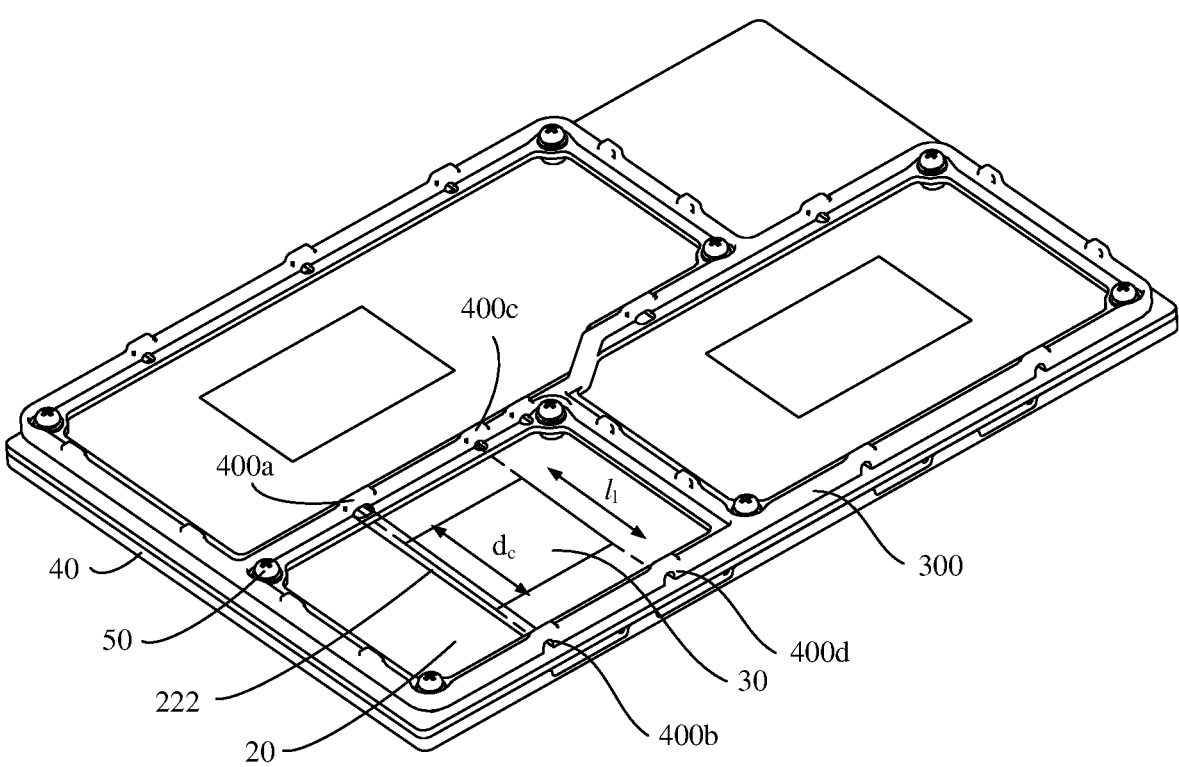
FIG. 10(a) is an assembly diagram of a support 300 and a circuit board 20 according to this disclosure.
FIG. 10(b) is a three-dimensional sectional view of a circuit module 1 including a heat dissipation apparatus 10 from a location of a fastening screw 50 according to this disclosure.

To intuitively present impact on a heat dissipation area of a heat sink 200 in another technical solution, FIG. 9(*a*) is a top view of a heat sink 200 according to this disclosure, and FIG. 9(*b*) is a top view of a heat sink 200 according to another technical solution. In this disclosure, only a position-avoiding notch 230 and an avoidance notch 240 with small sizes are disposed on a heat sink 200. In another technical solution, a notch region $D_g$ configured to accommodate a column spring 120' and a position-limiting pin 110' is disposed. It is not difficult to find, by comparing FIG. 9(*a*) and FIG. 9(*b*), that an effective heat dissipation area of a fin 221 is increased in this disclosure. With a same volume, an area of the fin 221 is increased by more than 5% in this disclosure. In addition, because the position-avoiding notch 230 and the avoidance notch 240 disposed on the heat sink 200 are only configured for the two ends of the elastic component 100 to pass through. A specific position of the elastic component 100 does not need to be limited. A requirement on processing precision of the position-avoiding notch 230 and the avoidance notch 240 is not high. This reduces processing difficulty of the heat sink 200.

As shown in FIG. 8(*a*), in this implementation, the support 300 further includes an elevating portion 330, and the elevating portion 330 protrudes from a surface of the position-limiting portion 320 away from the bearing portion 310 in a direction away from the bearing portion 310. The elevating portion 330 is configured to limit the heat sink 200 from detaching from the support 300. The elevating portion 330 is configured to ensure that the heat sink 200 does not detach in an abnormal case, so as to improve security of the heat dissipation apparatus 10.

As shown in FIG. 8(*a*), in this implementation, the elevating portion 330 is formed in a local area of the position-limiting portion 320. When security performance is improved by using the elevating portion 330, weight of the support 300 is reduced, a lightweight design of the heat dissipation apparatus 10 is implemented, raw material costs are reduced, and economic benefits are improved.

As shown in FIG. 8(*a*), in this implementation, when one support 300 corresponds to two or more heat sinks 200, for a mounting end 400″ located between two heat sinks 200, a mounting hole 410″ in the mounting end 400″ may adapt to two elastic components 100. The two elastic components 100 are configured to respectively fasten two heat sinks 200 on two sides of the mounting end 400″. The support 300 reduces quantities of mounting ends 400 and mounting holes 410, simplifies a processing procedure, and optimizes an overall structure.

As shown in FIG. 8(*b*), in this implementation, the elevating portion 330 protrudes from the position-limiting portion 320 forming the mounting end 400 in a direction away from the mounting end 400. In other words, the elevating portion 330, and the position-limiting portion 320 and the bearing portion 310 that are sequentially connected to the elevating portion 330 jointly form the mounting end 400. In other words, the mounting end 400 is formed between the elevating portion 330 and the position-limiting portion 320 and the bearing portion 310 that are adjacent to the elevating portion 330. The mounting end 400 increases a physical size around the mounting hole 410, improves mechanical strength of the mounting end 400, and optimizes an overall structure of the support 300.

As shown in FIG. 8(*a*), in this implementation, a surface of the position-limiting portion 320 facing the accommo-dating space is configured as a first guiding surface 340. The first guiding surface 340 is configured to guide two ends of the elastic component 100 into directions of the mounting holes 410. The first guiding surface 340 is further configured to guide the heat sink 200 into a direction of the accommo-dating space. Therefore, the first guiding surface 340 can reduce mounting difficulty of the heat dissipation apparatus 10.

In this implementation, it can be seen from FIG. 8(*c*) that a second guiding surface 101 adapted to the first guiding surface 340 of the support 300 is further disposed on the first end 110 and the second end 120 of the elastic component

100. For example, when the first end 110 of the elastic component 100 is mounted to the mounting end 400 of the support 300, the second guiding surface 101 of the first end 110 first abuts against the first guiding surface 340 of the support 300, to drive the first end 110, so that the second guiding surface 101 slides along the first guiding surface 340, until the first end 110 slides into the mounting hole 410 and abuts against the mounting end 400, to complete mount-ing of the first end 110 and the mounting end 400. In another alternative implementation, after the first end 110 slides into the mounting hole 410, the first end 110 is accommodated in the mounting hole 410, and does not abut against the mounting end 400. When the support 300 is mounted to the circuit board 20, the first end 110 abuts against the mounting end 400.

In this implementation, as shown in FIG. 8(*b*), for the position-limiting portion 320 on which the elevating portion 330 is disposed, a surface of the elevating portion 330 facing the accommodating space is configured as a first guiding surface 340.

As shown in FIG. 10(*a*), when the heat sink 200 is an air-cooled heat sink, the heat source 30 is of a square structure. In this implementation, a fastening screw 50 cooperates with a fastening hole (not shown in the figure) on the support 300 and a connection hole (not shown in the figure) on the circuit board 20, so as to mount the support 300 on the circuit board 20, and an air duct 222 of the heat sink 200 extends in the direction of $d_c$. The following describes a relative position of a support 300 and a heat source 30 in detail by using a lower heat source 30 in FIG. 10(*a*) and a part of the support 300 corresponding to the heat source 30 as an example. The support 300 is disposed around the heat source 30. A first mounting end 400*a* and a second mounting end 400*b* configured to mount an elastic compo-nent 100 are disposed on the support 300. A third mounting end 400*c* and a fourth mounting end 400*d* configured to mount another elastic component 100 are disposed on the support 300. The first mounting end 400*a* and the second mounting end 400*b* are respectively disposed on two sides of the heat source 30. The third mounting end 400*c* and the fourth mounting end 400*d* are respectively disposed on two sides of the heat source 30.

The first mounting end 400*a*, the heat source 30, the heat sink 200, and the second mounting end 400*b* form a three-point bending support model for the elastic component 100. The heat source 30 and the heat sink 200 limit the elastic component 100 from moving downward at an intermediate position, and the first mounting end 400*a* and the second mounting end 400*b* are configured to limit two ends of the elastic component 100 from moving upward. In a process of mounting the support 300 on the circuit board 20, the support 300 drives two ends of the elastic component 100 to move downward, so that the wave 130 of the elastic com-ponent 100 deforms, and downward elastic force is gener-ated by deformation of the wave 130. In this way, the elastic component 100 elastically binds the heat sink 200 to the circuit board 20 by using the elastic force, so that the first heat conducting surface 201 of the heat sink 200 elastically abuts against the second heat conducting surface 31 of the heat source 30.

In this implementation, the mounting portion 400 config-ured to mount the end of the elastic component 100 may be adaptively adjusted based on the air duct 222 in the heat sink 200. For example, in FIG. 10(*a*), a mounting end 400*a* and a mounting end 400*b* configured to mount an elastic com-ponent 100 are distributed on an extension line of an air duct 222 (222 in the figure indicates a distribution position of the air duct 222 configured to be penetrated by the elastic component 100 in the heat sink 200).

In another alternative implementation, a size of the mounting hole 410 in the mounting end 400 may alternatively be increased to adapt to the air duct 222 in the heat sink 200.

As shown in FIG. 10(b), in this embodiment, the support 300 is disposed between the heat sink 200 and the circuit board 20, and is detachably mounted to the circuit board 20 through a fastening screw 50. In addition, to avoid deformation of the circuit board 20, a reinforced plate 40 is further disposed below the circuit board 20. After the fastening screw 50 passes through a through hole on the circuit board 20, a lower end of the fastening screw 50 is fastened to a fastening component 41 on the reinforced plate 40. The circuit board 20 is clamped by the reinforced plate 40 and the support 300 to avoid deformation of the circuit board 20 due to high heat consumption of the heat source 30.

Figure 11A:
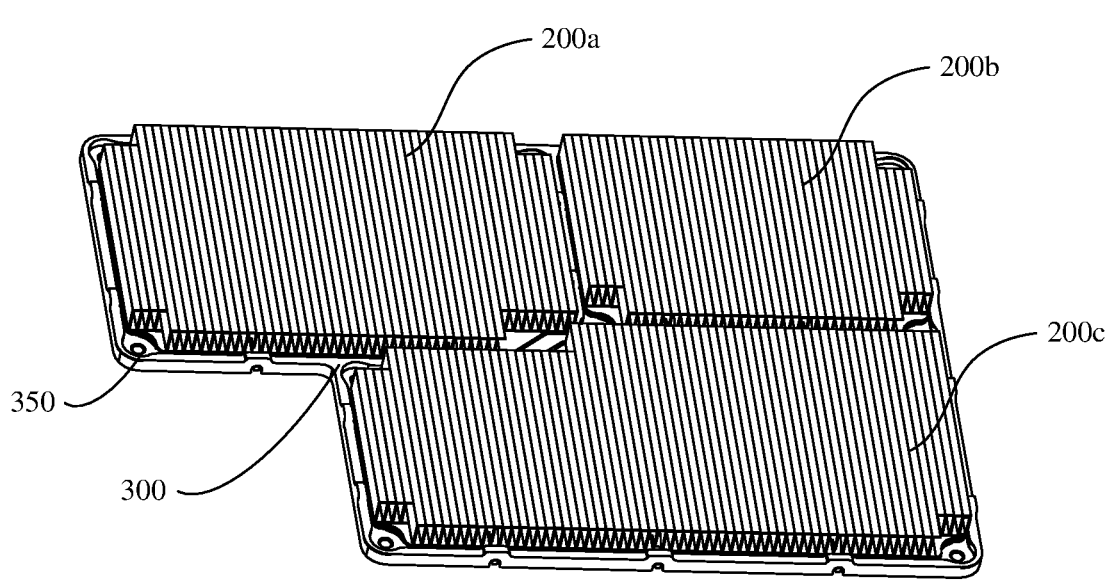
FIG. 11(a) is a schematic diagram of a first angle of view in which one support 300 corresponds to a plurality of heat sinks 200 according to this disclosure.
Figure 11B:
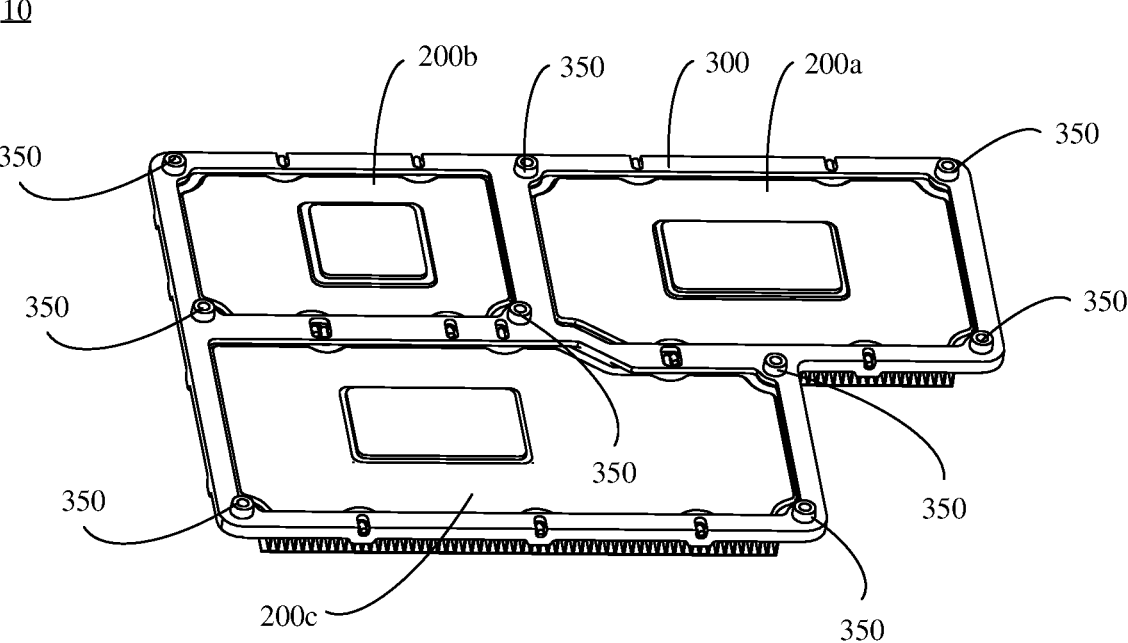
FIG. 11(b) is a schematic diagram of a second angle of view in which one support 300 corresponds to a plurality of heat sinks 200 according to this disclosure.

In this implementation, in a case in which two or more heat sources 30 are disposed on the same circuit board 20, the support 300 has a plurality of groups of mounting ends 400 configured to mount two or more heat sinks 200. Therefore, compared with a scenario in which a heat sink 200 is directly mounted to a circuit board 20 in another technical solution, each group of heat dissipation apparatuses 10 needs four fastening screws 50, which occupy a large area of the circuit board 20, and increases difficulty of arranging the heat dissipation apparatuses 10 on the circuit board 20. As shown in FIG. 11(a) and FIG. 11(b), in this disclosure, a heat dissipation apparatus 10 including a heat sink 200a, a heat sink 200b, and a heat sink 200c corresponds to nine fastening holes 350. To be specific, the heat dissipation apparatus 10 including the three heat sinks (for example, 200a, 200b, and 200c shown in FIG. 11(a)) can be stably fastened to the circuit board 20 by using the nine fastening screws 50. The heat sink 200 and the fastening screw 50 do not need to be configured in a ratio of 4:1. Therefore, an occupied mounting area of the circuit board 20 can be reduced, and a layout of functional components on the circuit board 20 can be optimized.

Figure 12:
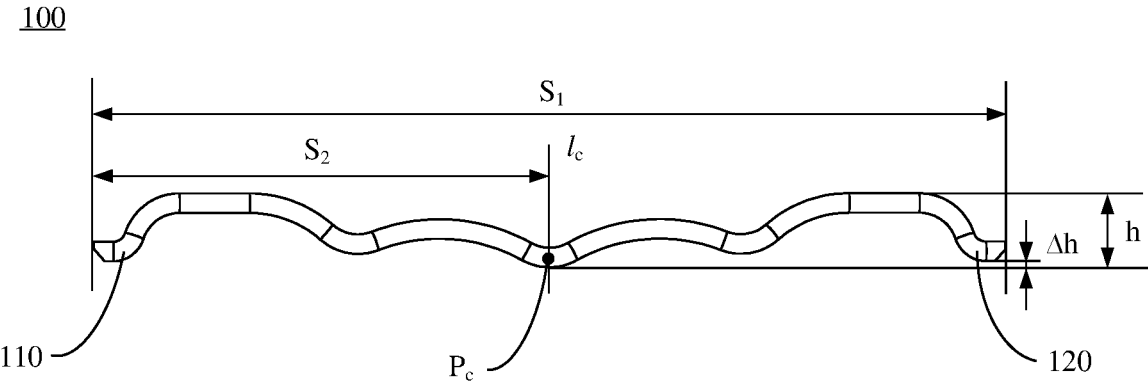
FIG. 12 is a schematic diagram of sizes of an elastic component 100 according to this disclosure.

FIG. 12 is a schematic diagram of sizes of an elastic component 100 according to this disclosure. FIG. 13(a) to FIG. 13(d) are three-dimensional diagrams of several elastic components 100 according to this disclosure. The following describes a specific feature of an elastic component 100 in a heat dissipation apparatus 10 in detail with reference to FIG. 12 to FIG. 13(d).

For different types of heat sinks 200, due to a structure difference, for example, a difference between heat conducting layers on first heat conducting surfaces 201 and a difference between forming precision of the first heat conducting surfaces 201, different types of heat sinks 200 require different press-fitting force to bind heat sinks 200 to heat sources 30 in a float and secure manner. When structures and relative positions of a support 300, a circuit board 20, and a heat source 30 are determined, a material and a size of a strip elastic material and a wave form of an elastic component 100 are adjusted, to obtain press-fitting force adapted to elastic components 100 of different types of heat sinks 200.

Specifically, the wave form includes a quantity of wave units in a wave 130, a bending degree of the wave units, a position and a shape of a press-fitting portion on the wave 130, a height (for example, a value of h in FIG. 12) of the elastic component 100, and a height difference (for example, a value of Δh in FIG. 12) between two ends of the elastic component 100 and the press-fitting portion. The quantity of wave units is positively correlated with a length of the strip elastic material. It is easy to understand that the length of the strip elastic material is positively correlated with a size of the second heat conducting surface 31 of the heat source 30. Therefore, a larger size of the second heat conducting surface 31 indicates a longer length of the strip elastic material and a larger quantity of wave units. On the contrary, a smaller size of the second heat conducting surface 31 indicates a shorter length of the strip elastic material and a smaller quantity of wave units. The height difference Δh of the elastic component 100 and a height size of the elastic component 100 are appropriately arranged based on a relative position between a mounting surface 202 of the heat sink 200 and the first heat conducting surface 201, a position of the second heat conducting surface 31 of the heat source 30, and a position of an arc groove on the support 300, so that the elastic component 100 in the heat dissipation apparatus 10 provides pretightening force for the heat sink 200 to pre-press the support 300, and the elastic component 100 in the heat dissipation apparatus 10 provides pressure for the heat sink 200 to press the heat source 30.

For strip elastic materials of a same length size, the quantity of wave units is positively correlated with force uniformity of the heat sink 200, that is, a larger quantity of wave units indicates more uniform press-fitting force applied by the elastic component 100 to the heat sink 200.

In this implementation, to improve uniformity of press-fitting force of the elastic component 100, as shown in FIG. 12, waves are symmetrically distributed relative to a center line of the elastic component 100. In other words, in FIG. 12, a difference value between a length $S_1$ of the elastic component and a two-fold distance $S_2$ between one end of the elastic component and a midpoint $P_C$ in a length direction of the elastic component is less than a preset value. The preset value may be 2 mm.

Figure 13A:
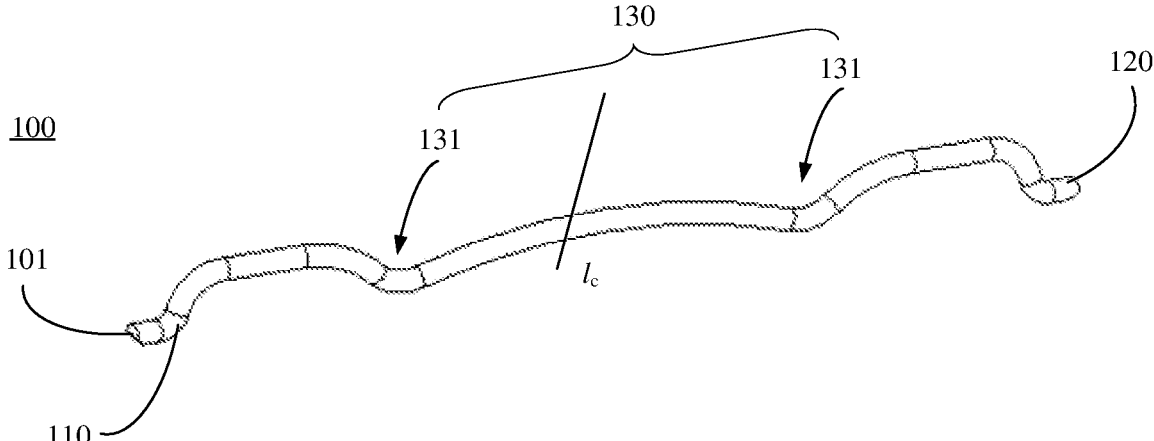
FIG. 13(a) to FIG. 13(d) are three-dimensional diagrams of several elastic components 100 according to this disclosure.
Figure 13B:
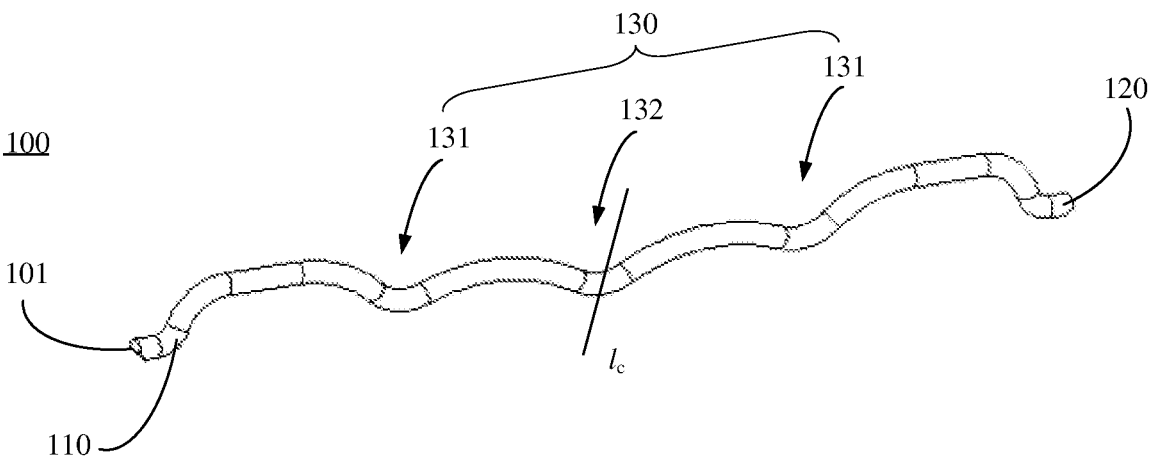
Figure 13C:
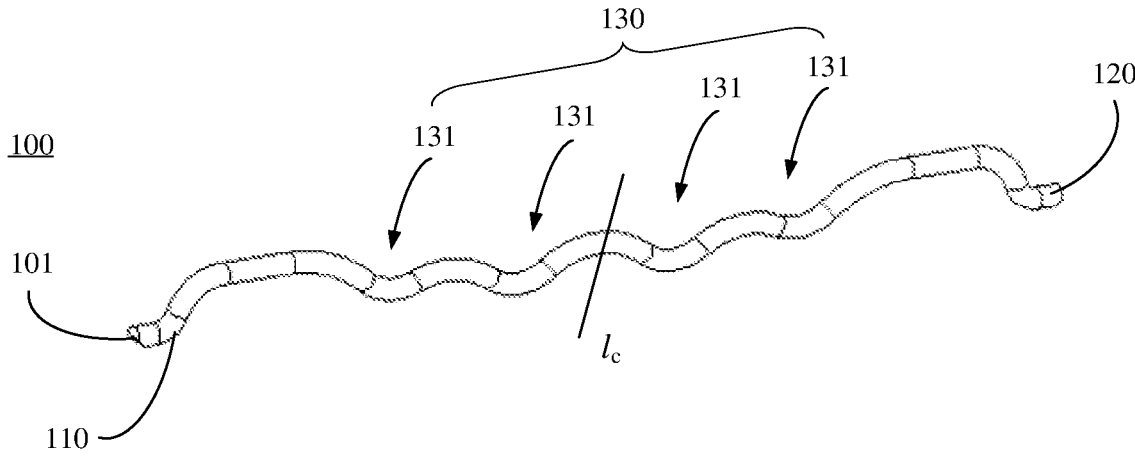

As shown in FIG. 13(a) to FIG. 13(c), in this implementation, the wave 130 in the elastic component 100 is several wave units. A shape of the wave unit is a sine wave or a quasi-sine wave. The elastic component 100 elastically binds the heat sink 200 to the circuit board 20 by using a wave trough or a wave peak of the wave 130. In other words, the elastic component 100 uses the wave trough or the wave peak in the wave 130 as a force-applying portion, so that the heat sink 200 is elastically bound to the circuit board 20 by using elastic force at the wave trough or the wave peak when the wave 130 is deformed. It may be understood that, in another implementation, a shape of the wave unit may alternatively be a cosine wave or a quasi-cosine wave.

As shown in FIG. 13(a) to FIG. 13(c), when the elastic component 100 elastically abuts against the heat sink 200 by using the wave peak or the wave trough, a wave peak point or a wave trough point of the elastic component 100 presses against the heat sink 200, that is, the press-fitting portion of the elastic component 100 is dot-shaped. When the quantity of wave units in the wave 130 is an even number, for example, the wave 130 in FIG. 13(a) includes two side waves 131. For another example, the wave 130 in FIG. 13(c) includes four side waves 131, and the even number of side waves 131 are symmetrically distributed on two sides of a center line $l_c$ of the elastic component 100. When the quantity of wave units in the wave 130 is an odd number, for example, the wave 130 in FIG. 13(b) includes two side waves 131 and one middle wave 132. The middle wave 132 is distributed in a middle position of the elastic component 100 in the length direction, and the side waves 131 are symmetrically distributed on two sides of a center line $l_c$ of the elastic component 100.

Figure 13D:
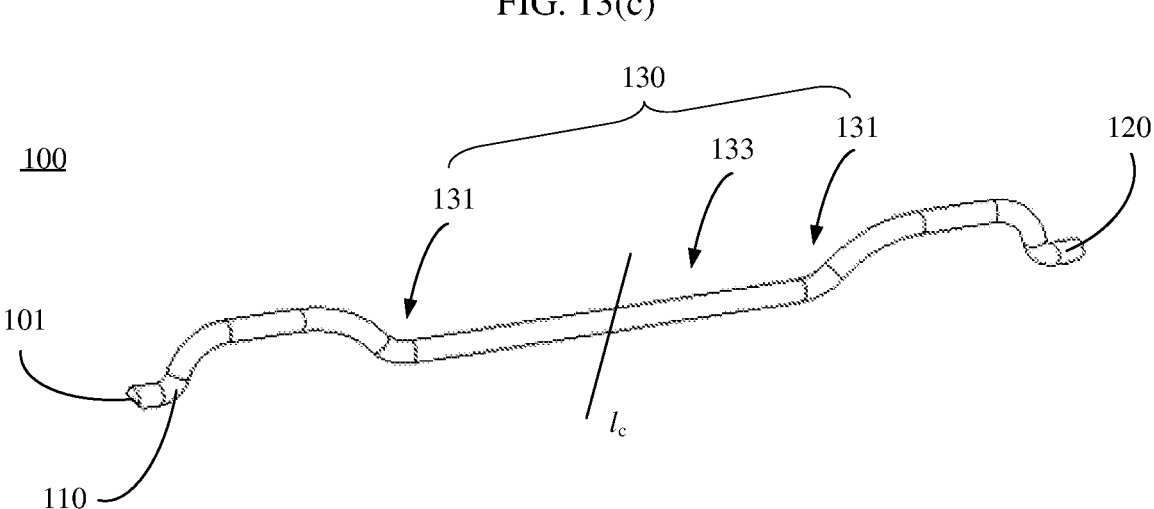
Figure 14:
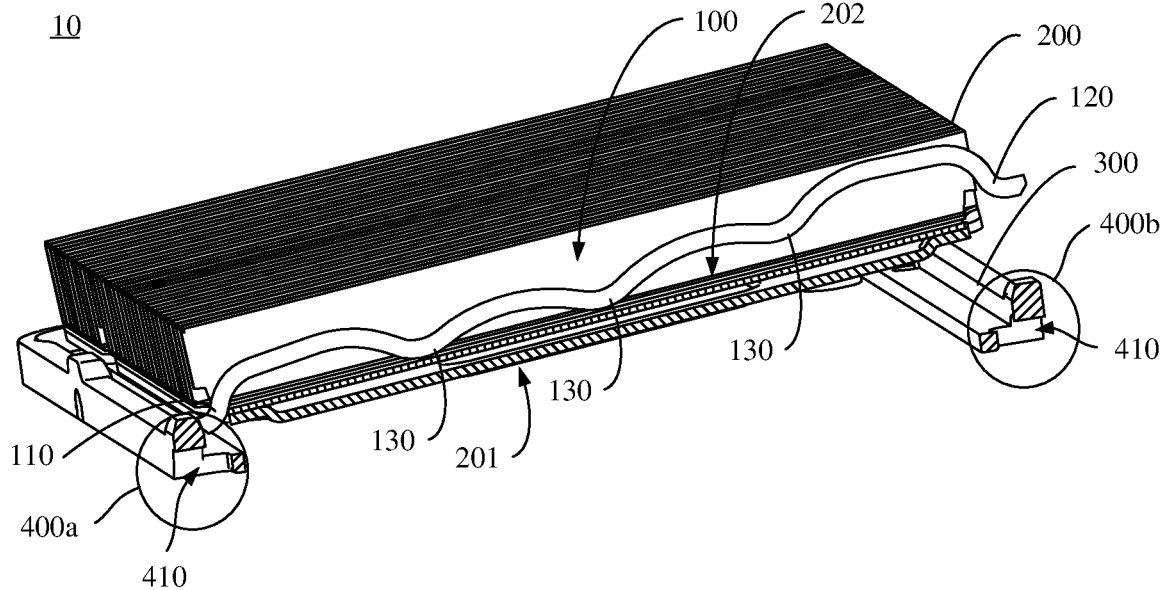
FIG. 14 is a schematic assembly diagram of a heat dissipation apparatus 10 according to this disclosure.
Figure 16:
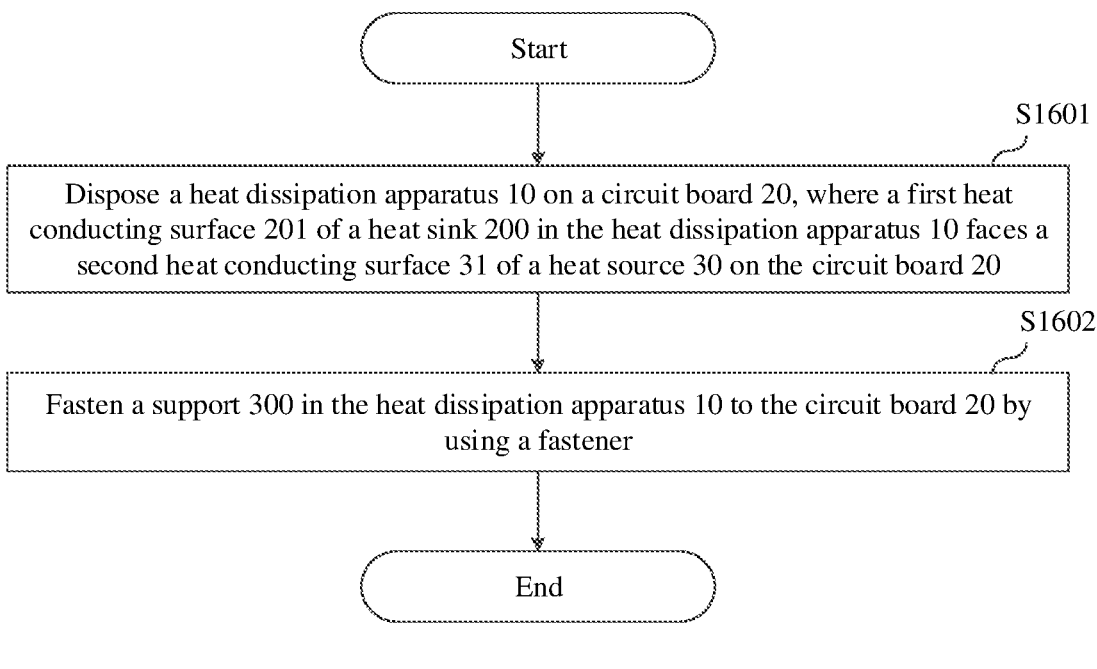
FIG. 16 is an assembly flowchart of a circuit module 1 according to this disclosure.

As shown in FIG. 13(d), in another alternative implementation, the wave 130 in the elastic component 100 includes at least two wave units and a pressing portion 133 between two wave troughs. The wave unit is a sine wave or a quasi-sine wave, and the pressing portion 133 is of a linear structure. The elastic component 100 uses the pressing portion 133 as a force-applying portion. When wave units on two sides of the pressing portion 133 are deformed, elastic force at a wave trough or a wave peak drives the pressing portion 133 to elastically bind the heat sink 200 to the circuit board 20. It may be understood that, in another implementation, the wave unit may alternatively be a cosine wave or a quasi-cosine wave. When the elastic component 100 is a structure that elastically abuts against the heat sink 200 by using the pressing portion 133, the press-fitting portion of the elastic component 100 is linear.

In this implementation, when the elastic component 100 is in a natural state, a deflection of the wave 130 close to the midpoint is greater than a deflection of the wave 130 close to two ends of the elastic component 100.

This disclosure further provides an elastic component 100, which is any one of the foregoing elastic components 100. The elastic component 100 is formed by bending a strip elastic material into a wave, and two ends of the elastic component 100 are respectively mounted to two corresponding mounting ends 400 on a component. The elastic component 100 uses the elastic force generated by deformation of the wave 130 to flexibly bind and mount another component to one component. The elastic component 100 has a form similar to a form presented in a snake movement process, has large design tolerance, is easy to mount, and has stable mechanical properties.

This disclosure further provides a heat dissipation apparatus 10 assembly method, which is applicable to assembly of any one of the foregoing heat dissipation apparatuses 10. It can be learned from FIG. 4 to FIG. 15 that the heat dissipation apparatus 10 assembly method in this disclosure specifically includes the following steps.

Step S1501: Dispose a heat sink 200 on a support 300, where a first heat conducting surface 201 of the heat sink 200 faces the support 300.

Step S1502: Dispose an elastic component 100 on a side of the heat sink 200 having a mounting surface 202.

Specifically, when the heat sink 200 is an air-cooled heat sink, the mounting surface 202 is a bottom surface of an air duct 222, and the elastic component 100 penetrates one of the air ducts 222 in the heat sink 200, that is, the elastic component 100 is located above the substrate 210 in the heat sink 200. When the heat sink is a liquid-cooled heat sink, the mounting surface 202 is an upper surface of the heat sink 200, and the elastic component 100 is disposed above the heat sink 200.

Step S1503: Mount a first end 110 of the elastic component 100 to a first mounting end 400a of the support 300.

Specifically, a second guiding surface 101 of the first end 110 first abuts against a first guiding surface 340 of the support 300, to drive the first end 110, so that the second guiding surface 101 slides along the first guiding surface 340, until the first end 110 slides into a mounting hole 410 and abuts against the first mounting end 400a, to complete mounting of the first end 110 and the first mounting end 400a.

Step S1504: Apply external force to the elastic component 100 to change a shape of a peak-valley structure (that is, a wave 130) of the elastic component 100, and mount a second end 120 of the elastic component 100 to a second mounting end 400b of the support 300.

Specifically, when the external force is applied to the elastic component 100 to change the shape of the wave 130 of the elastic component 100, deformation of the wave 130 may be reduction of a size of the wave 130 in a length direction. In addition, a mounting method for mounting the other mounting end 400 at the second end 120 is the same as a step for mounting a mounting end 400 at the first end 110. Details are not described herein again.

In this implementation, for ease of mounting, when the first end 110 of the elastic component 100 is mounted to the first mounting end 400a of the support 300, the heat sink 200 tilts relative to the support 300. Before the second end 120 of the elastic component 100 is mounted to the second mounting end 400b of the support 300, the elastic component 100 and the heat sink 200 are rotated by using the first end 110 of the elastic component 100 as a supporting point, to adjust an arrangement direction of the heat sink 200 to be the same as a disposing direction of the support 300. When the disposing direction of the heat sink 200 is the same as the disposing direction of the support 300, the second end 120 of the elastic component 100 starts to enter the mounting hole 410 of the second mounting end 400b.

This disclosure further provides a circuit module 1, including a circuit board 20, an electronic component, and any one of the foregoing heat dissipation apparatuses 10. The circuit board 20 is used as a circuit board. The electronic component is used as a heat source 30. The electronic component is provided with a second heat conducting surface 31. The heat sink 200 is provided with a first heat conducting surface 201 adapted to the second heat conducting surface 31. A position of the second heat conducting surface 31 of the electronic component is opposite to a position of the first heat conducting surface 201 of the heat sink 200. The two ends of the elastic component 100 are mounted to the two mounting ends 400 of the support 300, and the support 300 is mounted to the circuit board 20. The heat sink 200 is elastically bound and mounted to the circuit board 20 by using the elastic component 100, so that the first heat conducting surface 201 of the heat sink 200 elastically abuts against the second heat conducting surface 31 of the electronic component.

In the circuit module 1, the elastic component 100 is mounted to the support 300 by using two ends, and the heat sink 200 is elastically bound and mounted to the circuit board 20 by using elastic force generated by deformation of the wave 130, so that the first heat conducting surface 201 of the heat sink 200 is tightly attached to the second heat conducting surface 31 of the electronic component. The heat sink 200 in the circuit module 1 has good heat dissipation effect on the electronic component, and good force-bearing statuses of the heat sink 200, the electronic component, and the circuit board 20, and is especially applicable to an electronic device with a compact structure.

In this implementation, the electronic component is a chip with high heat production and slow heat dissipation.

In this implementation, to avoid deformation of the circuit board 20, a reinforced plate 40 is further disposed below the circuit board 20. After the fastening screw 50 passes through a through hole on the circuit board 20, a lower end of the fastening screw 50 is fastened to the reinforced plate 40. The circuit board 20 is clamped by the reinforced plate 40 and the support 300 on both sides, to avoid deformation of the circuit board 20 due to high heat consumption of the heat source 30. On the one hand, connection reliability of functional components of the circuit board 20 is ensured, and on the other hand, the second heat conducting surface 31 of the heat source 30 is tightly attached to the first heat conducting surface 201 of the heat sink 200.

This disclosure further provides an electronic device, including any one of the foregoing circuit modules 1. Details are not described herein again. For the electronic device including the circuit module 1, a circuit board 20, an electronic component, and a heat sink 200 in the electronic device have good force-bearing statuses, stable overall structures, and good heat dissipation effect.

This disclosure further provides a circuit module 1 assembly method, which is applicable to assembly of any one of the foregoing circuit modules 1. It can be learned from FIG. 4 to FIG. 14 and FIG. 16 that the circuit module 1 assembly method in this disclosure specifically includes the following steps.

Step S1601: Dispose a heat dissipation apparatus 10 on a circuit board 20, where a first heat conducting surface 201 of a heat sink 200 in the heat dissipation apparatus 10 faces a second heat conducting surface 31 of a heat source 30 on the circuit board 20.

Step S1602: Fasten a support 300 in the heat dissipation apparatus 10 to the circuit board 20 by using a fastener. The fastener may be a fastening screw.

The heat dissipation apparatus 10 may be an assembled heat dissipation apparatus, and an assembly method thereof may be mounted according to the foregoing step S1501 to step S1503.

In another alternative implementation, the heat dissipation apparatus 10 may be an unassembled elastic component 100, a heat sink 200, or a support 300, and before step S1601, a step of mounting the heat dissipation apparatus 10 is further included. The step of mounting the heat dissipation apparatus 10 may be the same as step S1501 to step S1503 of mounting the heat dissipation apparatus 10 in FIG. 15. Details are not described herein again.

In the circuit module 1 assembly method, a first end 110 of the elastic component 100 is first mounted at a first mounting end 400*a* in the support 300, and a wave 130 is deformed by applying external force, to adjust a distance between two ends (110 and 120) of the elastic component 100, so that a second end 120 of the elastic component 100 is mounted at a second mounting end 400*b* in the support 300. Mounting steps are simple and the operation method is simple. In addition, the elastic component 100 and the heat sink 200 are mounted to the support 300. Then, the support 300 is mounted to the circuit board 20. This can effectively avoid scratching an electronic component on the circuit board 20 during mounting of the elastic component 100 and the heat sink 200, thereby improving a yield rate of the circuit module 1.

In another alternative implementation, the heat dissipation apparatus 10 may be an elastic component 100, a heat sink 200, or a support 300 that are not assembled. This disclosure further provides another circuit module 1 assembly method, which is applicable to assembly of any one of the circuit modules 1. It can be learned from FIG. 4 to FIG. 14 and FIG. 17 that the circuit module 1 assembly method in this disclosure specifically includes the following steps.

Step S1701: Mount a support 300 to a circuit board 20 by using a fastener. The fastener may be a fastening screw.

Step S1702: Dispose a heat sink 200 on the support 300, where a first heat conducting surface 201 of the heat sink 200 faces the support 300.

Step S1703: Dispose an elastic component 100 on a side of the heat sink 200 having a mounting surface 202.

Step S1704: Mount a first end 110 of the elastic component 100 to a first mounting end 400*a* of the support 300.

Step S1705: Apply external force to the elastic component 100 to change a shape of a peak-valley structure (that is, a wave 130) of the elastic component 100, and mount a second end 120 of the elastic component 100 to a second mounting end 400*b* of the support 300.

Figure 18:
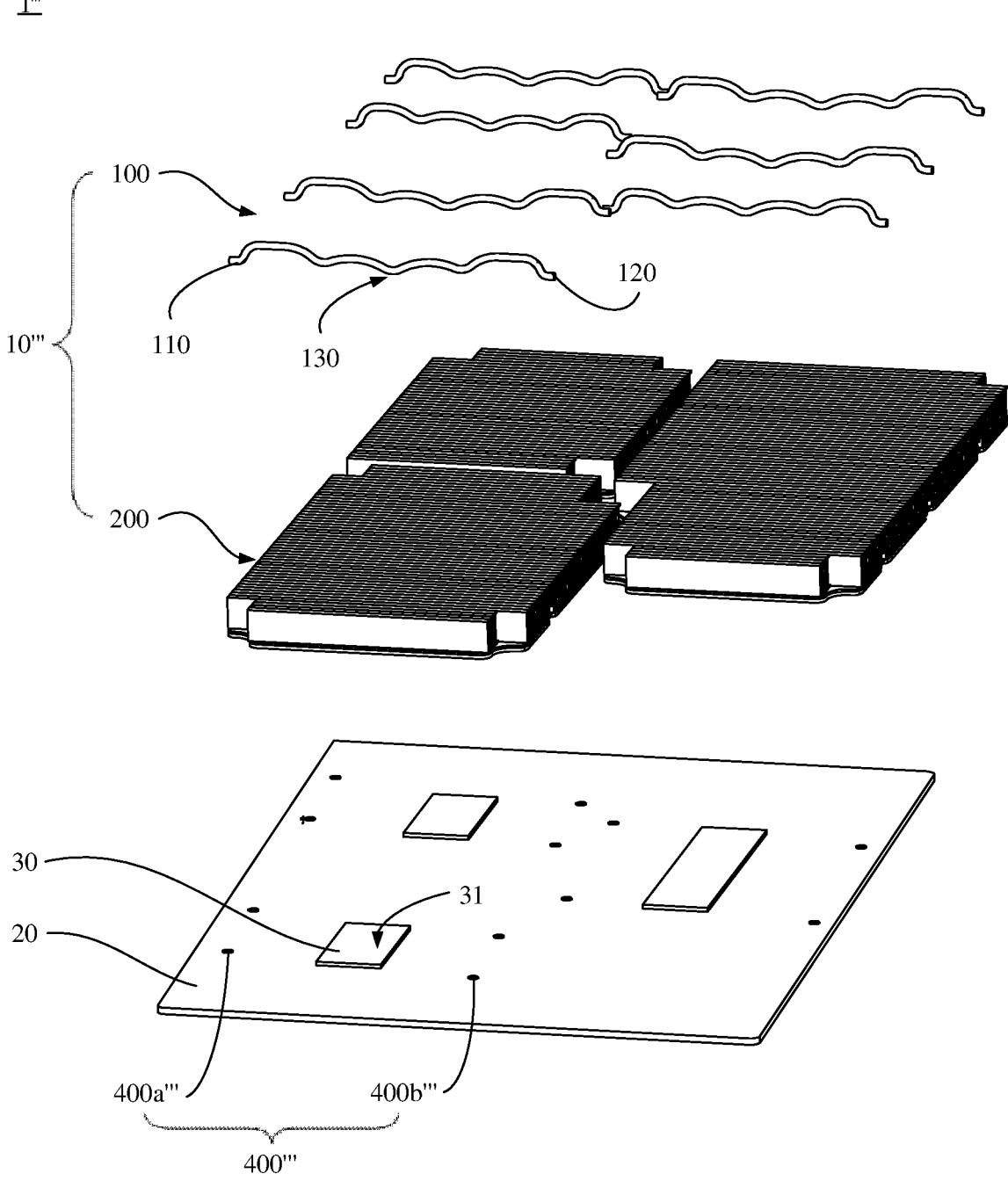
FIG. 18 is an exploded view of a circuit module 1''' according to this disclosure.

As shown in FIG. 18, in another possible embodiment of this disclosure, when there is a single electronic component on a circuit board 20, or a spacing between electronic components on the circuit board 20 is large, or power consumption of the electronic components on the circuit board 20 is low, different from the embodiment shown in FIG. 2, this embodiment of this disclosure may be applicable to a scenario without a support, a heat sink 200 is mounted to the circuit board 20 by using the elastic components 100 and the mounting ends 400''' on the circuit board 20, which is described in detail below.

As shown in FIG. 2, the heat dissipation apparatus 10 in this disclosure includes an elastic component 100, a heat sink 200, and a support 300, and mounting ends 400 configured to mount a first end 110 and a second end 120 of the elastic component 100 are located on the support 300. An assembly method of a circuit module 1 of the heat dissipation apparatus 10 includes: first mounting the heat sink 200 to the support 300 by using the elastic component 100, and then mounting the support 300 to the circuit board 20.

It can be learned from FIG. 2 and FIG. 18 that, in this disclosure, a difference between the heat dissipation apparatus 10''' and the heat dissipation apparatus 10 lies in that, the heat dissipation apparatus 10''' includes the elastic component 100 and the heat sink 200, and the mounting ends 400''' configured to mount the first end 110 and the second end 120 of the elastic component 100 are directly disposed on the circuit board 20, for example, mounting ends 400''' are mounting holes (not marked) in a surface of the circuit board 20. The assembly method of the circuit module 1''' including the heat dissipation apparatus 10''' includes directly mounting a heat sink 200 to the circuit board 20 by using the elastic component 100.

Specifically, this disclosure provides a heat dissipation apparatus 10''', including a heat sink 200 and an elastic component 100. The heat sink 200 is configured to dissipate heat for a heat source 30 on a circuit board 20. The heat source 30 is provided with a second heat conducting surface 31, and the heat sink 200 is provided with a first heat conducting surface (not shown in the figure) adapted to the second heat conducting surface 31. When two ends of the elastic component 100 are respectively mounted to two corresponding mounting ends 400''' on the circuit board 20, the elastic component 100 is used to elastically bind the heat sink 200 to the heat source 30 mounted on the circuit board 20, so that the first heat conducting surface of the heat sink 200 elastically abuts against the second heat conducting surface 31 of the heat source 30.

For the heat dissipation apparatus 10''', because a mounting portion (a first end 110 and a second end 120) of the elastic component 100 is different from the force-applying portion (a wave 130), the force-applying portion can be directly disposed right above the heat source 30, so that the elastic component 100 presses against the heat sink 200 at a position right above the heat source 30. Therefore, the heat dissipation apparatus 10''' can improve attachment stability between the first heat conducting surface of the heat sink 200 and heat conducting 31 of the heat source 30, improve uniformity of stress distribution at an attachment position, improve a force-bearing status of the heat sink 200, and extends service life of the heat sink 200. In addition, there is no need to dispose a mounting hole on the heat dissipation apparatus 10''', thereby increasing an effective heat dissipation area of the heat sink 200 and improving heat dissipation effect of the heat sink 200 on the heat source 30. In addition, the heat dissipation apparatus 10''' has a small quantity of components, which facilitates control of a dimension error.

In this implementation, the two corresponding mounting end 400''' of the circuit board 20 specifically include a first mounting end 400a''' and a second mounting end 400b''' that are provided with mounting holes on the circuit board 20. The heat source 30 is an electronic component mounted to the circuit board 20.

This disclosure further provides an elastic component 100. A structure of the elastic component 100 is the same as a structure of the elastic component 100 in the heat dissipation apparatus 10, but an disclosure scenario difference lies in that a first end 110 and a second end 120 of the elastic component 100 in the heat dissipation apparatus 10''' are configured to be mounted to mounting ends 400''' of the circuit board 20. Details are not described herein again.

This disclosure further provides a circuit module 1'''. A structure of the circuit module 1''' is basically the same as a structure of the circuit module 1, and a difference lies in that a heat dissipation apparatus 10''' used in the circuit module 1''' is any one of the heat dissipation apparatuses provided in this disclosure, and mounting ends 400''' are disposed on the circuit board 20. Two ends of the elastic component 100 are respectively mounted to two corresponding mounting ends 400''' of the circuit board 20, that is, the heat dissipation apparatus 10''' and the circuit board 20 are connected in different manners.

This disclosure further provides an electronic device. The electronic device includes at least one group of circuit modules 1'''. A structure of the electronic device is basically the same as a structure of the electronic device including the at least one group of circuit modules 1. A difference lies in that circuit modules used by the electronic devices are different. Details are not described herein.

Figure 19:
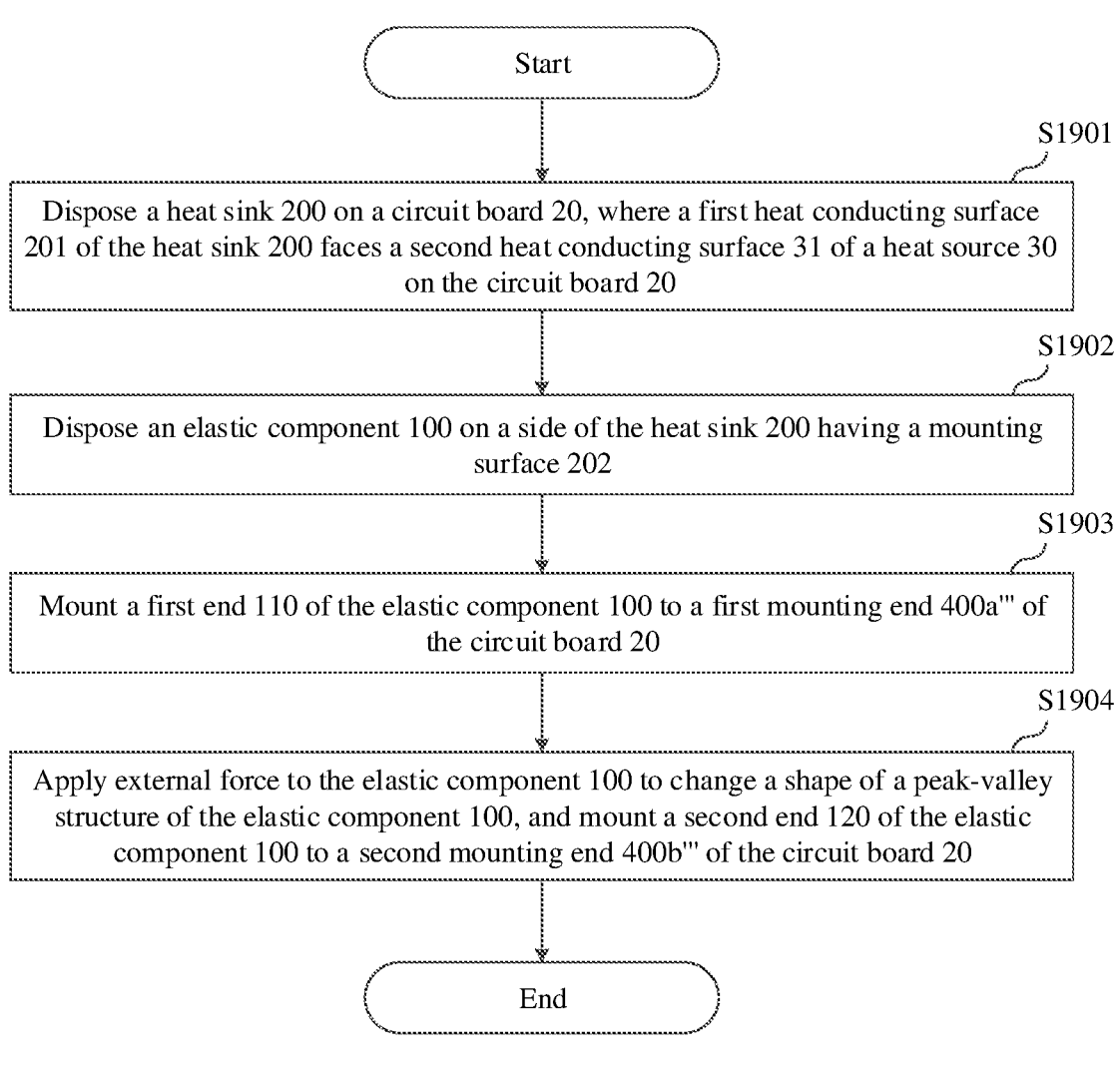
FIG. 19 is an assembly flowchart of a circuit module 1''' according to this disclosure.

This disclosure further provides a circuit module 1''' assembly method, which is applicable to assembly of any one of the foregoing circuit modules 1'''. It can be learned from FIG. 19 that the circuit module 1''' assembly method in this disclosure specifically includes the following steps.

Step S1901: Dispose a heat sink 200 on a circuit board 20, where a first heat conducting surface 201 of the heat sink 200 faces a second heat conducting surface 31 of a heat source 30 on the circuit board 20.

Step S1902: Dispose an elastic component 100 on a side of the heat sink 200 having a mounting surface 202.

Step S1903: Mount a first end 110 of the elastic component 100 to a first mounting end 400a''' of the circuit board 20.

Step S1904: Apply external force to the elastic component 100 to change a shape of a peak-valley structure (that is, a wave 130) of the elastic component 100, and mount a second end 120 of the elastic component 100 to a second mounting end 400b''' of the circuit board 20.

In this way, the heat sink 200 is elastically bound and mounted to the circuit board 20 under an action of elastic force generated by wave deformation, so as to implement elastic abutting between the first heat conducting surface 201 of the heat sink 200 and the second heat conducting surface 31 of the heat source 30 on the circuit board 20.

The foregoing describes implementations of this disclosure by using specific embodiments. A person skilled in the art may easily understand other advantages and effects of this disclosure based on content disclosed in this specification. Although this disclosure is described with reference to some embodiments, it does not mean that a characteristic of this disclosure is limited only to this implementation. On the contrary, a purpose of describing this disclosure with reference to an implementation is to cover another option or modification that may be derived based on claims of this disclosure. To provide an in-depth understanding of this disclosure, the foregoing descriptions include a plurality of specific details. This disclosure may be alternatively implemented without using these details. In addition, to avoid confusion or blurring a focus of this disclosure, some specific details are omitted from the description. It should be noted that embodiments in this disclosure and the features in embodiments may be mutually combined in the case of no conflict.

It should be noted that, in this specification, reference numerals and letters in the foregoing accompanying drawings represent similar items. Therefore, once an item is defined in an accompanying drawing, the item does not need to be further defined or interpreted in the following accompanying drawings. In descriptions of this disclosure, it should be noted that orientation or location relationships indicated by terms "center", "above", "below", "left", "right", "vertical", "horizontal", "inner", "outer", and the like are orientation or location relationships based on the accompanying drawings, and are merely intended for conveniently describing this disclosure and simplifying descriptions, rather than indicating or implying that an apparatus or an element in question needs to have a specific orientation or needs to be constructed and operated in a specific orientation, and therefore cannot be construed as a limitation on this disclosure. In addition, terms "first" and "second" are merely used for a purpose of description, and shall not be understood as an indication or implication of relative importance. In descriptions of this disclosure, it should be noted that unless otherwise expressly specified and limited, terms "mount", "interconnect", and "connect" should be understood in a broad sense. For example, the terms may indicate a fixed connection, a detachable connection, or an integral connection: may be a mechanical connection or an electrical connection; or may be direct interconnection, indirect interconnection through an intermediate medium, or communication between the interior of two elements. An ordinary technician in the art may understand specific meanings of the foregoing terms in this disclosure based on a specific situation.

It is clearly that a person skilled in the art can make various modifications and variations to this disclosure without departing from the spirit and scope of this disclosure. This disclosure is intended to cover these modifications and variations of this disclosure provided that they fall within the scope of protection defined by the following claims and their equivalent technologies.

What is claimed is:

1. A heat dissipation apparatus configured to be used for a circuit board having a heat source, to dissipate heat from the heat source, wherein the heat dissipation apparatus comprises:

a support, wherein the support comprises a bearing portion provided with an assembly opening, and the bearing portion is configured to be fastened to the circuit board;

a heat sink, wherein the heat sink comprises a first heat conducting surface and a mounting surface that are opposite to each other, the heat sink is disposed on the bearing portion, and the first heat conducting surface faces the bearing portion and is configured to penetrate the assembly opening to be attached to a second heat conducting surface of the heat source; and at least one elastic component, wherein the at least one elastic component is strip-shaped and has a peak-valley structure, the peak-valley structure of the at least one elastic component is disposed on the mounting surface of the heat sink, and two ends of the at least one elastic component are separately fastened to the support;

the at least one elastic component is configured to provide, to the heat sink, pressure to attach the heat sink to the heat source; and wherein contact regions between the at least one elastic component and the mounting surface of the heat sink are located at edge positions in an orthographic projection region of the second beat conducting surface of the beat source on the mounting surface of the beat sink.

2. The heat dissipation apparatus according to claim 1, wherein the peak-valley structure of the at least one elastic component elastically abuts against the mounting surface of the heat sink, and the heat sink is elastically bound to the support.

3. The heat dissipation apparatus according to claim 1, wherein the two ends of the at least one elastic component are detachably connected to the support.

4. The heat dissipation apparatus according to claim 3, wherein the two ends of the at least one elastic component separately comprise a hooking portion extending toward the support;

two mounting ends located on two sides of the heat sink are disposed on the support, and mounting holes adapted to the hooking portions are respectively disposed at the two mounting ends; and the hooking portions at the two ends of the at least one elastic component are respectively clamped into the mounting holes at the two mounting ends.

5. The heat dissipation apparatus according to claim 4, wherein the heat sink further comprises a heat dissipation structure, and the heat dissipation structure is disposed on a side away from the first heat conducting surface; and the heat dissipation structure comprises a plurality of fins arranged in parallel, a plurality of air ducts are formed between the plurality of fins, and the at least one elastic component correspondingly penetrates an air duct of the plurality of air ducts.

6. The heat dissipation apparatus according to claim 5, wherein a length direction of the at least one elastic component is parallel to an extension direction of the air duct that the at least one elastic component penetrates.

7. The heat dissipation apparatus according to claim 5, wherein a fluctuation shape of the peak-valley structure of the at least one elastic component is on a same plane.

8. The heat dissipation apparatus according to claim 5, wherein a thickness range of the at least one elastic component ranges from 1.5 mm to 10 mm, and a thickness direction is a direction perpendicular to a fluctuation shape of the peak-valley structure.

9. The heat dissipation apparatus according to claim 1, wherein a portion that is of the at least one elastic component and that is configured to press against the heat sink is in a dot shape or a linear shape.

10. The heat dissipation apparatus according to claim 1, wherein the at least one elastic component comprises two elastic components, and when a es-fitting-portion that is of each of the two elastic components and that is configured to press against the heat sink is in a dot shape, the portions between the two elastic components are not on a straight line.

11. The heat dissipation apparatus according to claim 1, wherein the at least one elastic component is symmetrically distributed relative to a center line of the at least one elastic component, and the center line is a straight line that passes through a midpoint of the at least one elastic component and that is perpendicular to a length direction of the at least one elastic component.

12. A heat dissipation apparatus configured to be used for a circuit board having a heat source, to dissipate heat from the heat source, wherein the heat dissipation apparatus comprises:

a support, wherein the support comprises a bearing portion provided with an assembly opening, and the bearing portion is configured to be fastened to the circuit board;

a heat sink, wherein the heat sink comprises a first heat conducting surface and a mounting surface that are opposite to each other, the heat sink is disposed on the bearing portion, and the first beat conducting surface faces the bearing portion and is configured to penetrate the assembly opening to be attached to a second heat conducting surface of the heat source; and at least one elastic component, wherein the at least one elastic component is strip-shaped and bas a peak-valley structure, the peak-valley structure of the at least one elastic component is disposed on the mounting surface of the heat sink, and two ends of the at least one elastic component are separately fastened to the support;

the at least one elastic component is configured to provide, to the heat sink pressure to attach the heat sink to the heat source;

wherein the two ends of the at least one elastic component are detachably connected to the support;

wherein the two ends of the at least one elastic component separately comprise a hooking portion extending toward the support;

two mounting ends located on two sides of the heat sink are disposed on the support, and mounting holes adapted to the hooking portions are respectively disposed at the two mounting ends; and the hooking portions at the two ends of the at least one elastic component are respectively clamped into the mounting holes at the two mounting ends;

wherein the heat sink further comprises a heat dissipation structure, and the beat dissipation structure is disposed on a side away from the first heat conducting surface; and the heat dissipation structure comprises a plurality of fins arranged in parallel a plurality of air ducts are formed between the plurality of fins, and the at least one elastic component correspondingly penetrates an air duct of the plurality of air ducts;

wherein the support further comprises:

a position-limiting portion, wherein the position-limiting portion is disposed on the bearing portion, and forms, together with the bearing portion, accommodating space for accommodating the heat sink, and the position-limiting portion is disposed around an outer edge of the heat sink, a position-avoiding notch is disposed on the outer edge of the heat sink;

at least one of the two twee mounting ends is formed at a joint between the bearing portion and the position-limiting portion; and the two ends of the at least one elastic component penetrate the position-avoiding notch, and are clamped into the mounting holes.

13. The heat dissipation apparatus according to claim 12, wherein an avoidance notch is disposed on a fin located at the position-avoiding notch, and the avoidance notch and the position-avoiding notch together form mounting space for mounting the two ends of the at least one elastic component to the mounting holes.

14. The heat dissipation apparatus according to claim 12, wherein the support further comprises an elevating portion, the elevating portion protrudes from the position-limiting portion in a direction away from the bearing portion, and the elevating portion is configured to limit the heat sink from being detached from the support.

15. The heat dissipation apparatus according to claim 14, wherein the elevating portion protrudes from the position-limiting portion forming the at least one of the two mounting ends in a direction away from the at least one of the two mounting ends.

16. The heat dissipation apparatus according to claim 12, wherein a surface facing the accommodating space on the position-limiting portion is a first guiding surface, a second guiding surface adapted to the first guiding surface is disposed at the two ends of the at least one elastic component, and the first guiding surface cooperates with the second guiding surface, to guide the two ends of the at least one elastic component into directions of the mounting holes.

17. An electronic device comprising:
a circuit module comprising a heat dissipation apparatus, a circuit board, and an electronic component mounted to the circuit board, wherein:
the electronic component is a heat source;
the heat dissipation apparatus is configured to dissipate heat from the heat source, the heat dissipation apparatus comprises:
a support, wherein the support comprises a bearing portion provided with an assembly opening, and the bearing portion is configured to be fastened to the circuit board;
a heat sink, wherein the heat sink comprises a first heat conducting surface and a mounting surface that are opposite to each other, the heat sink is disposed on the bearing portion, and the first heat conducting surface faces the bearing portion and is configured to penetrate the assembly opening to be attached to a second heat conducting surface of the heat source; and
at least one elastic component, wherein the at least one elastic component is strip-shaped and has a peak-valley structure, the peak-valley structure of the at least one elastic component is disposed on the mounting surface of the heat sink, and two ends of the at least one elastic component are separately fastened to the support; and
the at least one elastic component is configured to provide, to the heat sink, pressure to attach the heat sink to the heat source; and wherein contact regions between the at least one elastic component and the mounting surface of the heat sink are located at edge positions in an orthographic projection region of the second heat conducting surface of the heat source on the mounting surface of the heat sink; and
the circuit board is located on a side of the support away from the heat sink, and is fastened to the support, and the second heat conducting surface of the heat source faces the assembly opening.

18. The electronic device according to claim 17, wherein the peak-valley structure of the at least one elastic component elastically abuts against the mounting surface of the heat sink, and the heat sink is elastically bound to the support.

19. The electronic device according to claim 17, wherein the two ends of the at least one elastic component are detachably connected to the support.

20. The electronic device according to claim 17, wherein the two ends of the at least one elastic component are detachably connected to the support; and
wherein the two ends of the at least one elastic component separately comprise a hooking portion extending toward the support;
two mounting ends located on two sides of the heat sink are disposed on the support, and mounting holes adapted to the hooking portions are respectively disposed at the two mounting ends; and
the hooking portions at the two ends of the at least one elastic component are respectively clamped into the mounting holes at the two mounting ends;
wherein the heat sink further comprises a heat dissipation structure, and the heat dissipation structure is disposed on a side away from the first heat conducting surface;
the heat dissipation structure comprises a plurality of fins arranged in parallel, a plurality of air ducts are formed between the plurality of fins, and the at least one elastic component correspondingly penetrates an air duct of the plurality of air ducts; and
wherein the support further comprises:
a position-limiting portion, wherein the position-limiting portion is disposed on the bearing portion, and forms, together with the bearing portion, accommodating space for accommodating the heat sink, and the position-limiting portion is disposed around an outer edge of the heat sink,
a position-avoiding notch is disposed on the outer edge of the heat sink;
at least one of the two mounting ends is formed at a joint between the bearing portion and the position-limiting portion; and
the two ends of the at least one elastic component penetrate the position-avoiding notch, and are clamped into the mounting holes.

* * * * *